US011552500B2

(12) United States Patent
Rao et al.

(10) Patent No.: US 11,552,500 B2
(45) Date of Patent: Jan. 10, 2023

(54) SYSTEMS AND METHODS FOR MANAGING ELECTRICAL LOADS

(71) Applicant: Span.IO, Inc., San Francisco, CA (US)

(72) Inventors: Archan Padmanabhan Rao, San Francisco, CA (US); Chadwick Conway, San Francisco, CA (US); Jack Jester Weinstein, San Francisco, CA (US); Ian Dimen, San Francisco, CA (US)

(73) Assignee: Span.IO, Inc., San Francisco, CA (US)

( * ) Notice: Subject to any disclaimer, the term of this patent is extended or adjusted under 35 U.S.C. 154(b) by 0 days.

(21) Appl. No.: 17/024,073

(22) Filed: Sep. 17, 2020

(65) Prior Publication Data

US 2021/0083506 A1 Mar. 18, 2021

Related U.S. Application Data

(60) Provisional application No. 62/901,746, filed on Sep. 17, 2019.

(51) Int. Cl.
*H02J 13/00* (2006.01)
*G05F 1/10* (2006.01)
*G01R 21/06* (2006.01)

(52) U.S. Cl.
CPC ........ *H02J 13/00002* (2020.01); *G01R 21/06* (2013.01); *G05F 1/10* (2013.01); *H02J 13/00001* (2020.01)

(58) Field of Classification Search
CPC ........... H02J 13/00002; H02J 13/00001; H02J 2300/24; H02J 2310/60; H02J 3/381;

(Continued)

(56) References Cited

U.S. PATENT DOCUMENTS 9,831,664 B1 11/2017 Sastry et al.
11,050,260 B2 6/2021 Narla et al.
(Continued)

FOREIGN PATENT DOCUMENTS

WO WO2011019509 2/2011

OTHER PUBLICATIONS

International Search Report and Written Opinion of PCT/US2020/051276 dated Nov. 5, 2020.
(Continued)

*Primary Examiner* — Toan T Vu
*Assistant Examiner* — Thai H Tran
(74) *Attorney, Agent, or Firm* — Haley Guiliano LLP; Alexander Shvarts; Andrew C. Lee

(57) ABSTRACT

A system for managing electrical loads includes a plurality of branch circuits, a sensor system, and control circuitry. The sensor system is configured to measure one or more electrical parameters corresponding to the plurality of branch circuits, and transmit one or more signals to the control circuitry. The control circuitry is configured to determine respective electrical load information in each branch circuit based on the sensor system, and control the electrical load in each branch circuit using controllable elements based on the respective electrical load information. The control circuitry transmits usage information, generates displays indicative of usage information, accesses stored or referencing information to forecast electrical load, and manages electrical load in response to identified events. The control circuitry can associate each branch circuit with reference load information, and disaggregate loads on each branch circuit based on the reference load information and on the electrical load in the branch circuit.

24 Claims, 39 Drawing Sheets

(58) Field of Classification Search
CPC .. H02J 7/35; H02J 2310/12; H02J 3/14; H02J 3/003; G01R 21/06; G05F 1/10; Y02B 70/3225; Y02E 10/56; Y04S 20/222
See application file for complete search history.

(56) References Cited

U.S. PATENT DOCUMENTS

| | | | |
|---|---|---|---|
| 11,342,754 B2 | 5/2022 | Rao | |
| 2007/0064377 A1* | 3/2007 | DeBoer | H02J 13/00034 361/637 |
| 2007/0158171 A1 | 7/2007 | Deboer et al. | |
| 2008/0041704 A1 | 2/2008 | McCoy | |
| 2009/0018706 A1 | 1/2009 | Wittner | |
| 2010/0163377 A1 | 7/2010 | Frassineti | |
| 2010/0301809 A1 | 12/2010 | Bhade | |
| 2011/0037429 A1 | 2/2011 | Deboer et al. | |
| 2011/0172841 A1 | 7/2011 | Forbes | |
| 2012/0127088 A1 | 5/2012 | Pance | |
| 2012/0286729 A1 | 11/2012 | Yegin et al. | |
| 2014/0063695 A1 | 3/2014 | Martin et al. | |
| 2015/0162157 A1 | 6/2015 | Luebke | |
| 2015/0270695 A1 | 9/2015 | Baker et al. | |
| 2015/0316944 A1* | 11/2015 | Thellend | H02J 13/00001 700/292 |
| 2017/0141610 A1 | 5/2017 | Niaki | |
| 2017/0264817 A1* | 9/2017 | Yan | H04N 5/23254 |
| 2017/0302039 A1 | 10/2017 | Tremaine | |
| 2018/0048142 A1 | 2/2018 | Immel et al. | |
| 2018/0048159 A1* | 2/2018 | Narla | H01L 31/042 |
| 2018/0358839 A1 | 12/2018 | Perez et al. | |
| 2020/0023747 A1 | 1/2020 | Logvinov et al. | |
| 2020/0073342 A1 | 3/2020 | Lee et al. | |
| 2020/0112199 A1 | 4/2020 | Rao | |
| 2020/0259336 A1 | 8/2020 | Rao | |

OTHER PUBLICATIONS

International Search Report and Written Opinion of PCT/US2019/054878 dated Jan. 8, 2020.
International Search Report and Written Opinion of PCT/US2020/017993 dated Jun. 29, 2020.
Invitation to Pay Additional Fees from PCT/US2020/017993 dated Apr. 23, 2020.
U.S. Appl. No. 16/593,899, filed Oct. 4, 2019, Archan Padmanabhan Rao.
U.S. Appl. No. 16/789,324, filed Feb. 12, 2020, Archan Padmanabhan Rao.
File history of U.S. Appl. No. 16/593,899.
File history of U.S. Appl. No. 16/789,324.
International Search Report and Written Opinion of PCT/US2022/011646 dated Apr. 22, 2022.
Ren, Qiangguo et al., "A BDI multi-agent approach for power restoration," 2014 7th International Symposium on Resilient Control Systems (ISRCS), IEEE, pp. 1-6, Aug. 19, 2014.

* cited by examiner

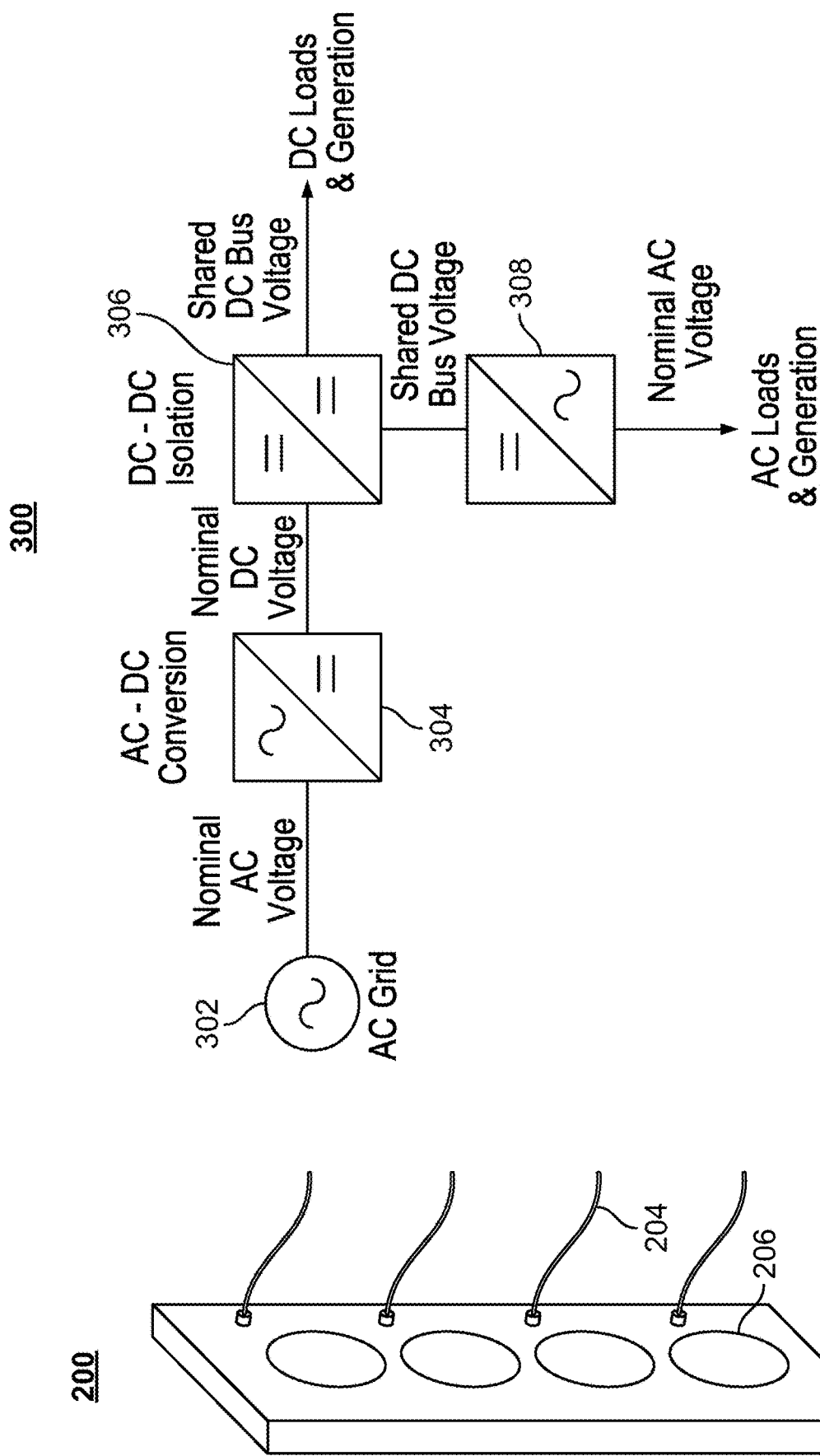

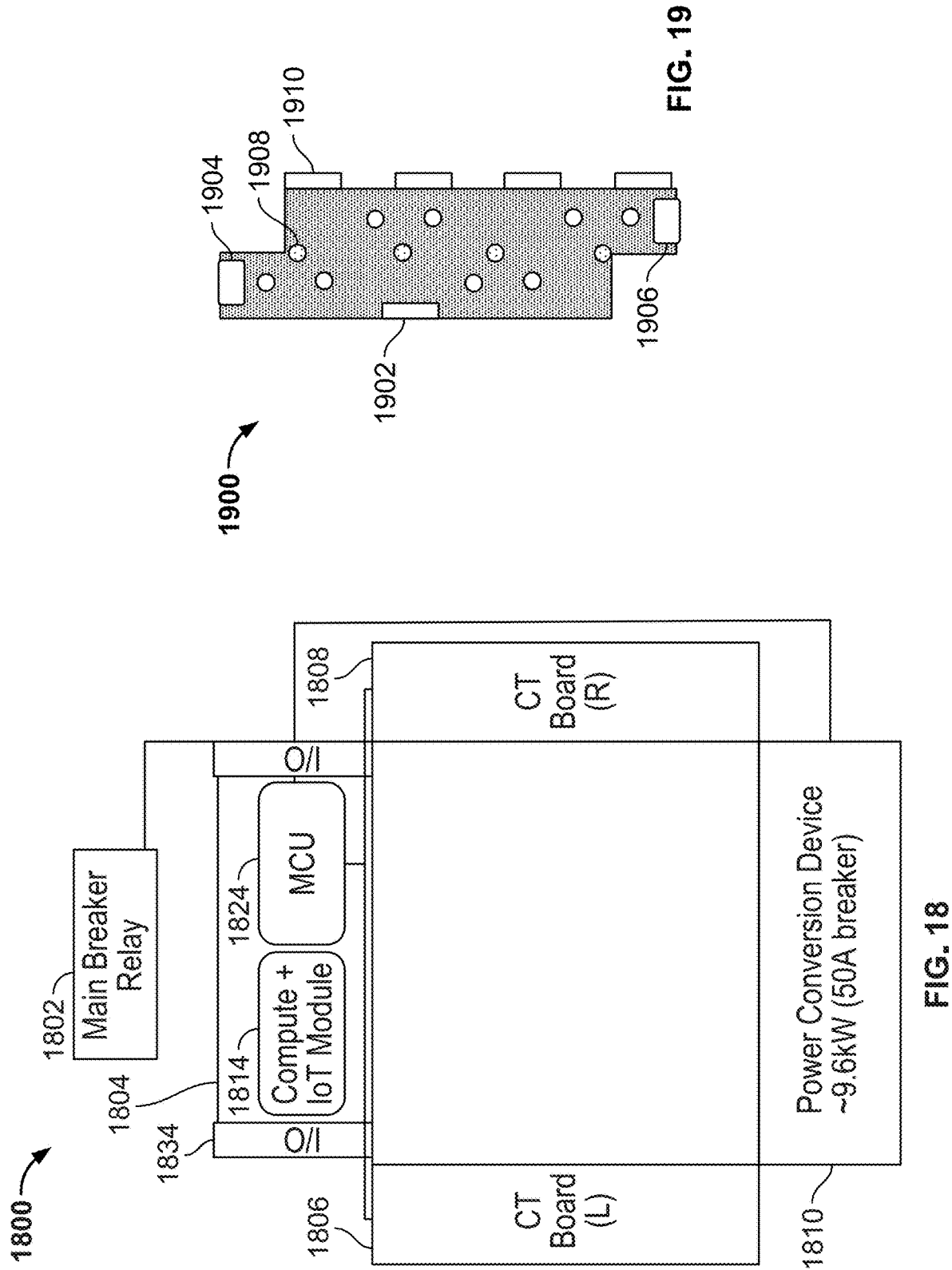

2300

| Grid | Loads | Solar | Storage | EV | Use Case |
|---|---|---|---|---|---|
| On-grid Import | All | On | Charging | Charging | Self-generation, Self-consumption, Storage, and Net-import |
| On-grid Export | Partial | Curtailed | Idle | Idle | |
| Off-grid | Essential | Off | Discharging | Discharging | |

| Grid | Loads | Solar | Storage | EV | Use Case |
|---|---|---|---|---|---|
| On-grid Import | All | On | Charging | Charging | Self-generation, Self-consumption, and Net-export |
| On-grid Export | Partial | Curtailed | Idle | Idle | |
| Off-grid | Essential | Off | Discharging | Discharging | |

| Grid | Loads | Solar | Storage | EV | Use Case |
|---|---|---|---|---|---|
| On-grid Import | All | On | Charging | Charging | Islanded Microgrid Powering Essential Loads with On-site Solar and Battery |
| On-grid Export | Partial | Curtailed | Idle | Idle | |
| Off-grid | Essential | Off | Discharging | Discharging | |

| Grid | Loads | Solar | Storage | EV | Use Case |
|---|---|---|---|---|---|
| On-grid Import | All | On | Charging | Charging | Islanded Microgrid Powering Essential Loads with Curtailed Solar Generation and Battery |
| On-grid Export | Partial | Curtailed | Idle | Idle | |
| Off-grid | Essential | Off | Discharging | Discharging | |

FIG 23

| Grid | Loads | Solar | Storage | EV | Use Case |
|---|---|---|---|---|---|
| On-grid Import | All | On | Charging | Charging | Islanded Microgrid Powering Essential Loads with Battery and EV |
| On-grid Export | Partial | Curtailed | Idle | Idle | |
| Off-grid | Essential | Off | Discharging | Discharging | |

| Grid | Loads | Solar | Storage | EV | Use Case |
|---|---|---|---|---|---|
| On-grid Import | All | On | Charging | Charging | Islanded Microgrid Powering Partial Loads with Solar, Battery, and EV |
| On-grid Export | Partial | Curtailed | Idle | Idle | |
| Off-grid | Essential | Off | Discharging | Discharging | |

| Grid | Loads | Solar | Storage | EV | Use Case |
|---|---|---|---|---|---|
| On-grid Import | All | On | Charging | Charging | Net Export to Grid from on-site Solar, Battery, and EV for Grid Applications |
| On-grid Export | Partial | Curtailed | Idle | Idle | |
| Off-grid | Essential | Off | Discharging | Discharging | |

FIG. 23 (Cont.)

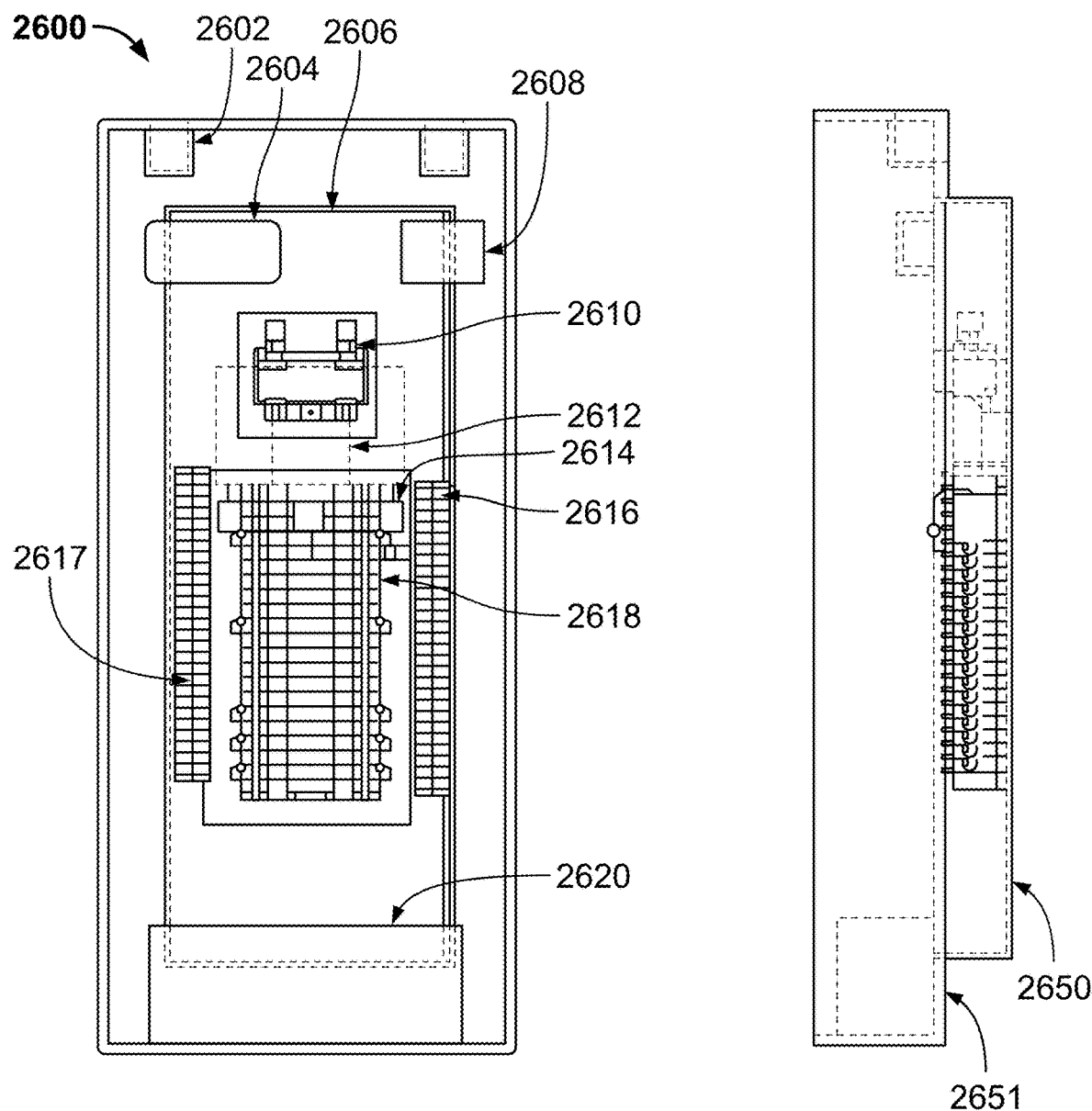
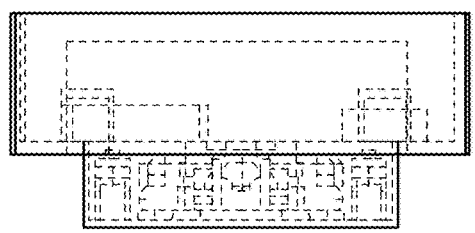
FIG. 26

SYSTEMS AND METHODS FOR MANAGING ELECTRICAL LOADS

CROSS-REFERENCE TO RELATED APPLICATIONS

The present disclosure is directed towards an integrated electrical management system. This application claims the benefit of U.S. Provisional Patent Application No. 62/901,746 filed Sep. 17, 2019, the disclosure of which is hereby incorporated by reference herein in its entirety.

BACKGROUND

A home or small business electrical infrastructure generally includes circuits, grouped by breaker, that correspond to load types, spatially related loads, or both. The breakers are tripped over current or manual action, and thus provide some circuit protection. If a user, supplier, or other entity wants to monitor or manage operation if the circuits it may be performed at a load device, monitoring a total current flow at the electrical meter.

SUMMARY

The present disclosure is directed to an integrated approach to electrical systems and monitoring/control. For example, in some embodiments, the present disclosure is directed to equipment having integrated components configured to be field-serviceable. In a further example, in some embodiments, the present disclosure is directed to a platform configured to monitor, control, or otherwise manage aspects of operation of the electrical system.

In some embodiments, the system includes an electrical panel with embedded power electronics configured to enable direct DC coupling of distributed energy resources (DERs). In some embodiments, the system is configured to provide DC-DC isolation for the main breaker, which enables seamless islanding and self-consumption mode, for example. In some embodiments, the system includes one or more current sensing modules (e.g., current transformer (CT) flanges, or printed circuit boards (PCBs)) configured to provide metering, controls, and/or energy management. In some embodiments, the system includes components that are designed for busbar mounting, or DIN rail mounting to provide power conversion that is modular and field serviceable.

In some embodiments, the system is configured to implement a platform configured to manage energy information. In some embodiments, the platform is configured to host applications. In some embodiments, the platform is configured to host a computing environment in which developers may create value-added software for existing/emerging applications. In some embodiments, the system includes processing equipment integrated in the main electrical panel and configured for local energy management (e.g., metering, controls, and power conversion). In some embodiments, the processing equipment is configured to communicate over wired (e.g., power-line communication (PLC), or other protocol) or wireless communications links to externally controllable loads, third-party sensors, any other suitable devices or components, or any combination thereof. In some embodiments, the processing equipment is configured to support distributed computing needs (e.g., transactive energy, blockchain, virtual currency mining). For example, the computing capacity of the processing equipment may be used for purposes other than managing energy flow. In a further example, excess generation may be used to support computing needs. In some embodiments, the platform is open-access and is configured to serve as an operating system (OS) layer for third-party applications. For example, third-party applications may be developed for consumer/enterprise facing solutions (e.g., disaggregation, solar monitoring, electric vehicle (EV) charging, load controls, demand response (DR), and other functions).

In some embodiments, the present disclosure is directed to a system for managing electrical loads. The system includes a plurality of branch circuits each including a respective controllable element, a sensor system configured to measure one or more electrical parameters corresponding to the plurality of branch circuits, and control circuitry coupled to each controllable element and the sensor system. The control circuitry is configured to determine respective electrical load information in each respective branch circuit of the plurality of branch circuits based on the sensor system, and control the respective electrical load in each respective branch circuit using the respective controllable element based on the respective electrical load information.

In some embodiments, the sensor system includes a plurality of current sensors coupled to the plurality of branch circuits, a voltage sensor coupled to buses that are coupled to the plurality of branch circuits, or a combination thereof.

In some embodiments, the control circuitry is configured to forecast an electrical load behavior and switch one or more respective controllable elements of the respective branch circuits to manage the respective electrical load in each of the plurality of branch circuits over time. For example, in some embodiments, the control circuitry estimates an electrical load based on historical information, reference information, both.

In some embodiments, the system includes an energy storage device coupled to the plurality of branch circuits, and the control circuitry is configured to manage the respective electrical load in each respective branch circuit in response to a power disruption to manage electrical energy stored in the energy storage device. For example, in some embodiments, the system includes a battery pack configured to store energy, and the control circuitry is configured to manage electrical loads in each branch circuit in the event of a power outage during which the battery pack supplies electrical power to each branch circuit. Further, the control circuitry is configured to maximize a time interval of electrical power to one or more particular branch circuits, limit total electrical load in one or all branch circuits, maintain one or more critical systems coupled to a branch circuit, achieve a pre-determined load allotment among the branch circuits, or a combination thereof.

In some embodiments, the system includes at least one busbar electrically coupled to the plurality of branch circuits, and each respective controllable element includes a controllable breaker coupled to the at least one busbar. For example, the system may include two busbars (e.g., line and neutral of a n AC bus, a DC bus), three busbars (e.g., a first line, a second line, and a neutral, three-phase power), or more busbars (e.g., for three-phase power with a neutral), to which the branch circuits are coupled. In some embodiments, the at least one busbar is coupled to a power grid, a power generation source (e.g., a distributed generator, a DC source such as a photovoltaic system), an energy storage device, any other suitable device, or any combination thereof. In some embodiments, each controllable element includes a controllable relay, and the control circuitry is further configured to determine energy information about the respective electric load and control the controllable relay based on the respective electric load.

In some embodiments, the system includes a main disconnect configured to couple the plurality of branch circuits to a power grid, and the control circuitry is configured to control operation of the main disconnect. For example, in the event of a fault, maintenance, user input, or other criteria, the control circuitry may disconnect the branch circuits from the power grid (or other power source). To illustrate, in some embodiments, the main disconnect is coupled to one or more busbars, which are in turn coupled to the plurality of branch circuits or a subset thereof.

In some embodiments, the sensor system includes one or more main current sensors for sensing current in at least one busbar coupled to the plurality of branch circuits. The control circuitry is configured to determine the total current flow between the at least one bus bar and a power grid based on a signal from the one or more main current sensors.

In some embodiments, the control circuitry includes communications equipment configured to communicate with a network or a mobile device, and the communications equipment is configured to transmit energy information. For example, in some embodiments, the communications equipment includes a wired interface, a wireless interface, or both, for sending and receiving information from a server, a network, a device, or a combination thereof (e.g., communicating with a device via a network). In some embodiments, the control circuitry hosts an application that is configured to received energy information from the sensor system, from an information source (e.g., local or remote memory, an external server, a remote device), from a user, from any other suitable information source, or from a combination thereof.

In some embodiments, the control circuitry is configured to associate each respective branch circuit with reference load information, wherein the reference load information comprises at least one expected load. In some such embodiments, the control circuitry is configured to disaggregate more than one load on at least one branch circuit based at least in part on the reference load information and based at least in part on the electrical load in the at least one branch circuit. For example, the control circuitry may identify rooms (e.g., kitchen, bathroom, garage), load types (e.g., lighting, lighting and outlets, large current draws, constant loads, intermittent loads, timed loads with predetermined schedules, types of appliances), load capacities (e.g., maximum current draw, peak power, duty cycle or "on-time," load requirements (e.g., power quality, voltage requirements, time requirements), any other suitable classifiers, or any combination thereof. In a further example, the control circuitry may determine reference load information for all branch circuits, one branch circuit, or all branch circuits. In some embodiments, the control circuitry stores the reference load information in memory (e.g., a local storage device, a remote server or other network device, a user device such as a smartphone).

In some embodiments, the control circuitry is configured to generate a graphical user interface on a display for displaying information indicative of the respective electrical load in each respective branch circuit. In some embodiments, the system includes a touchscreen coupled to the control circuitry, and the touchscreen includes the display and is configured to receive haptic input (e.g., from a user). For example, the system may include an electrical panel having a touchscreen, and the control circuitry is configured to provide information for display, and receive information from a user.

In some embodiments, the sensor system includes one or more main current sensors for sensing current in at least one busbar coupled to the plurality of branch circuits. In some such embodiments, at least one busbar of the system is coupled to a power generation source, and the control circuitry is configured to transmit information based on a signal from the one or more main current sensors to the power generation source for the purpose of modifying at least one of a quantity of power generated, a quantity of power consumed, or a quality of power generated, so that the system achieves a target current flow between the at least one bus bar and the power generation source.

In some embodiments, the present disclosure is directed to a method for managing electrical loads. The method includes receiving at least one sensor signal from a sensor system configured to measure one or more electrical parameters corresponding to one or more branch circuits, associating the one or more branch circuits with reference load information, determining a respective electrical load in the one or more branch circuits based on the sensor signal, disaggregating more than one load on at least one branch circuit based at least in part on the reference load information and based at least in part on the respective electrical load in the one or more branch circuits, and controlling a respective controllable element to manage the respective electrical load in each respective branch circuit. The reference load information includes at least one expected load on one of the branch circuits. In some embodiments, the reference load information includes load information corresponding to at least one of an appliance, a user device, an energy storage device, or an energy source.

In some embodiments, the method includes identifying an event associated with a power grid coupled to the one or more branch circuits, determining operating criteria based on the event, and disconnecting or connecting the one or more branch circuits based on the operating criteria. For example, the event may include a fault (e.g., a power outage from the power grid, a short, a component failure, power quality outside of a predetermined threshold), a user-specified event (e.g., in response to user input, or input from another entity such as a power provider, or monitoring entity), a timed event (e.g., routine maintenance), in response to one or more operating parameters falling outside of a predetermined range (e.g., an over-current, an over-voltage, an under-voltage, a power factor value, a frequency differing from a nominal frequency, a time duration), any other suitable event, or any combination thereof.

In some embodiments, controlling the respective controllable element to manage the respective electrical load in each respective branch circuit includes determining operating criteria based on the reference load information, and managing activation and de-activation of the respective controllable element based on the operating criteria. For example, in some embodiments, the control circuitry determines whether to open or close each branch circuit based on the measured load information (e.g., current, time duration, voltage, power) and reference load information (e.g., thresholds, limits, expected values, expected characteristics).

In some embodiments, the method includes storing energy information based on the respective electrical load in the one or more branch circuits. For example, the control circuitry stores usage information (e.g., current, power, energy, time duration, time of day, load temporal profile or other temporal information, or a combination thereof for one or more branch circuits).

In some embodiments, the present disclosure is directed to non-transitory computer-readable medium having instructions encoded thereon that when executed by control circuitry cause the control circuitry to execute a method for managing electrical loads. The instructions include instructions for receiving at least one sensor signal from a sensor system configured to measure one or more electrical parameters corresponding to one or more branch circuits, associating the one or more branch circuits with reference load information, determining a respective electrical load in the one or more branch circuits based on the sensor signal, disaggregating more than one load on at least one branch circuit based at least in part on the reference load information and based at least in part on the respective electrical load in the one or more branch circuits, and controlling a respective controllable element to manage the respective electrical load in each respective branch circuit. For example, in some embodiments, the control circuitry is configured to implement an application that manages an electrical panel and electrical loads thereof.

In some embodiments, the instructions include instructions for identifying an event associated with a power grid coupled to the one or more branch circuits, determining operating criteria based on the event, and disconnecting or connecting the one or more branch circuits with the power grid based on the operating criteria.

In some embodiments, the instructions include instructions for determining operating criteria based on the reference load information, and managing activation and de-activation of the respective controllable element based on the operating criteria.

In some embodiments, the instructions include instructions for storing energy information based on the respective electrical load in the one or more branch circuits.

BRIEF DESCRIPTION OF THE DRAWINGS

The present disclosure, in accordance with one or more various embodiments, is described in detail with reference to the following figures. The drawings are provided for purposes of illustration only and merely depict typical or example embodiments. These drawings are provided to facilitate an understanding of the concepts disclosed herein and shall not be considered limiting of the breadth, scope, or applicability of these concepts. It should be noted that for clarity and ease of illustration these drawings are not necessarily made to scale.

FIG. 2 shows a perspective view of an illustrative current sensor, in accordance with some embodiments of the present disclosure;

FIG. 3 shows an illustrative set of subsystems, which may be included in a power conversion device, in accordance with some embodiments of the present disclosure;

FIG. 18 shows an illustrative panel layout, in accordance with some embodiments of the present disclosure;

FIG. 19 shows an illustrative current sensing board, in accordance with some embodiments of the present disclosure;

FIG. 23 shows a table of illustrative use cases, in accordance with some embodiments of the present disclosure;

FIG. 26 shows bottom, side, and front views of an illustrative panel, in accordance with some embodiments of the present disclosure;

DETAILED DESCRIPTION

Figure 1:
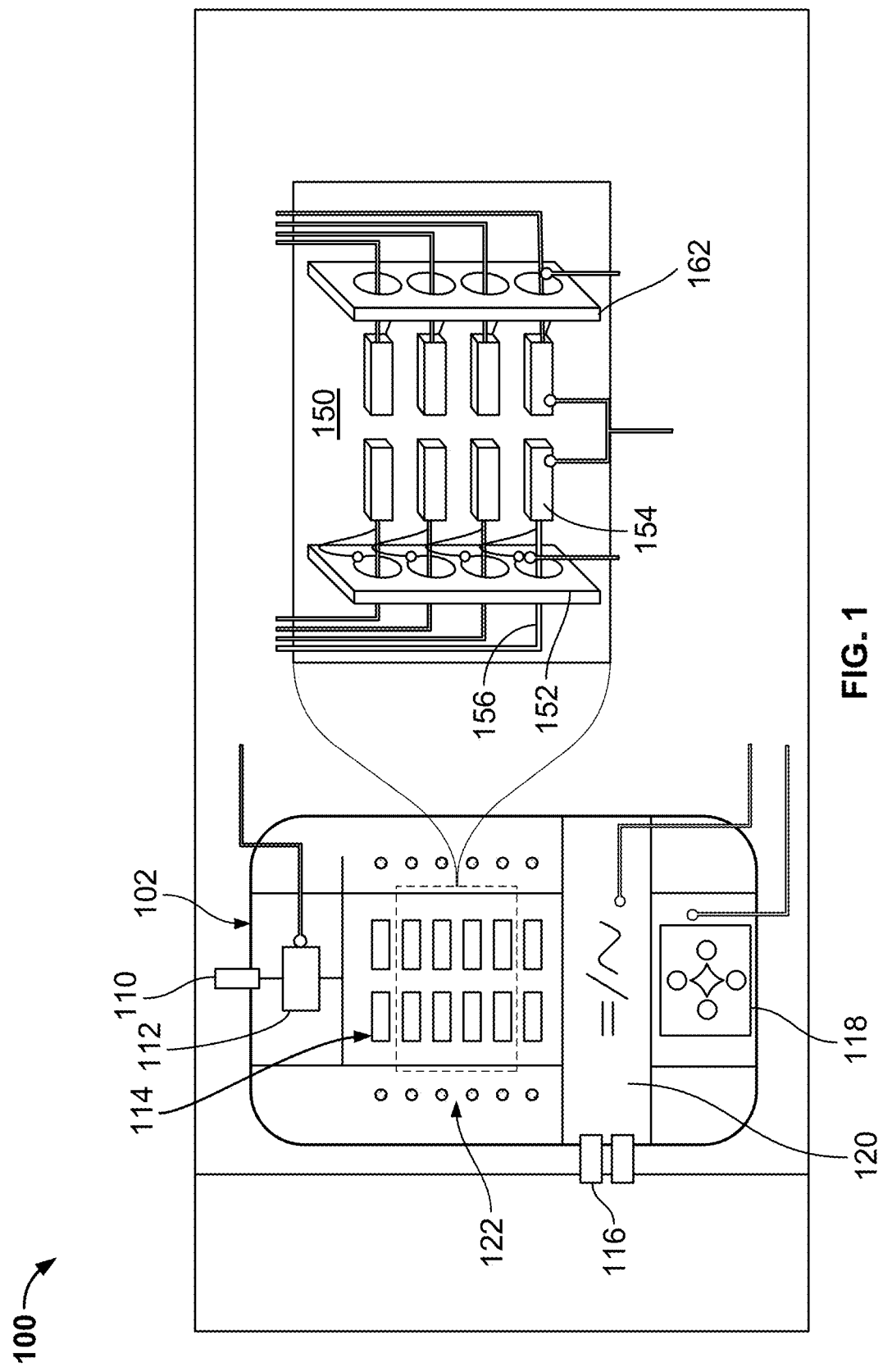
FIG. 1 shows a system diagram of an illustrative electrical panel, in accordance with some embodiments of the present disclosure.

Determination of electrical loads over time can be based on measurements (e.g., current measurements), information about what appliances are connected to each circuit, expected electrical profile behavior, any other available information. During normal usage, or emergencies, the actual electrical load of devices and circuits may be determined and managed.

In some embodiments, the present disclosure is directed to a system that is capable of monitoring and managing the flow of energy (e.g., from multiple sources of energy, both AC and DC), serving multiple loads (e.g., both AC and DC), communicating energy information, or any combination thereof. The system may include, for example, any or all of the components, subsystems and functionality described below. The system may include a microgrid interconnect device, for example.

In some embodiments, the system includes (1) a controllable rely and main service breaker that is arranged between the AC utility electric supply and all other generators, loads, and storage devices in a building or home.

In some embodiments, the system includes (2) an array of individual, controllable, electromechanical relays and/or load circuit breakers that are connected via an electrical busbar to the main service breaker (e.g., applies to both panel mounted or DIN rail mounted systems).

In some embodiments, the system includes (3) an array of current sensors such as, for example, solid-core or split-core current transformers (CTs), current measurement shunts, Rogowski coils, or any other suitable sensors integrated in to the system for the purpose of providing a current measurement, providing a power measurement, and/or metering the energy input and output from each load service breaker. In some embodiments, for example, a relay is integrated with an attached shunt, and the relay/shunt is attached to a busbar.

In some embodiments, the system includes (4) a bidirectional power-conversion device that can convert between AC and DC forms of energy:

(a) with the ability to take multiple DC sub-components as inputs (e.g., with the same or different DC voltages);

(b) designed to mount or connect directly to the busbar (e.g., AC interface) or DIN-rail (e.g., with AC terminals); and (c) with different size options (e.g., kVA ratings, current rating, or voltage rating).

In some embodiments, the system includes (5) processing equipment/control circuitry such as, for example, an onboard gateway computer, printed circuit board, logic board, any other suitable device configured to communicate with, and optionally control, any suitable sub-components of the system. The control circuitry may be configured:

(a) for the purpose of managing energy flow between the electricity grid and the building/home;

(b) for the purpose of managing energy flow between the various generators, loads, and storage devices (sub-components) connected to the system;

(c) to be capable of islanding the system from the electricity grid by switching the controllable main (e.g., dipole) relay off while leaving the safety and functionality of the main service breaker unaffected (e.g., energy sources and storage satisfy energy loads);

(d) to be capable of controlling each circuit (e.g., branch circuit) individually or in groups electronically and capable of controlling end-devices (e.g., appliances) through wired or wireless communication means. The groups can be on demand or predefined in response to an external system state (e.g. based on grid health, battery state of energy);

(e) for performing local computational tasks including making economic decisions for optimizing energy use (e.g., time of use, use mode);

(f) for allowing for external computational tasks to be run onboard as part of a distributed computing resource network (e.g. circuit level load predictions, weather-based predictions) that enhance the behavior of the local tasks;

(g) allowing for monitoring and control via a mobile app that can connect directly to the panel via WiFi or from anywhere in the world by connecting via the cloud. This allows for graceful operation of homeowner app in the absence of the cloud (e.g. during natural disasters);

(h) allowing for setup and configuration via a single mobile app for installers that simplifies the entire solar and storage installation process by connecting directly to the panel via WiFi or connecting through the cloud via a cellular network; and (i) allowing suggestions of breaker naming by installer through mobile application to standardize names allowing immediate predictions of loads and improved homeowner experience from the moment of installation. For example, the application may be hosted via the cloud, or may be accessed by directly connecting with the panel.

In some embodiments, the system includes (6) communications equipment such as, for example, an onboard communication board with cellular (e.g., 4G, 5G, LTE), Zigbee, Bluetooth, Thread, Z-Wave, WiFi radio functionality, any other wireless communications functionality, or any combination thereof:

(a) with the ability to act both as a transponder (e.g., an access point), receiver, and/or repeater of signals;

(b) with the ability to interface wired or wireless with internet/cable/data service provider network equipment. For example, the equipment may include coaxial cables, fiber optic, ethernet cables, any other suitable equipment configured for wired and/or wireless communication, or any combination thereof;

(c) capable of updating software and/or firmware of the system by receiving updates over-the-air. For example, by receiving updates to applications and operating systems by downloading them via a network connection, or from a user's phone through an application, or any combination thereof; or (d) capable of relaying software and/or firmware updates to remote components of the system contained elsewhere, inside the primary system enclosure, or outside the primary system enclosure.

Any or all of the components listed above may be designed to be field replaceable or swappable for repairs, upgrades, or both. The system includes energy-handling equipment as well as data input/output (TO) equipment.

In some embodiments, the system is configured for single phase AC operation, split phase AC operation, 3-phase AC operation, or a combination thereof. In some embodiments, the system contains a neutral-forming autotransformer or similar magnetics or power electronics in order to support microgrid operation when installed with a single-phase inverter.

In some embodiments, the system contains hardware safety circuits that protect against disconnection, failure, or overload of the neutral-forming autotransformer or equivalent component by detecting and automatically disconnecting power to prevent risk of damage to appliances or fire caused by imbalanced voltage between phases.

In some embodiments, components of the system are configured for busbar mounting, DIN rail mounting, or both, for integration in electrical distribution panels. In some embodiments, the system is designed to be mechanically compatible with commercial off-the-shelf circuit breakers. In some circumstances, commercial off-the-shelf controllable breakers may be included in the panel and managed by the system's control circuitry.

A consumer, nominated service provider, or other suitable entity may monitor and control one or more breakers, relays, devices, or other components using an application or remotely controlling (e.g., from a network-connected mobile device, server, or other processing equipment).

In some embodiments, the system is installed with included (e.g., complimentary) hardware that provides controls, metering, or both for one or more downstream sub-panels, communicating using wireless or powerline communications.

In some embodiments, a thermal system design allows for heat rejection from power electronics or magnetics such as neutral-forming transformers. This may be done with active cooling or passive convection.

In some embodiments, the system includes various modular power-conversion system sizes that are configured to replace circuit breakers, relays, or both (e.g., as more are needed, or larger capacity is needed).

In some embodiments, controllable relays are configured to receive a relatively low-voltage (e.g., less than the grid or load voltage) signal (e.g., a control signal) from an onboard computer.

In some embodiments, a main service breaker is also metered (e.g., by measuring current, voltage, or both). For example, metering may be performed at any suitable resolution (e.g., at the main, at a breaker, at several breakers, at a DC bus, or any combination thereof). Metering may be performed at any suitable frequency, with any suitable bandwidth, and accuracy to be considered "revenue grade" (e.g., to provide an ANSI metering accuracy of within 0.5% or better).

In some embodiments, the system is configured to determine and analyze high-resolution meter data for the purpose of disaggregation. For example, disaggregation may be performed by an entity (e.g., an on-board computer, or remote computing equipment to which energy information is transmitted via the network).

In some embodiments, the main utility service input can be provided directly or through a utility-provided meter.

In some embodiments, control of the system is divided between microprocessors, such that safety and real-time functionality features are handled by a real-time microprocessor and higher-level data analysis, networking, logic interactions, any other suitable functions, or a combination thereof are performed in a general-purpose operating system.

FIG. 1 shows illustrative system 100 for managing and monitoring electrical loads, in accordance with some embodiments of the present disclosure. System 100 may be configured for single phase AC operation, split phase AC operation, 3-phase AC operation, or a combination thereof. In some embodiments, components of system 100 are configured for busbar mounting, DIN rail mounting, or both, for integration in electrical distribution panels. In some circumstances, non-controllable breakers are included in panel 102. In some embodiments, a consumer, a nominated service provider, any other suitable entity, or any combination thereof may monitor and control one or more breakers, devices, or other components using an application or remotely (e.g., from a network-connected mobile device, server, or other processing equipment). In some embodiments, system 100 is thermally designed to allow for heat rejection (e.g., due to Ohmic heating). In some embodiments, system 100 includes one or more modular power-conversion system sizes that are configured to replace circuit breakers (e.g., as more are needed, or larger capacity is needed). In some embodiments, controllable circuit devices 114 (e.g., breakers, relays, or both) are configured to receive a relatively low-voltage (e.g., less than the grid or load voltage) control signal from an onboard computer 118 (e.g., processing equipment/control circuitry). For example, onboard computer 118 may include a wireless gateway, a wired communications interface, a display, a user interface, memory, any other suitable components, or any combination thereof. In some embodiments, main service breaker 112 is metered (e.g., be measuring current, voltage, or both). For example, metering may be performed at any suitable resolution (e.g., at the main, at a breaker, at several breakers, at a DC bus, or any combination thereof). In some embodiments, system 100 is configured to determine high-resolution meter data for the purpose of disaggregation. For example, disaggregation may be performed by an entity (e.g., an on-board computer, or remote computing equipment to which energy information is transmitted via the network). In some embodiments, main utility service input 110 is provided directly or provided through a utility-provided meter.

An AC-DC-AC bi-directional inverter may be included as part of the system of FIG. 1 but need not be. As illustrated, system 100 includes power electronics 120 for electrically coupling DC resources. For example, power electronics 120 may have a 10 kVa rating, or any other suitable rating. DC inputs 116 may be coupled to any suitable DC devices.

In some embodiments, system 100 includes one or more sensors configured to sense current. For example, as illustrated, system 100 includes current sensors 152 and 162 (e.g., a current transformer flange or current shunt integrated into a busbar) for panel-integrated metering functionality, circuit breaker functionality, load control functionality, any other suitable functionality, or any combination thereof. Current sensors 152 and 162 each include current sensors (e.g., current transformers, shunts, Rogowski coils) configured to sense current in respective branch circuits 156 (e.g., controlled by respective breakers 154 or relays of controllable circuit devices 114, as illustrated in enlargement 150). In some embodiments, system 100 includes voltage sensing equipment, (e.g., a voltage sensor), configured to sense one or more AC voltage (e.g., voltage between line and neutral), coupled to control circuitry.

In some embodiments, panel 102 includes indicators 122 that are configured to provide a visual indication, audio indication, or both indicative of a state of a corresponding breaker of controllable circuit devices 114. For example, indicators 122 may include one or more LEDs or other suitable lights of one color, or a plurality of colors, that may indicate whether a controllable breaker is open, closed, or tripped; in what range a current flow or power lies; a fault condition; any other suitable information; or any combination thereof. To illustrate, each indicator of indicators 122 may indicate either green (e.g., breaker is closed on current can flow) or red (e.g., breaker is open or tripped).

In some embodiments, the system includes, for example, one or more low-voltage connectors configured to interface with one or more other components inside or outside the electrical panel including, for example, controllable circuit breakers, communication antennas, digital/analog controllers, any other suitable equipment, or any combination thereof.

In some embodiments, system 100 includes component such as, for example, one or more printed circuit boards configured to serve as a communication pathway for and between current sensors, voltage sensors, power sensors, actuation subsystems, control circuitry, or a combination thereof. In some embodiments, a current sensor provides a sufficient accuracy to be used in energy metering (e.g., configured to provide an ANSI metering accuracy of within 0.5% or better). In some embodiments, current sensors 152 and 162 (e.g., the current sensing component) can be detached, field-replaced, or otherwise removable. In some embodiments, one or more cables may couple the PCB of a current sensor to the processing equipment. In some embodiments, the sum of each power of the individual circuits (e.g., branch circuits) corresponds to the total meter reading (e.g., is equivalent to a whole-home "smart" meter).

In some embodiments, system 100 includes an embedded power conversion device (e.g., power electronics 120). The power conversion device (e.g., power conversion device 120) may be arranged in a purpose-built electrical distribution panel, allowing for DC-coupling of loads and generation (e.g., including direct coupling or indirect coupling if voltage levels are different). For example, DC inputs 116 may be configured to be electrically coupled to one or more DC loads, generators, or both. In some embodiments, power conversion device 120 includes one or more electrical breakers that snap on to one or more busbars of an electrical panel 102. For example, AC terminals of power conversion system 120 may contact against the busbar directly. In a further example, power conversion device 120 may be further supported mechanically by anchoring to the backplate of electrical panel 102 (e.g., especially for larger, or modular power stages). In some embodiments, power conversion device 120 includes a bi-directional power electronics stack configured to convert between AC and DC (e.g., transfer power in either direction). In some embodiments, power conversion device 120 includes a shared DC bus (e.g., DC inputs 116) configured to support a range of DC devices operating within a predefined voltage range or operating within respective voltage ranges. In some embodiments, power conversion device 120 is configured to enable fault-protection. For example, system 100 may prevent fault-propagation using galvanic isolation. In some embodiments, power conversion device 120 is configured to allow for digital control signals to be provided to it in real-time from the control circuitry (e.g., within electrical panel 102, from onboard computer 118).

In some embodiments, power conversion device 120 is configured as a main service breaker and utility disconnect from a utility electricity supply. For example, power conversion device may be arranged at the interface between a utility service and a site (e.g., a home or building). For example, power conversion device 120 may be arranged within electrical panel 102 (e.g., in place of, or in addition to, a main service breaker 112).

FIG. 2 shows a perspective view of illustrative current sensor 200, in accordance with some embodiments of the present disclosure. For example, current sensor 200 may be mounted to the backplate of an electrical panel in a purpose-built housing (e.g., as part of panel 102 of FIG. 1), mounted on a DIN-rail, or include any other suitable mounting configuration. In some embodiments, the component includes, for example, one or more solid-core current-transformers 206 configured to provide high-accuracy metering of individual load wires fed in to the electrical panel and connected to circuit breakers (e.g., in some embodiments, one sensor per breaker). In some embodiments, the component includes, for example, current measurement shunts attached to, or integrated directly with, one or more bus bars. Signal leads 204 are configured to transmit sensor information (e.g., measurement signals), receive electric power for sensors, transmit communications signals (e.g., when current sensor 200 includes an analog to digital converter and any other suitable corresponding circuitry). In some embodiments, current sensor 200 is configured to sense current and transmit analog signals via signal leads 204 to control circuitry. In some embodiments, current sensor 200 is configured to sense current and transmit digital signals via signal leads 204 to control circuitry. For example, signal leads 204 may be bundled into one or more low-voltage data cables for providing breaker controls. In some embodiments, current sensor 200 is configured to sense one or more voltages, as well as current, and may be configured to calculate, for example, power measurements associated with branch circuits or other loads.

FIG. 3 shows illustrative set of subsystems 300, which may include a power conversion device (e.g. power conversion device 120 of FIG. 1), in accordance with some embodiments of the present disclosure. In some embodiments, the power conversion device is configured to provide galvanic isolation between the grid (e.g., AC grid 302, as illustrated) and the electrical system by converting AC to DC (e.g., using AC-DC converter 304) at the electrical main panel. In some embodiments, the power conversion device is configured to step-up from nominal DC voltage to a shared DC bus voltage (e.g., that may be compatible with inter-operable DC loads and generation). For example, DC-DC converter 306 may be included to provide isolation, provide a step up or step down in voltage, or a combination thereof. In a further example, the power conversion device may include a DC-DC isolation component (e.g., DC-DC converter 306). In some embodiments, the power conversion device is configured to convert power from DC bus voltage to nominal AC voltage to connect with conventional AC loads & generation. For example, DC-AC converter 308 may be included to couple with AC loads and generation. In some embodiments, the power conversion device is configured to support microgrid (e.g., self-consumption) functionality, providing a seamless or near seamless transition from and to grid power. In some embodiments, the self-consumption architecture benefits in terms of conversion losses associated with the double-conversion (e.g., no need to convert to grid AC during self-consumption). In some embodiments, the device is configured to support AC and DC voltages used in homes/buildings. For example, the power conversion device may be configured to support typical AC appliance voltages and DC device voltages. In some embodiments, the power conversion device may be used to support a microgrid, real-time islanding, or other suitable use-cases.

Figure 4:
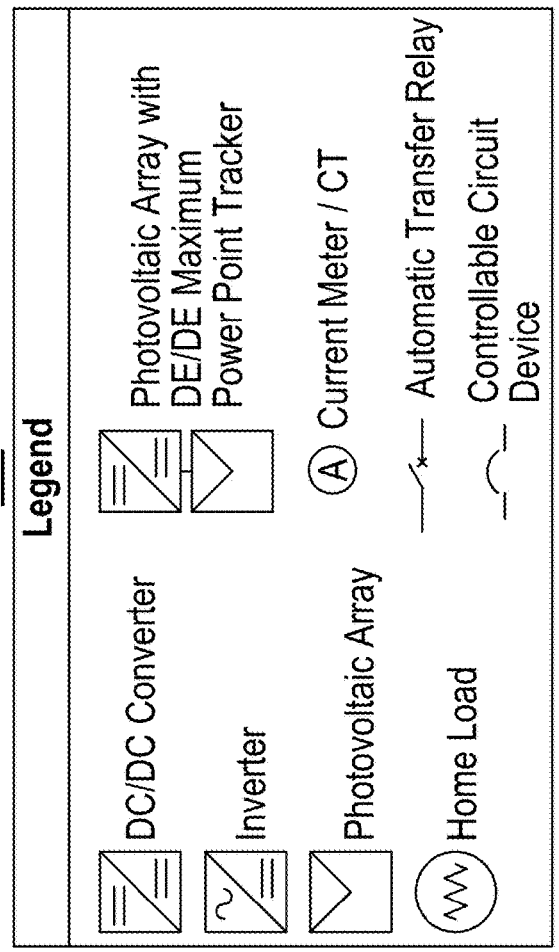
FIG. 4 shows a legend of illustrative symbols used in the context of FIGS. 5-16.

FIG. 4 shows legend 400 of illustrative symbols used in the context of FIGS. 5-16, in accordance with some embodiments of the present disclosure.

Figure 5:
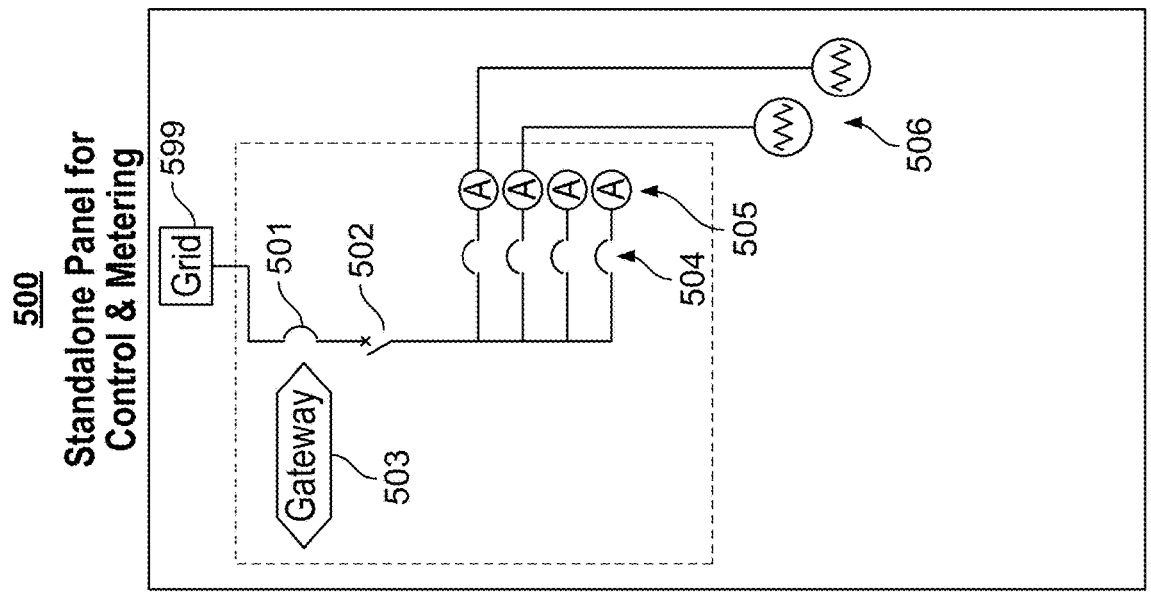
FIG. 5 shows a block diagram of an illustrative configuration that may be implemented for a home without distributed energy resources (e.g., such as solar, storage, or EVs), in accordance with some embodiments of the present disclosure.

FIG. 5 shows a block diagram of illustrative configuration 500 that may be implemented for a home without distributed energy resources (e.g., such as solar, storage, or EVs), in accordance with some embodiments of the present disclosure. As illustrated in FIG. 5, the system includes integrated gateway 503, controllable (e.g., islanding) main service device 501 with transfer device 502, and individual circuit devices 504 that are both metered and controllable (e.g., switched). In some embodiments, the busbar design can accommodate both controllable and non-controllable (e.g., legacy) circuit devices (e.g., breakers, relays, or both). In some embodiments, branch meters 505 are configured to be modular, allowing for grouping circuits with one device (e.g., 2-4 circuits or more). In some embodiments, integrated gateway 503 is configured to perform several local energy management functions including, for example: voltage-sensing the grid; controlling islanding main service breaker 501; controlling circuit breakers of circuit breakers 504 individually and in groups, measuring power & energy in real-time from each branch, computing total power at who panel level; and communicating wirelessly (e.g., using cellular, Wifi, Bluetooth, or other standard) with external devices as well as any suitable cloud-hosted platform. The system may be configured to monitor and control various electrical loads 506. The field-installable power conversion unit (e.g., a bi-directional inverter) may be included to this configuration. In some embodiments, controllable main service device 501 with transfer device 502 is configured to be used for safely disconnecting from the grid, connecting to grid 599, or both.

Figure 6:
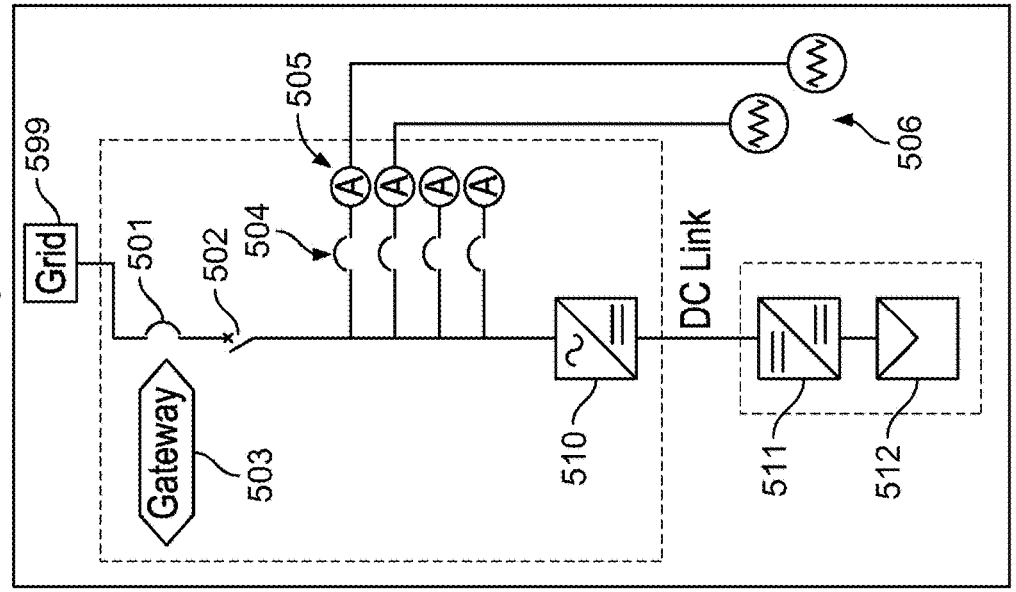
FIG. 6 shows a block diagram of an illustrative configuration including an integrated power conversion unit that allows for direct DC-coupling of the output of a solar system with a DC string maximum power point tracking (MPPT) unit or module-mounted DC MPPT unit, in accordance with some embodiments of the present disclosure.

FIG. 6 shows a block diagram of illustrative configuration 600 including integrated power conversion device 510 that allows for direct DC-coupling of the output of a solar system 512 with a DC string maximum power point tracking (MPPT) unit or module-mounted DC MPPT unit (e.g., unit 511), in accordance with some embodiments of the present disclosure. In some embodiments, the DC input voltage range of power conversion device 510 can accommodate various DC inputs allowing for easy integration of solar modules into a home. In some embodiments, power conversion device 510 is configured to serve as an isolation or disconnect device from the grid or electric loads. In some embodiments, the output level of solar system 512 is controllable from power conversion device 510 modulating the DC link voltage.

Figure 7:
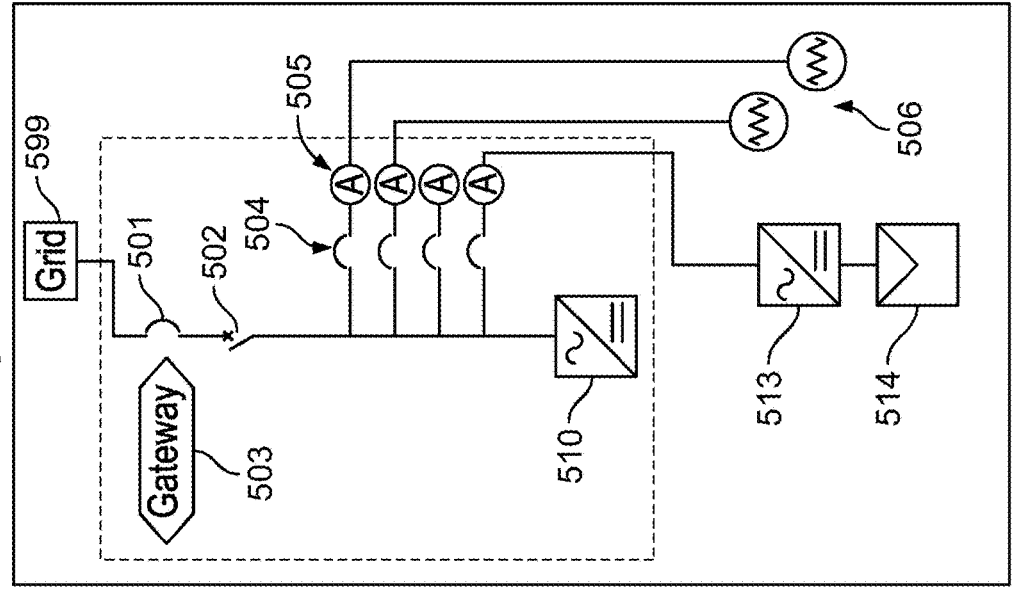
FIG. 7 shows a block diagram of an illustrative configuration including a solar inverter connected as an AC input through a circuit breaker, in accordance with some embodiments of the present disclosure.

FIG. 7 shows a block diagram of illustrative configuration 700 including external power conversion device 513 (e.g., a solar inverter) connected as an AC input through a circuit breaker (e.g., of controllable circuit breakers 504), in accordance with some embodiments of the present disclosure. In some embodiments, external power conversion device 513 may be a string MPPT or solar module mounted MPPT or micro-inverter. In some embodiments, a circuit breaker used to couple solar system 514 to the busbar of the panel may be sized to accommodate the appropriate system capacity. The output level of solar system 514 may be controlled using direct communication with solar system 514 or using voltage-based or frequency-based controls (e.g., from gateway 503). For example, frequency droop may be described as a modulation to instantaneous voltage V(t), rather than root-mean square voltage (V_RMS).

Figure 8:
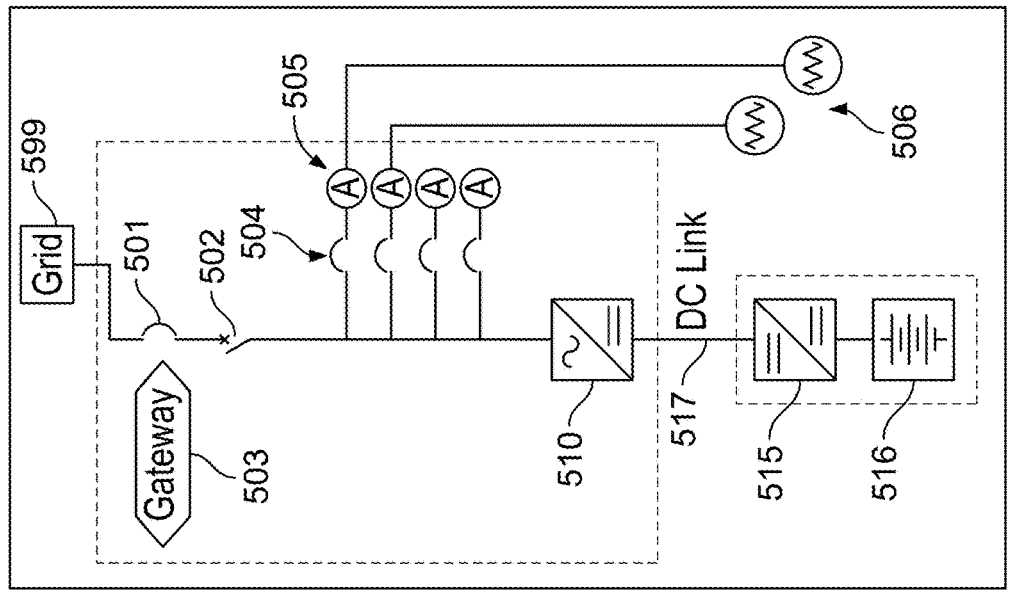
FIG. 8 shows an illustrative configuration including an integrated power conversion unit which allows for direct DC coupling with a battery, in accordance with some embodiments of the present disclosure.

FIG. 8 shows illustrative configuration 800 including power conversion device 515 (e.g., a DC-DC converter, as illustrated) which allows for direct DC coupling with battery system 516 (i.e., an energy storage device), in accordance with some embodiments of the present disclosure. The output of battery system 516 may vary within an allowable range of DC link 517 (e.g., a DC bus). In some embodiments, the output level of battery system 516 is controllable from the integrated power conversion unit modulating the DC link voltage (e.g., an AC-DC converter).

Figure 9:
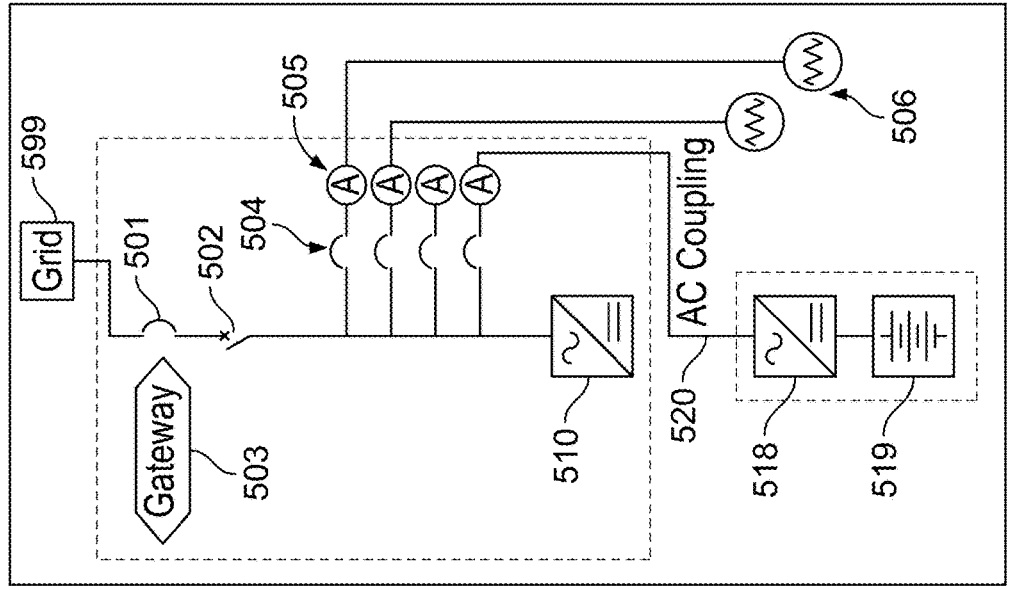
FIG. 9 shows a block diagram of an illustrative configuration including a bi-directional battery inverter coupled to an AC circuit breaker, in accordance with some embodiments of the present disclosure.

FIG. 9 shows a block diagram of illustrative configuration 900 including bi-directional battery inverter 518 coupled via AC link 520 to an AC circuit breaker (of controllable circuit breakers 504), in accordance with some embodiments of the present disclosure. In some embodiments, the charge/discharge levels of battery system 519 may be controlled either using direct communication with battery inverter 518 or through voltage-based or frequency-based control.

Figure 10:
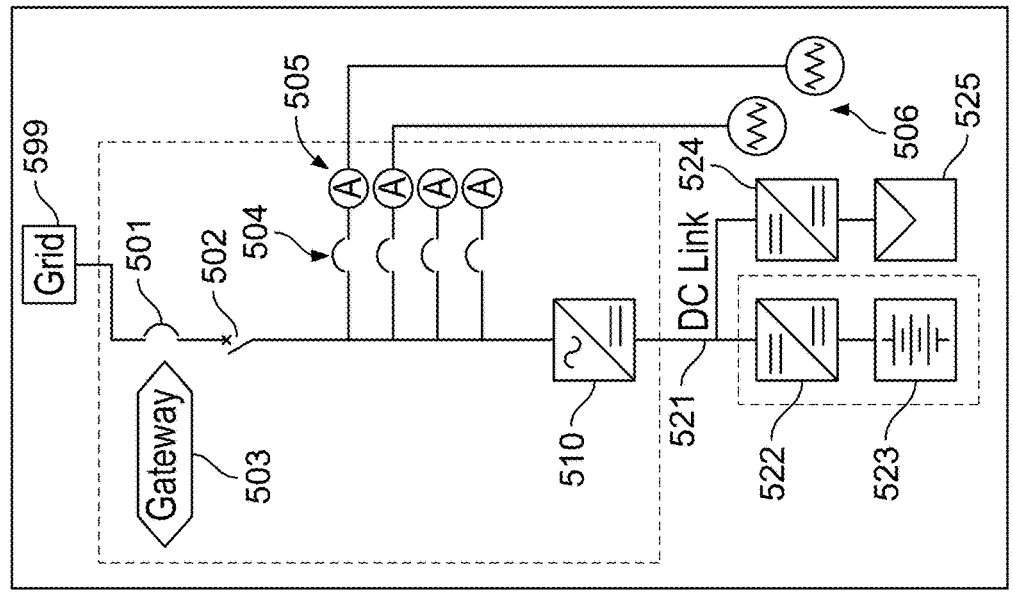
FIG. 10 shows a block diagram of an illustrative configuration including an integrated power conversion unit which can interconnect both a solar photovoltaic (PV) system and a battery system on the DC bus/link, in some embodiments of the present disclosure.

FIG. 10 shows a block diagram of illustrative configuration 1000 including integrated power conversion device 510 which can interconnect both a solar photovoltaic (PV) system (e.g., solar system 525) using maximum-power point tracking (MPPT) and a battery system (e.g., battery system 523) via DC link 521. In some embodiments, integrated power conversion device 510 effectively serves as a hybrid inverter embedded within the panel. Illustrative configuration 1000 of FIG. 10 may offer significant advantages in terms of direct DC charging of the battery from PV generation. In some embodiments, the illustrative configuration of FIG. 10 allows for minimizing, or otherwise reducing, the number of redundant components across power conversion, metering, and gateway/controls. In some embodiments, both the PV and battery input/output levels may be modified using voltage-based controls on the DC bus. The DC/DC converter may be provided by PV or battery vendor but may also be provided as part of the system (e.g., integrated into the system). In some embodiments, as illustrated, battery system 523 is coupled to DC-DC converter 522 and solar system 525 is coupled to DC-DC converter 524, and thus both are coupled to DC link 521, albeit operating at potentially different voltages.

Figure 11:
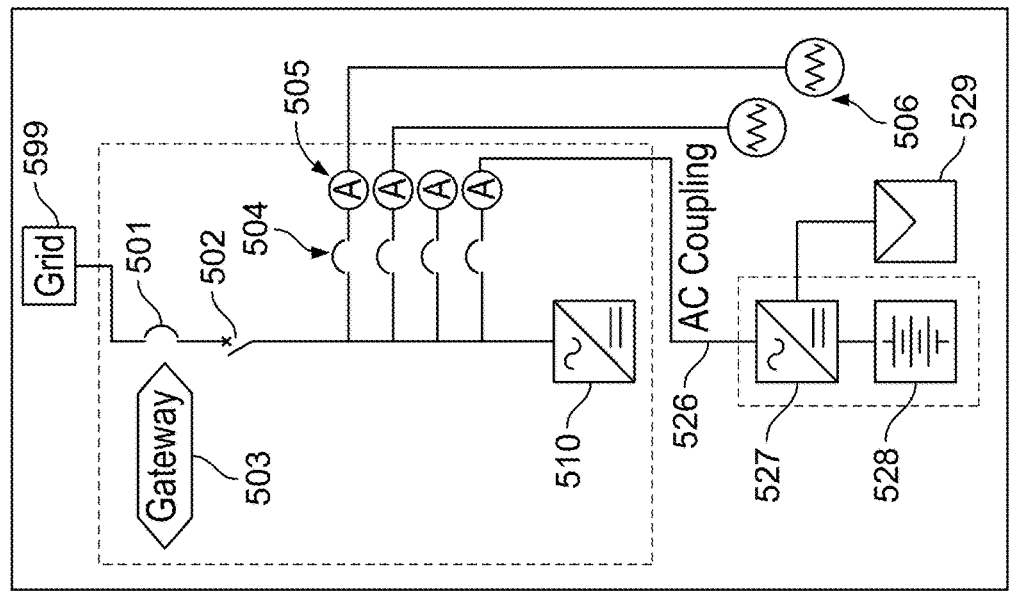
FIG. 11 shows a block diagram of an illustrative configuration including an external hybrid inverter connected to AC circuit breakers in the panel, wherein both the solar PV and battery systems operate through the external hybrid inverter, in accordance with some embodiments of the present disclosure.

FIG. 11 shows a block diagram of illustrative configuration 1100 including external hybrid inverter 527 coupled via AC link 526 to one or more of controllable circuit breakers 504 in the panel, wherein both solar system 529 and battery system 528 operate through external hybrid inverter 527, in accordance with some embodiments of the present disclosure. In some embodiments, the PV output and battery charge/discharge levels may be controlled either using direct communication with hybrid inverter 527 or through voltage-based control (e.g., using gateway 503). In some embodiments, the system is configured to accommodate installation of an autotransformer. For example, the autotransformer may support a 240V hybrid inverter when the system includes a split phase 120V/240V set of loads. In some embodiments, the system is configured with hardware and/or software devices designed to protect loads from autotransformer failures, and/or protect an autotransformer from excessive loads. In some embodiments the system is configured with hardware and/or software devices designed to disconnect an inverter from the system in the event of a fault in order to protect an autotransformer and/or to protect loads. In some embodiments, the autotransformer may be controlled by, for example, controllable circuit breakers or control relays. In some embodiments hardware and/or software designed for system protection may use controllable circuit breakers or control relays to disconnect the autotransformer and or inverter from the system.

Figure 12:
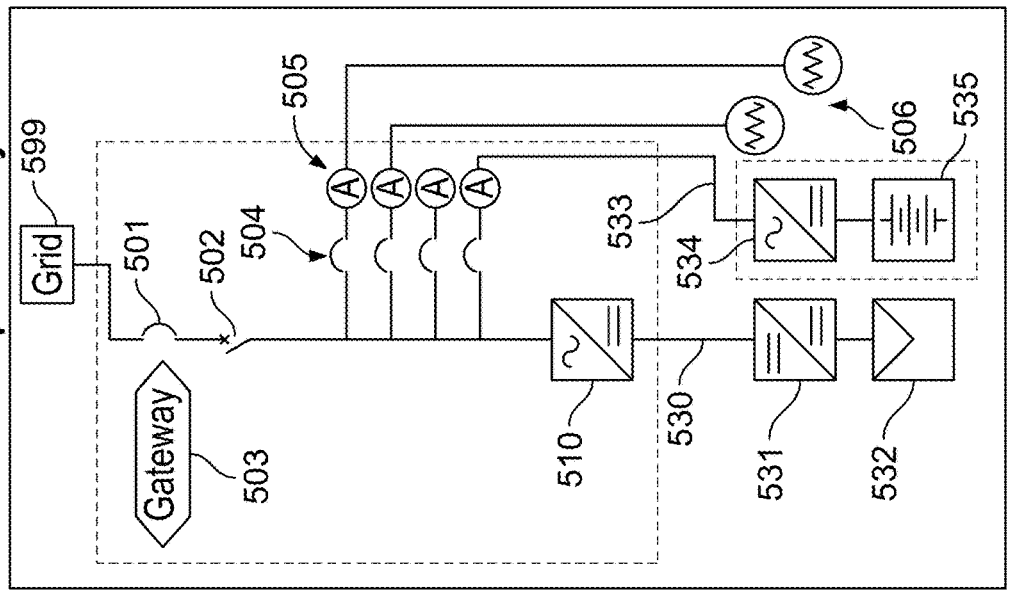
FIG. 12 shows a block diagram of an illustrative configuration including an integrated power conversion unit connected to the solar PV system DC, in accordance with some embodiments of the present disclosure.

FIG. 12 shows a block diagram of illustrative configuration 1200 including integrated power conversion device 510 connected to solar PV system 532 via DC link 530 and DC-DC converter 531, in accordance with some embodiments of the present disclosure. The system also includes one or more of controllable circuit breakers 504 in the panel coupled via AC link 533 to external bi-directional inverter 534, which is connected to battery system 535. Illustrative configuration 1200 of FIG. 12 may be configured to support various battery designs that are deployed with built-in bi-directional inverter 534. In some embodiments, the configuration allows for relatively easy augmentation of battery capacity on the direct DC bus (e.g., coupled to bi-directional inverter 534).

Figure 13:
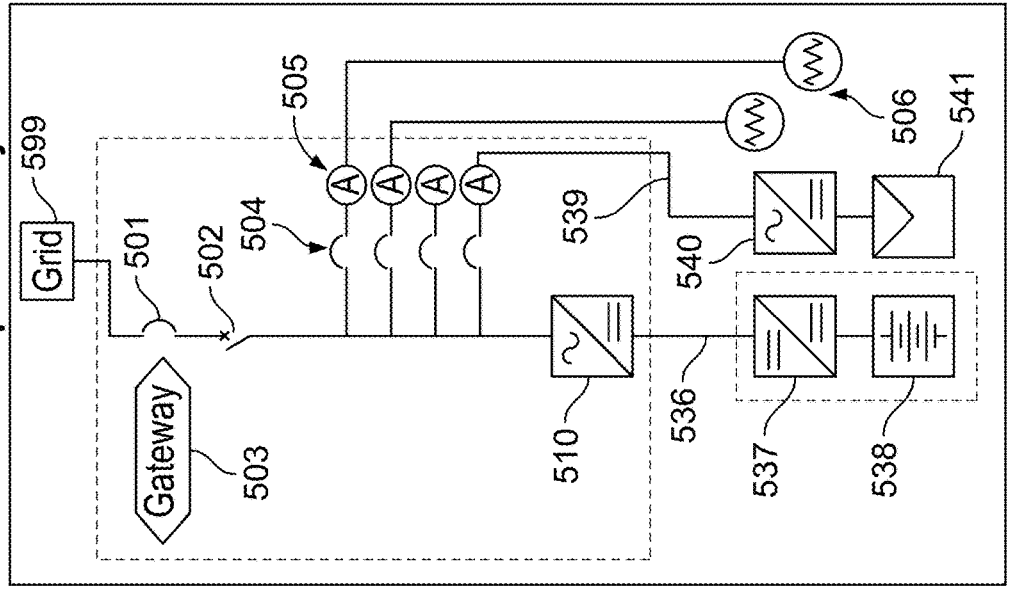
FIG. 13 shows a block diagram of an illustrative configuration including an integrated power conversion unit coupled to the battery system DC, and AC circuit breakers in the panel connected to a PV system operating through an external inverter, in accordance with some embodiments of the present disclosure.

FIG. 13 shows a block diagram of illustrative configuration 1300 including integrated power conversion device 510 coupled to battery system 538 via DC-DC converter 537, and one or more of controllable circuit breakers 504 in the panel coupled via AC link 539 to solar PV system 541 operating through external inverter 540, in accordance with some embodiments of the present disclosure. In some embodiments, illustrative configuration 1300 of FIG. 13 is configured to support installation where solar is already deployed. For example, it may allow for relatively easy augmentation of battery and PV capacity on the direct DC bus (e.g., DC link 536).

Figure 14:
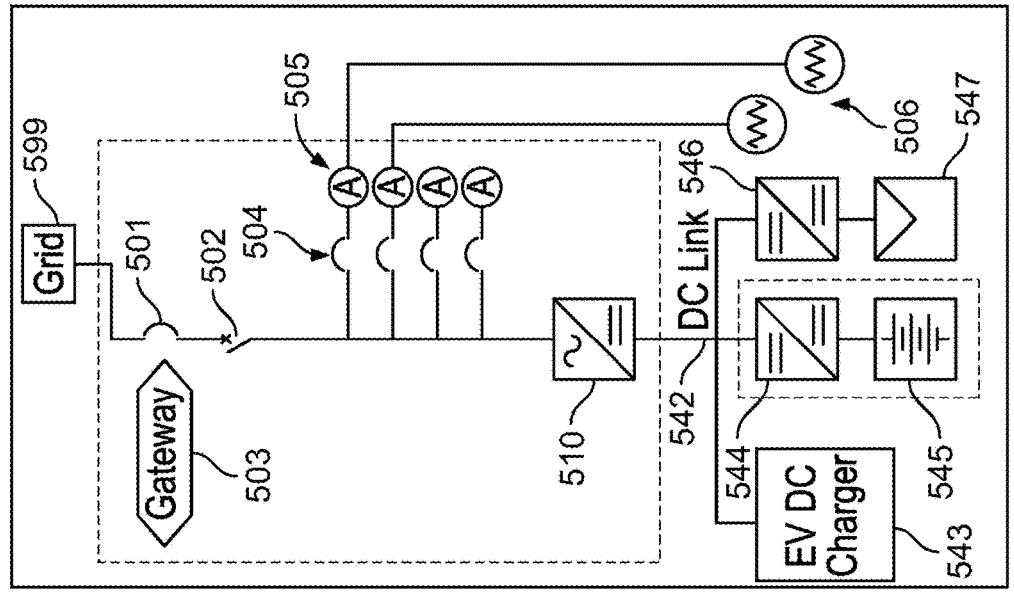
FIG. 14 shows a block diagram of an illustrative configuration including a panel having a DC link and an integrated power conversion unit connected to the solar PV, battery systems, and an electric vehicle with on-board DC charging conversion, in accordance with some embodiments of the present disclosure.

FIG. 14 shows a block diagram of illustrative configuration 1400 including a panel having DC link 542 and integrated power conversion device 510 connected to solar PV system 547 via DC-DC converter 546, battery system 545 coupled via DC-DC converter 544, and electric vehicle with on-board DC charging conversion system 543, in accordance with some embodiments of the present disclosure. In some embodiments, each of the systems coupled to DC link 542 may be individually monitored and controlled using direct communication or voltage-based controls, for example (e.g., from gateway 503).

Figure 15:
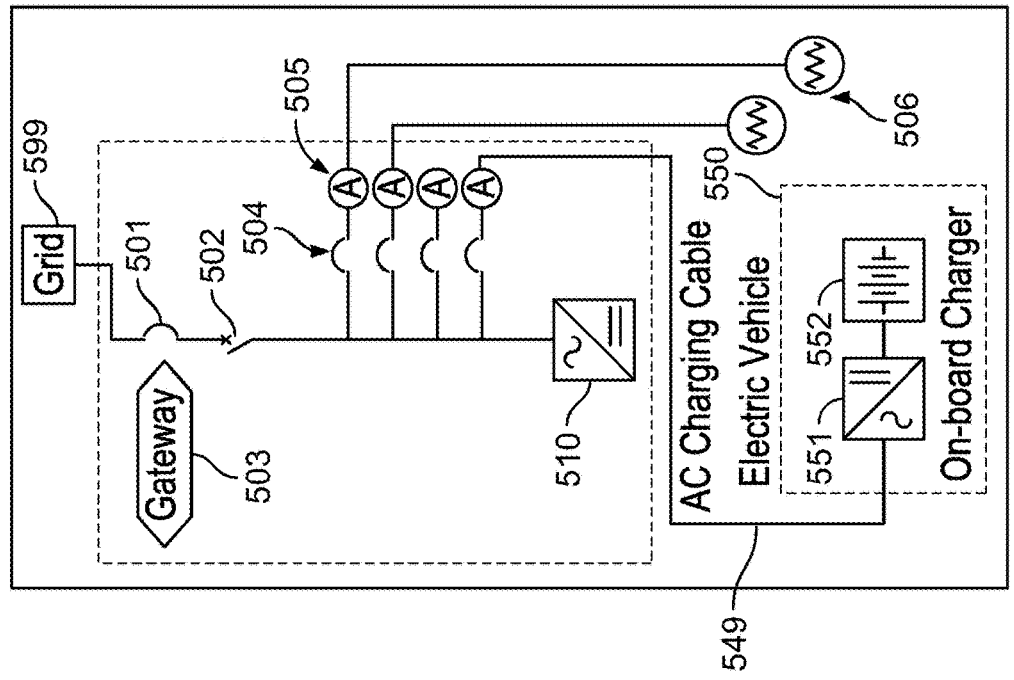
FIG. 15 shows a block diagram of an illustrative configuration including an AC breaker connected to an electric vehicle with an on-board charger, in accordance with some embodiments of the present disclosure.

FIG. 15 shows a block diagram of illustrative configuration 1500 including one or more of controllable circuit breakers 504 coupled via AC link 549 to electric vehicle 550 with on-board charger 551 and onboard battery system 552, in accordance with some embodiments of the present disclosure. In some embodiments, the system may be configured to control charging/discharging of battery system 552 of electric vehicle 550 (e.g., depending on whether onboard charger 551 is bi-directional).

Figure 16:
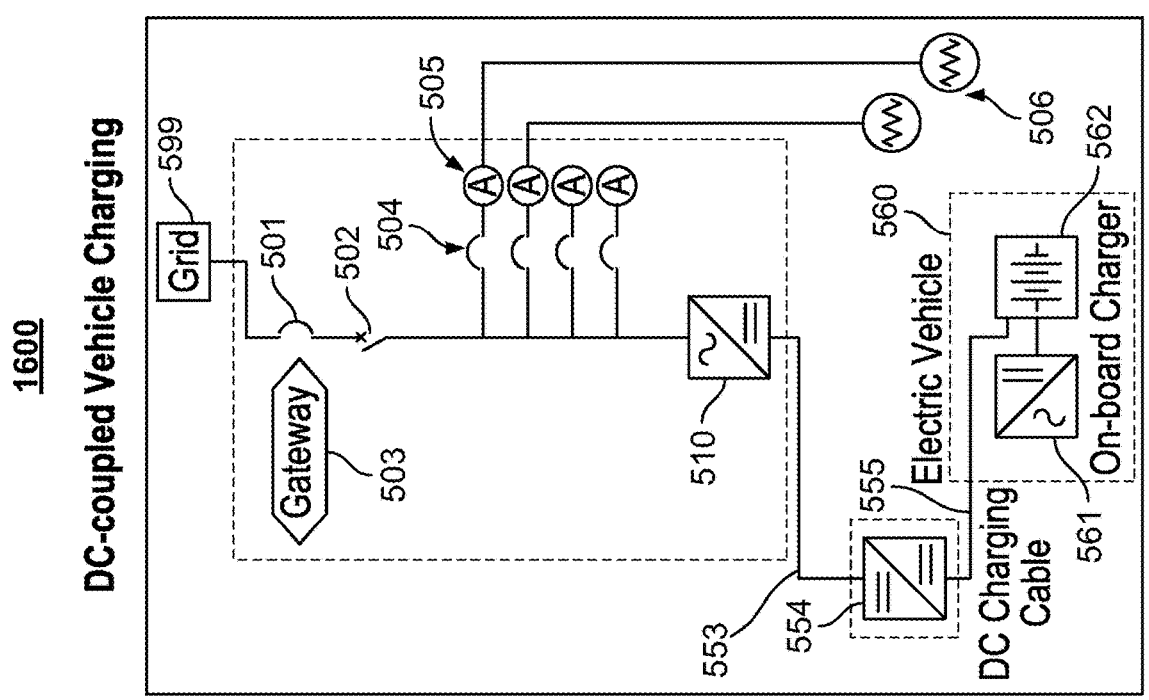
FIG. 16 shows a block diagram of an illustrative configuration including an EV DC-DC charger connected to an electric vehicle, in accordance with some embodiments of the present disclosure.

FIG. 16 shows a block diagram of illustrative configuration 1600 including power conversion device 510 coupled to EV DC-DC charger 554 via DC link 553, which is in turn coupled to electric vehicle 560 via DC link 555, in accordance with some embodiments of the present disclosure. For example, this may allow for circumvention of any on-board chargers (e.g., onboard charger 561) and faster, higher efficiency charging of battery system 562 of electric vehicle 560. In some embodiments, the charge/discharge levels of battery system 562 may be controlled either using direct communication with battery system 562 or through voltage-based control of DC-DC charger 554, for example. In some embodiments, the system includes an integrated DC-DC charger (e.g., integrated into power conversion device 510), configured to charge an electric vehicle directly (e.g., without an intermediate device).

Figure 17:
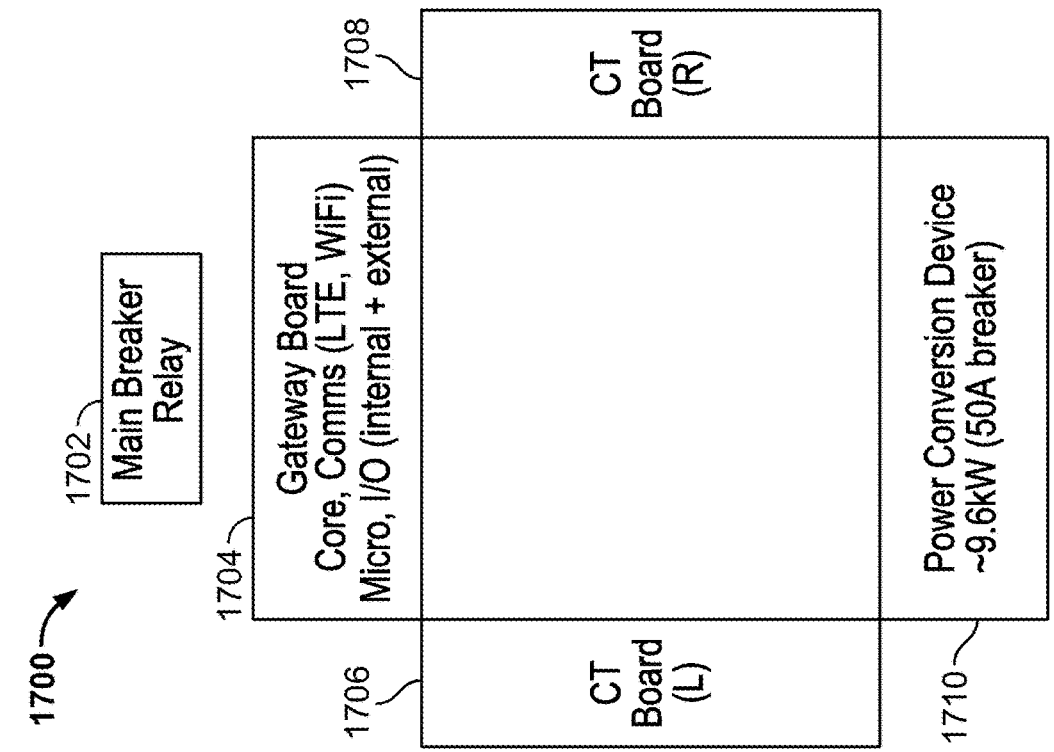
FIG. 17 shows an illustrative panel layout, in accordance with some embodiments of the present disclosure.

FIG. 17 shows illustrative panel layout 1700, in accordance with some embodiments of the present disclosure. For example, the panel includes main breaker relay 1702 (e.g., for grid-connection), gateway board 1704 (e.g., including processing equipment, communications equipment, memory, and input/output interface), two current transformer modules 1706 and 1708 (e.g., PCBs including solid-core current sensors), and power conversion device 1710 (e.g., an AC-DC converter).

FIG. 18 shows illustrative panel layout 1800, in accordance with some embodiments of the present disclosure. For example, the panel includes main breaker relay 1802 (e.g., for grid-connection), processing equipment 1804 (e.g., IoT module 1814, microcontroller unit 1824 (MCU), and input/output (I/O) interface 1834), two current transformers modules 1806 and 1808 (e.g., PCBs including solid-core current sensors), and power conversion device 1810 (e.g., an AC-DC converter). In an illustrative example, main breaker relay 1802 and power conversion device 1810 of FIG. 18 may be controllable using processing equipment 1804 (e.g., having a wired or wireless communications coupling).

FIG. 19 shows illustrative current sensing board 1900 (e.g., with current transformers), in accordance with some embodiments of the present disclosure. For example, as illustrated, current sensing board 1900 includes connectors 1902 1904 and 1906 for power and signal I/O, ports 1910 for coupling to controllers, LEDs 1908 or other indicators for indicating status, any other suitable components (not shown), or any combination thereof. For example, current sensing board 1900 may be included any illustrative panel or system described herein.

Figure 20:
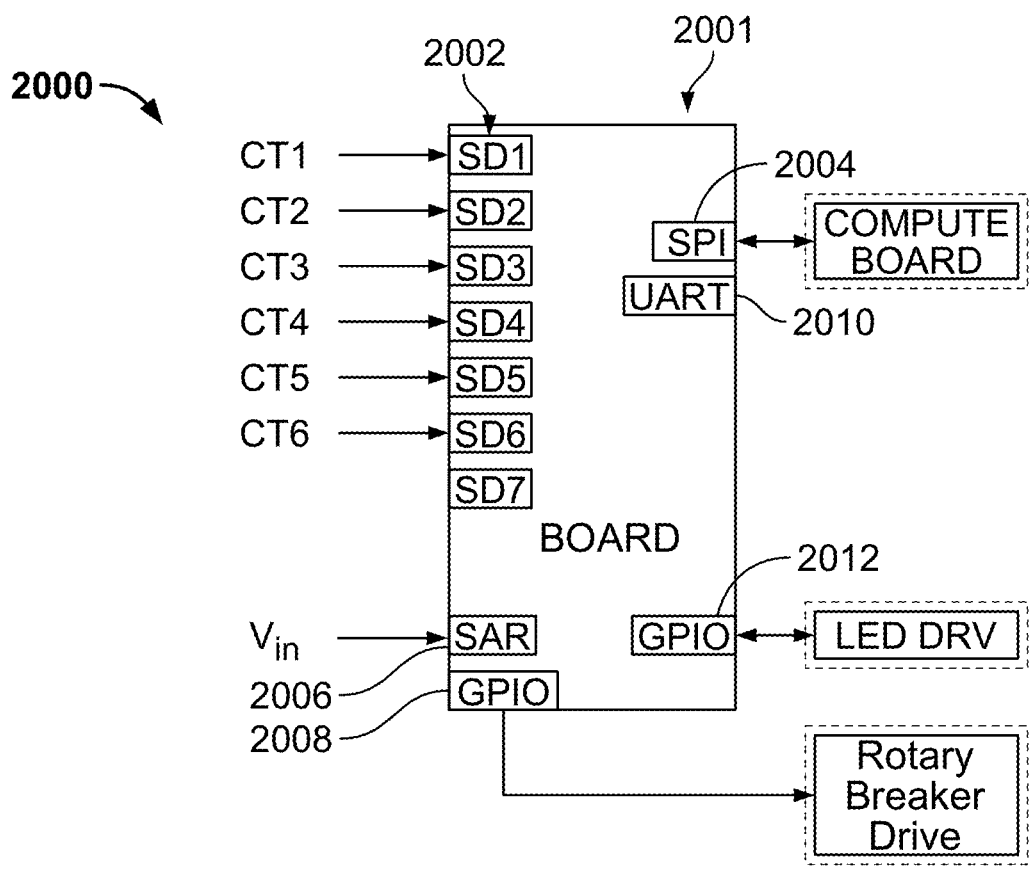
FIG. 20 shows an illustrative current sensing board arrangement, including processing equipment, in accordance with some embodiments of the present disclosure.

FIG. 20 shows illustrative current sensing board arrangement 2000, with current sensing board 2001 including processing equipment, in accordance with some embodiments of the present disclosure. For example, as illustrated, current sensing board 2001 is configured to receive signals from six current transformers at terminals 2002. In some embodiments, current sensing board 2001, as illustrated, includes general purpose input/output (GPIO) terminals 2008 and 2012 configured to transmit, receive, or both, signals from one or more other devices (e.g., a rotary breaker drive, LED drive, and/or other suitable devices). In some embodiments, current sensing board 2001, as illustrated, includes serial peripheral interface (SPI) terminals 2004, universal asynchronous receiver/transmitter terminals 2010, SAR terminals 2006, any other suitable terminals, or any combination thereof.

Figure 21:
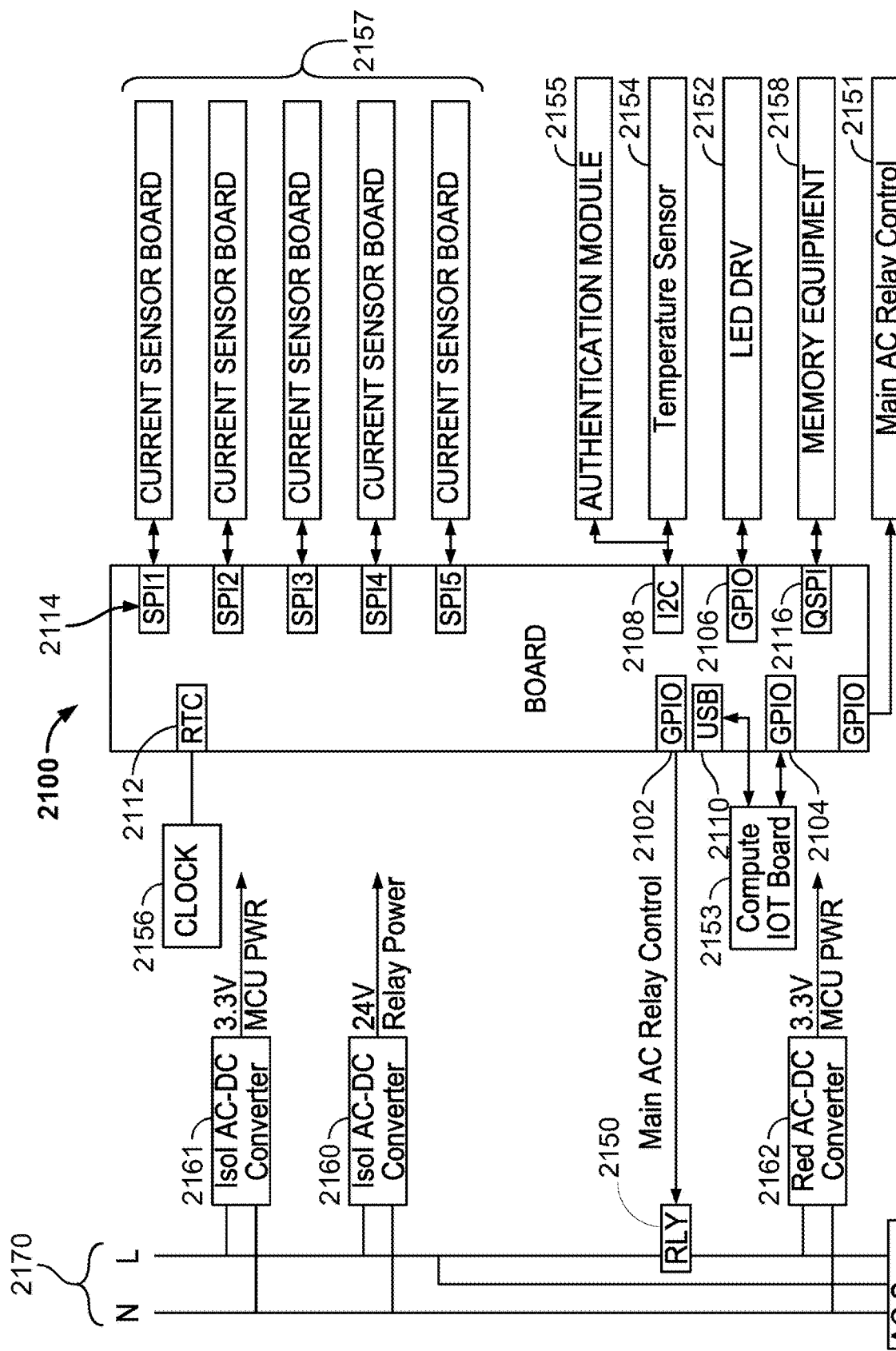
FIG. 21 shows an illustrative power distribution and control board, in accordance with some embodiments of the present disclosure.

FIG. 21 shows an illustrative arrangement including board 2100 (e.g., for power distribution and control), in accordance with some embodiments of the present disclosure. For example, illustrative board 2100 includes GPIO terminals 2102, 2104, and 2106 (e.g., coupled to main AC breaker relay 2150, main AC breaker control module 2151, LED drive 2152, and IoT module 2153), serial inter-integrated circuit (I2C) communications terminals 2108 (e.g., I2C protocol for communicating with temperature sensor 2154 and authentication module 2155), a universal serial bus (USB) communications terminals 2110 (e.g., for communicating with an IoT module 2153), a real-time clock (RTC) 2112 coupled to clock 2156 (e.g., a 32 kHz clock), several serial peripheral interface (SPI) communications terminals 2114 (e.g., for communicating with current sensor boards 2157, any other suitable sensors, or any other suitable devices), and quad-SPI (QSPI) communications terminals 2116 (e.g., for communicating with memory equipment 2158). Board 2100, as illustrated, is configured to manage/monitor main AC relay 2150 and accompanying electrical circuitry that may be coupled to AC-DC converters 2160, 2161, and 2162, AC busbars 2170, or any other suitable devices/components of the system.

Figure 22:
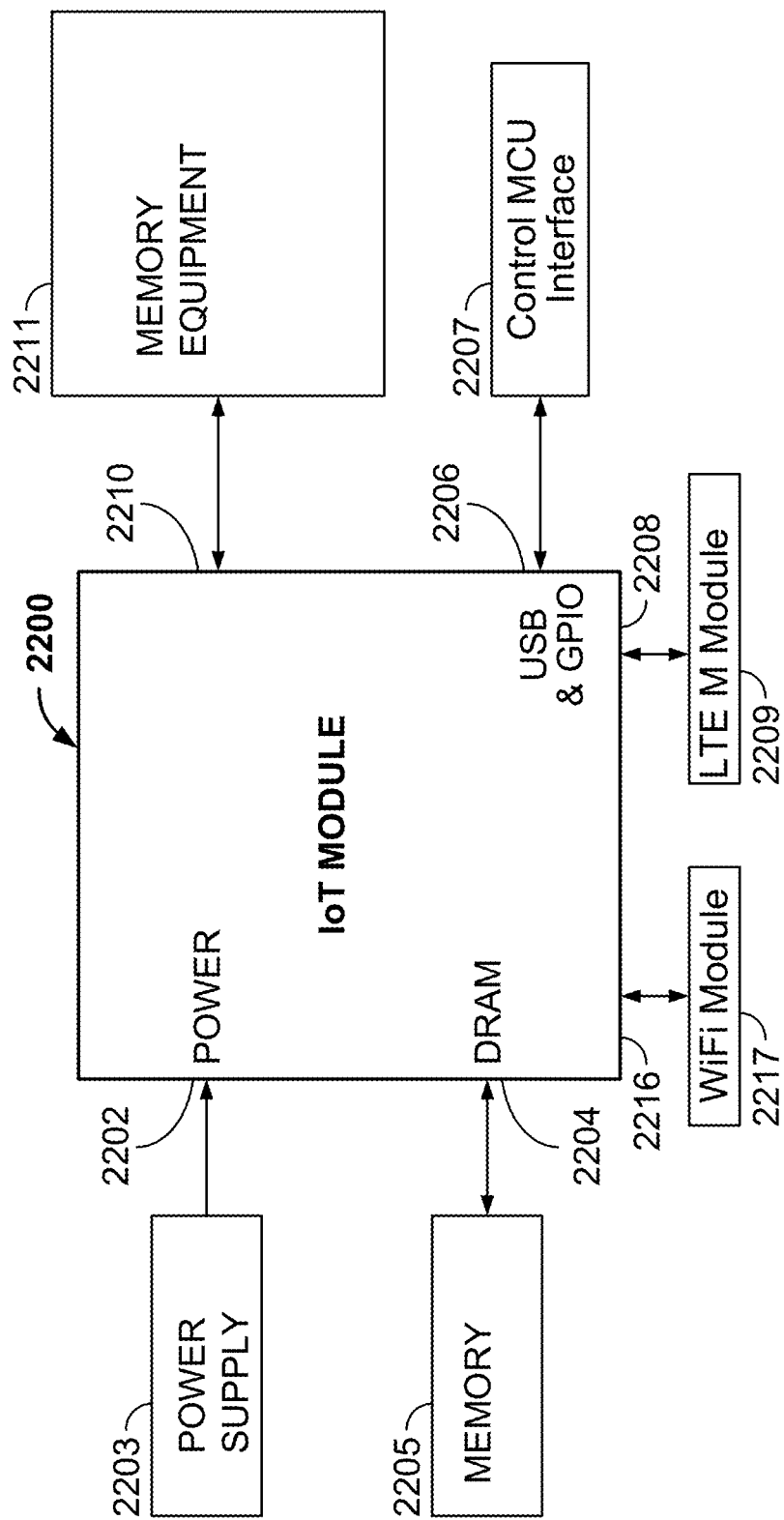
FIG. 22 shows an illustrative IoT module, in accordance with some embodiments of the present disclosure.

FIG. 22 shows an illustrative IoT module 2200, in accordance with some embodiments of the present disclosure. Illustrate IoT module 2200 includes power interface 2202 (e.g., to receive electrical power from power supply 2203), memory interface 2204 (e.g., to store and recall information/data from memory 2205), communications interfaces 2216 and 2208 (e.g., to communicate with a WiFi module 2217 or LTE module 2209), USB interface 2206 (e.g., to communicate with control MCU 2207), GPIO interface 2208 (e.g., to communicate with control MCU 2207), and QSPI interface 2210 (e.g., to communicate with memory equipment 2211 or other devices).

FIG. 23 shows table 2300 of illustrative use cases, in accordance with some embodiments of the present disclosure. For example, table 2300 includes self-generation cases (e.g., with self-consumption, import/export), islanding cases (e.g., with and without solar, battery, and EV), and a next export case (e.g., including solar, battery and EV, with net export). In some embodiments, the panels and systems described herein may be configured to achieve the illustrative use cases of table 2300.

In some embodiments, the system is configured to implement a platform configured to communicate with HMI devices (e.g., Echo™, Home™, etc.). In some embodiments, the system may be configured to serve as a gateway for controlling smart appliances enabled with compatible wired/wireless receivers. For example, a user may provide a command to an HMI device or to an application, which then sends a direct control signal (e.g., a digital state signal) to a washer/dryer (e.g., over PLC, WiFi or Bluetooth).

In some embodiments, the platform is configured to act as an OS layer, connected to internal and external sensors, actuators, both. For example, the platform may allow for third party application developers to build features onto or included in the platform. In a further example, the platform may provide high-resolution, branch level meter data for which a disaggregation service provider may build an application on the platform. In a further example, the platform may be configured to control individual breakers, and accordingly a demand-response vendor may build an application on the platform that enables customers to opt-in to programs (e.g., energy-use programs). In a further example, the platform may provide metering information to a solar installer who may provide an application that showcases energy generation & consumption to the consumer. The platform may receive, retrieve, store, generate, or otherwise manage any suitable data or information in connection with the system. In some embodiments, for example, the platform may include a software development kit (SDK), which may include an applications programming interface (API), and other aspects developers may use to generate applications. For example, the platform may provide libraries, functions, objects, classes, communications protocols, any other suitable tools, or any combination thereof.

In some embodiments, the systems disclosed herein are configured to serve as a gateway and platform for an increasing number of connected devices (e.g., appliances) in a home or business. In some embodiments, rather than supporting only a handful of 'smart' appliances in a home (e.g., sometimes with redundant gateways, cloud-based platforms, and applications), the systems disclosed herein may interface to many such devices. For example, each powered device in a home may interface with the electrical panel of the present disclosure, through an application specific integrated circuit (ASIC) that is purpose-built and installed with or within the appliance. The ASIC may be configured for communication and control from the panel of the present disclosure.

In some embodiments, the system provides an open-access platform for any appliance to become a system-connected device. For example, the panel may be configured to serve as a monitoring and control hub. By including integration with emerging HMI (human-machine interface) solutions and communication pathways, the system is configured to participate in the growing IoT ecosystem.

Figure 24:
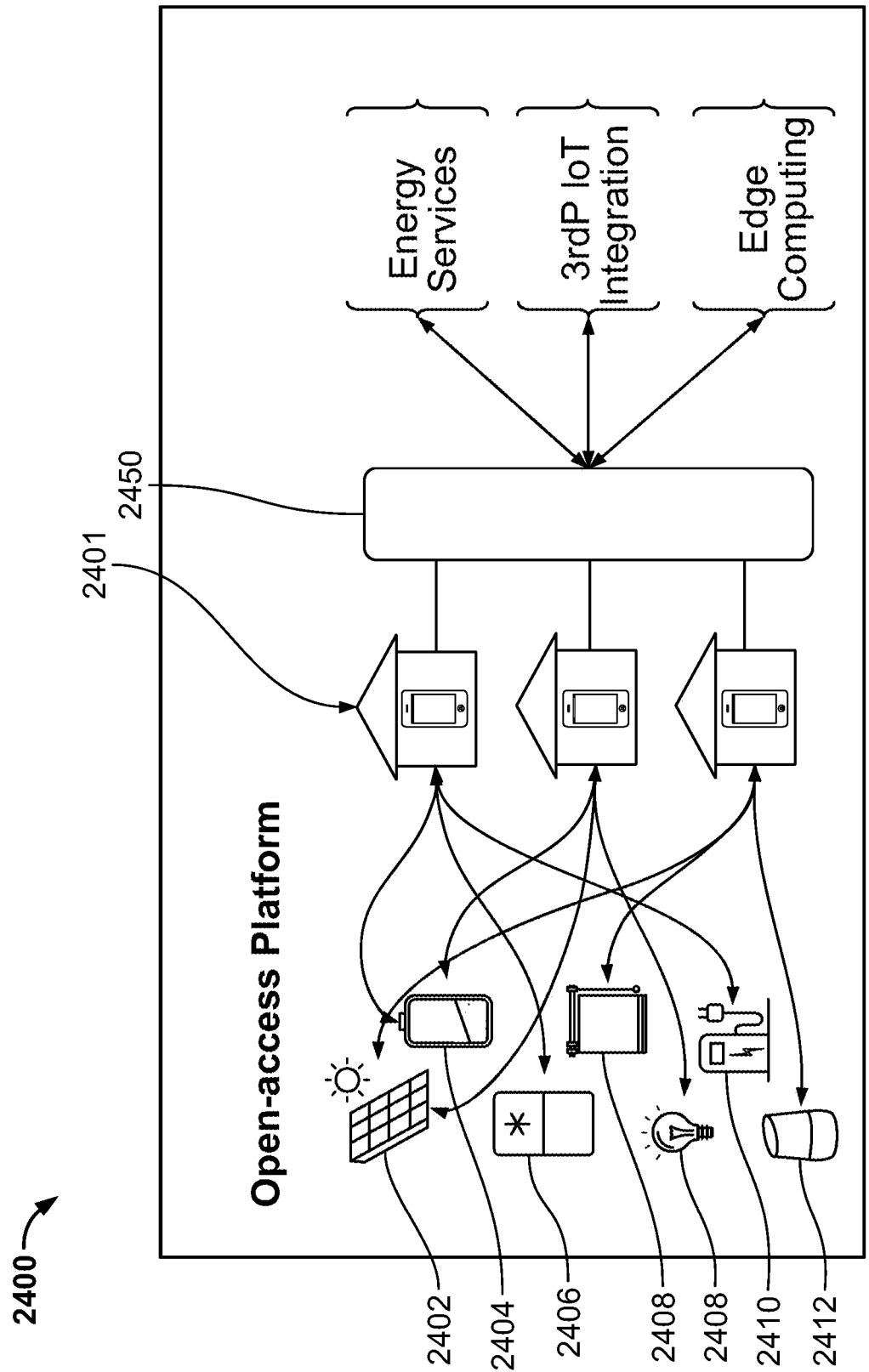
FIG. 24 shows an IoT arrangement, in accordance with some embodiments of the present disclosure.

FIG. 24 shows illustrative IoT arrangement 2400, in accordance with some embodiments of the present disclosure. The systems disclosed herein may be installed in many locations (e.g., indicated by houses 2401 in FIG. 24), each including a respective main panel, solar panel system 2402, battery system 2404, set of appliances 2406 (e.g., smart appliances or otherwise), other loads 2408 (e.g., lighting, outlets, user devices), electric vehicle charging station 2410, one or more HMI devices 2412, any other suitable devices, or any combination thereof. The systems may communicate with one another, communicate with a central processing server (e.g., platform 2450), communicate with any other suitable network entities, or any combination thereof. For example, network entities providing energy services, third-party IoT integration, and edge computing may communicate with, or otherwise use data from, one or more systems.

In some embodiments, the system may be configured to communicate with low-cost integrated circuits, ASIC (application specific integrated circuits), PCBs with ASICs mounted onboard, or a combination thereof that may be open-sourced or based on reference designs, and adopted by appliance manufacturers to readily enable communication and controls with the systems disclosed herein. For example, the system (e.g., a smart panel) may be configured to send/receive messages and control states of appliances to/from any device that includes an IoT module. In an illustrative example, an oven can become a smart appliance (e.g., a system-connected device) by embedding an IoT module. Accordingly, when a customer using a smart panel inputs a command (e.g., using an application hosted by the system) to set the oven to 350 degrees, the system may communicate with the module-enabled oven, transmitting the command. In a further example, the system may be configured to communicate with low-cost DC/DC devices, ASICs, or both that can be embedded into solar modules, battery systems, or EVs (e.g., by manufacturers or aftermarket) that allow control of such devices (e.g., through DC bus voltage modulation/droop curve control).

Figure 25:
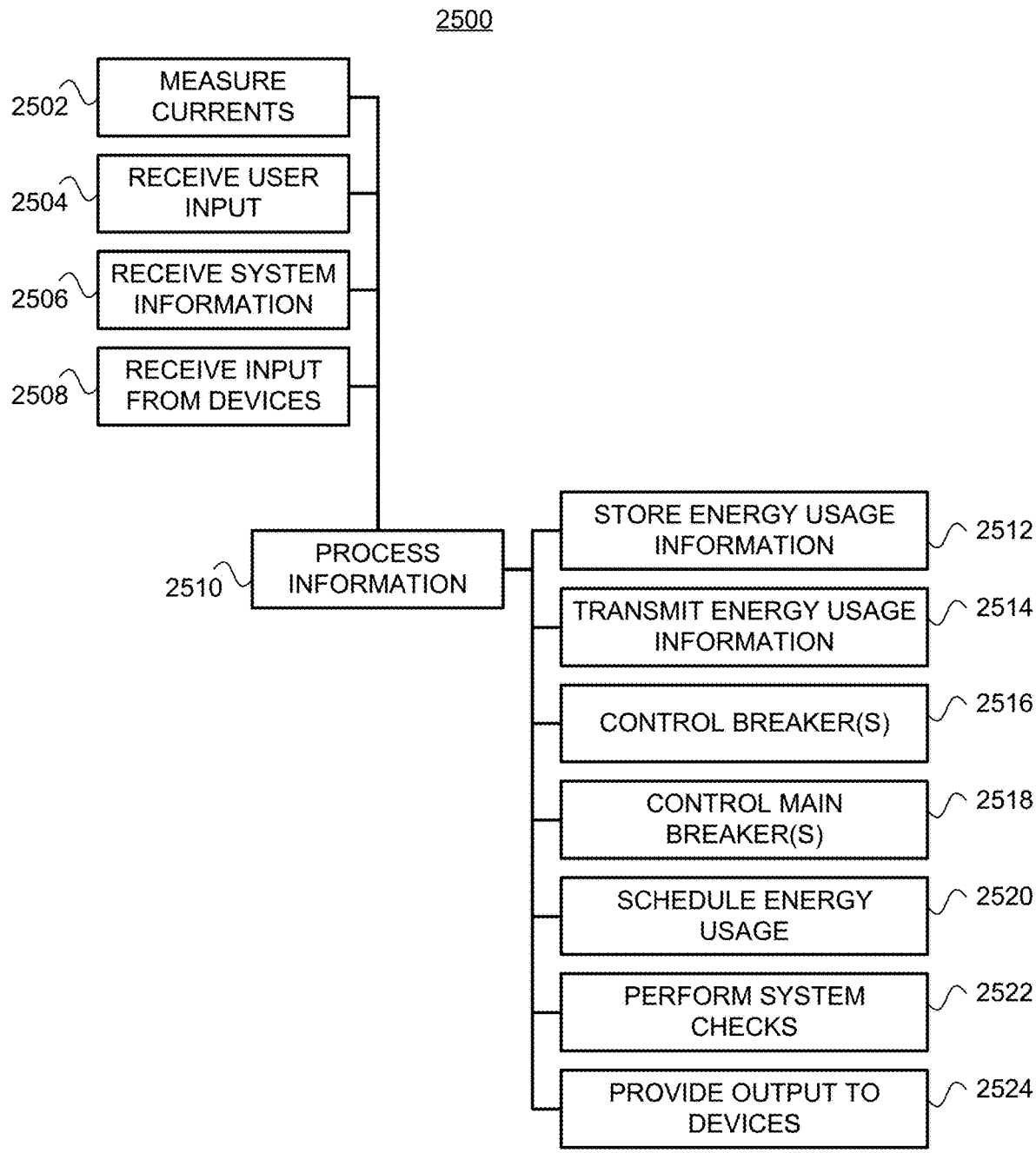
FIG. 25 shows a flowchart of illustrative processes that may be performed by the system, in accordance with some embodiments of the present disclosure.

FIG. 25 shows a flowchart of illustrative processes 2500 that may be performed by the system. For example, processes 2500 may be performed by any suitable processing equipment/control circuitry described herein.

In some embodiments, at step 2502, the system is configured to measure one or more currents associated with the electrical infrastructure or devices. For example, the system may include one or more current sensor boards configured to measure currents.

In some embodiments, at step 2504, the system is configured to receive user input (e.g., from a user device or directly to a user input interface). For example, the system may include a communications interface and may receive a network-based communication from a user's mobile device. In a further example, the system may include a touchscreen and may receive haptic input from a user.

In some embodiments, at step 2506. the system is configured to receive system information. For example, the system may receive usage metrics (e.g., peak power targets, or desired usage schedules). In a further example, the system may receive system updates, driver, or other software. In a further example, the system may receive information about one or more devices (e.g., usage information, current or voltage thresholds, communications protocols that are supported). In some embodiments, the system is configured to update firmware on connected or otherwise communicatively coupled devices (e.g., the inverter, battery, downstream appliances, or other suitable devices).

In some embodiments, at step 2508, the system is configured to receive input from one or more devices. For example, the system may include an I/O interface and be configured to receive power line communications (PLC) from one or more devices. For example, an appliance may include one or more digital electrical terminals configured to provide electricals signals to the system to transmit state information, usage information, or provide commands. Device may include solar systems, EV charging systems, battery systems, appliances, user devices, any other suitable devices, or any combination thereof.

In some embodiments, at step 2510, the system is configured to process information and data that it has received, gathered, or otherwise stores in memory equipment. For example, the system may be configured to determine energy metrics such as peak power consumption/generation, peak current, total power consumption/generation, frequency of use/idle, duration of use/idle, any other suitable metrics, or any combination thereof. In a further example, the system may be configured to determine an energy usage schedule, disaggregate energy loads, determine a desired energy usage schedule, perform any other suitable function, or any combination thereof. In a further example, the system may be configured to compare usage information (e.g., current) with reference information (e.g., peak desired current) to determine an action (e.g., turn off breaker).

In some embodiments, at step 2512, the system is configured to store energy usage information in memory equipment. For example, the system may store and track energy usage over time. In a further example, the system may store information related to fault events (e.g., tripping a breaker or a main relay).

In some embodiments, at step 2514, the system is configured to transmit energy usage information to one or more network entities, user devices, or other entities. For example, the system may transmit usage information to a central database. In a further example, the system may transmit energy usage information to an energy service provider.

In some embodiments, at step 2516, the system is configured to control one or more controllable breakers, relays, or a combination thereof. For example, the breakers, relays, or both may be coupled to one or more busbars, and may include a terminal to trip and reset the breaker that is coupled to processing equipment. Accordingly, the processing equipment may be configured to turn breakers, relays or both "on" or "off" depending on a desired usage (e.g., a time schedule for usage of a particular electrical circuit), a safety state (e.g., an overcurrent, near overcurrent, or inconsistent load profile), or any other suitable schedule.

In some embodiments, at step 2518, the system is configured to control one or more controllable main breakers. For example, the main breaker may be coupled to an AC grid or meter and may include a terminal to trip and reset the breaker that is coupled to processing equipment. The processing equipment may turn the breaker on or off depending on safety information, user input, or other information.

In some embodiments, at step 2520, the system is configured to schedule energy usage. For example, the system may determine a desired energy usage schedule based on the actual usage data and other suitable information. In a further example, the system may use controllable breakers, IoT connectivity, and PoL connectivity to schedule usage.

In some embodiments, at step 2522, the system is configured to perform system checks. For example, the system may be configured to test breakers, check current sensors, check communications lines (e.g., using a lifeline or ping signal), or perform any other function indicating a status of the system.

In some embodiments, at step 2524, the system is configured to provide output to one or more devices. For example, the system may be configured to provide output to an appliance (e.g., via PLC, WiFi, or Bluetooth), a DC-DC converter or DC-AC inverter (e.g., via serial communication, ethernet communication, WiFi, Bluetooth), a user device (e.g., a user's mobile smart phone), an electric vehicle charger or control system thereof, a solar panel array or control system thereof, a battery system or control system thereof.

In an illustrative example of processes 2500, the system may manage electrical loads by sensing currents, determining operating parameters, and controlling one or more breakers. The system (e.g., control circuitry thereof, using one or more current sensing modules thereof) may sense a plurality of currents. Each current of the plurality of currents may correspond to a respective controllable breaker. The system determines one or more operating parameters and controls each respective controllable breaker based on the current correspond to the respective controllable breaker and based on the one or more operating parameters.

In an illustrative example of processes 2500, the one or more operating parameters may include a plurality of current limits each corresponding to a respective current of the plurality of currents. If the respective current is greater than the corresponding current limit, the system may control the respective controllable breaker by opening the respective controllable breaker.

In an illustrative example of processes 2500, the one or more operating parameters may include a load profile including a schedule for limiting a total electrical load. The system may control each respective controllable breaker further based on the load profile.

In an illustrative example of processes 2500, the one or more operating parameters may include temporal information. The system may control each respective controllable breaker further based on the temporal information. For example, the temporal information may include an on-off time schedule for each breaker (e.g., which may be based on the measured load in that branch circuit), duration information (e.g., how long a branch circuit will be left on), any other suitable temporal information, an estimated time remaining (e.g., during operation on battery power, or until a pre-scheduled disconnect), or any combination thereof.

In an illustrative example of processes 2500, the system may (e.g., at step 2510) detect a fault condition and determine the one or more operating parameters based on the fault condition. For example, the system may determine a faulted current (e.g., based on measured currents from step 2502), receive a fault indicator (e.g., from user input at step 2504), receive a fault indicator from a network entity (e.g., from system information at step 2506), receive a fault indicator from another device (e.g., from step 2508), determine a faulted condition in any other suitable manner, or any combination thereof.

FIGS. 26-30 show illustrative views and components of electrical panel 2600, in accordance with some embodiments of the present disclosure. For example, panel 2600 is an illustrative example of system 100 of FIG. 1, which may be used to implement any of the illustrative configurations shown in FIGS. 5-16.

Figure 27:
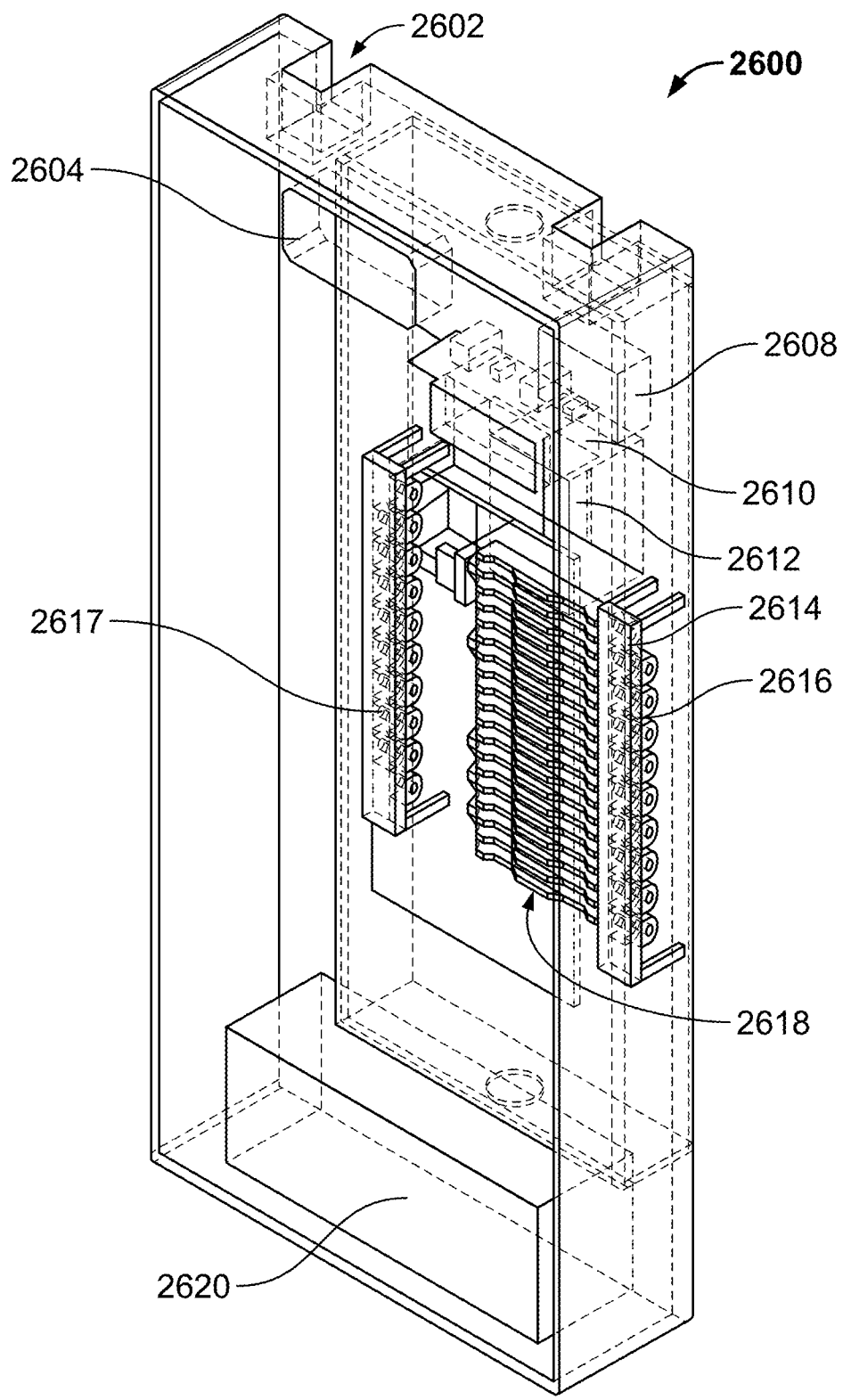
FIG. 27 shows a perspective view of an illustrative panel, in accordance with some embodiments of the present disclosure.
Figure 28:
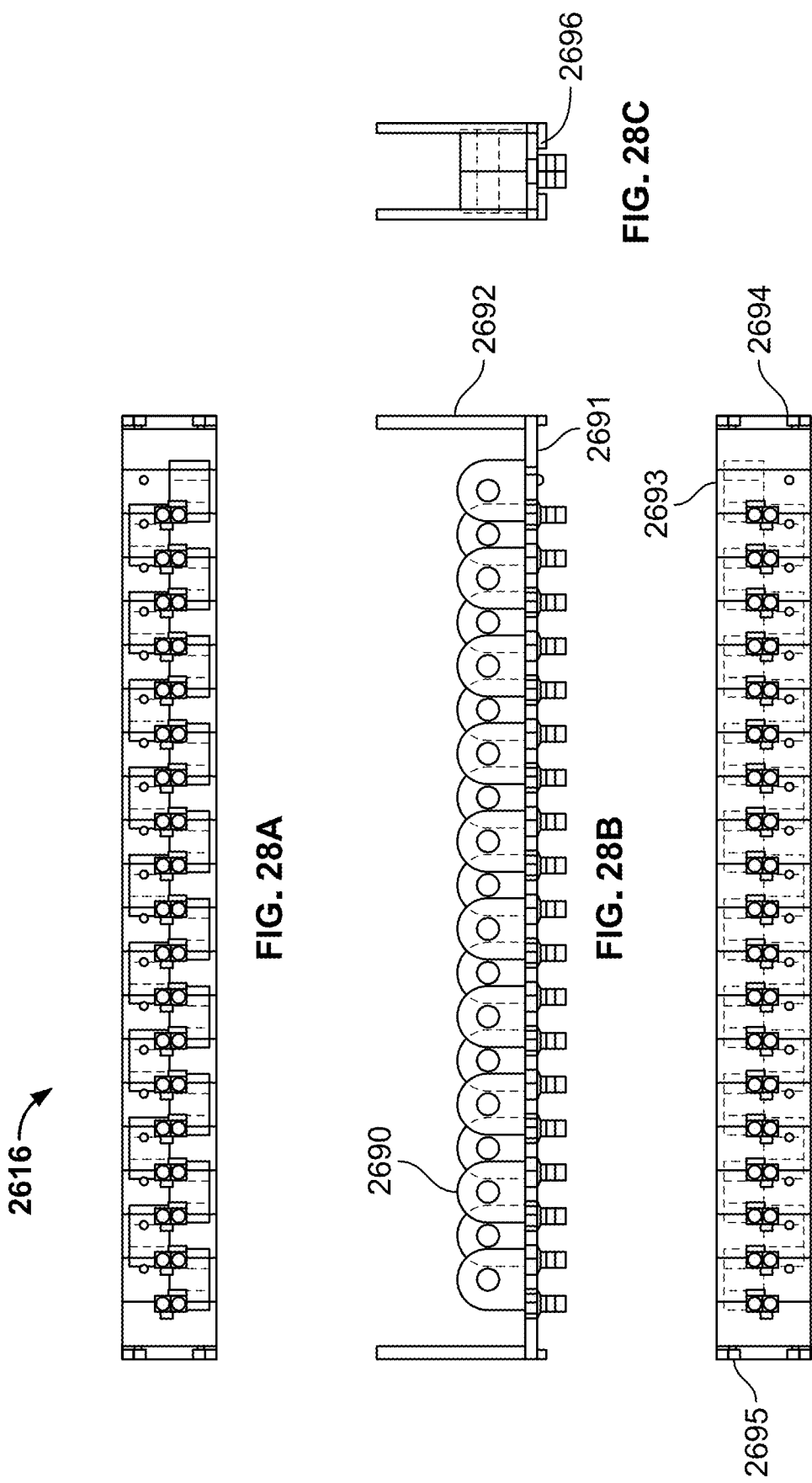
FIGS. 28A-28D show several views of a current transformer board, in accordance with some embodiments of the present disclosure.

FIG. 26 shows bottom, side, and front views of illustrative panel 2600, in accordance with some embodiments of the present disclosure. FIG. 27 shows a perspective view of illustrative panel 2600, in accordance with some embodiments of the present disclosure. Panel 2600, as illustrated, includes:

antennae enclosure 2602 (e.g., configured for housing an antennae for receiving/transmitting communications signals);

gateway 2604 (e.g., control circuitry);

dead-front 2606 (e.g., to provide a recognizable/safe user interface to breakers); power module 2608 (e.g., for powering components of panel 2600 with AC, DC, or both);

main breaker 2610 (e.g. controllable by gateway 2604);

main relay 2612 (e.g., for controlling main power using gateway 2604);

controllable circuit breaker(s) 2614 (e.g., for controlling branch circuits);

sensor boards 2616 and 2617 (e.g., for measuring current, voltage, or both, or characteristics thereof, panel 2600 includes two sensor boards);

inner load center 2618 (e.g., including busbars and backplane); and power electronics 2620 (e.g., for generating/managing a DC bus, for interfacing to loads and generation).

In some embodiments, inner load center 2618 of panel 2600 is configured to accommodate a plurality of controllable circuit breakers 2614, wherein each breaker is communicatively coupled to gateway 2604 (e.g., either directly or via an interface board). As illustrated, panel 2600 includes inner enclosure 2650 and outer enclosure 2651. Outer enclosure 2651 may be configured to house power electronics 2620 and any other suitable components (e.g. away from usual access by a user for safety considerations). In some embodiments, inner enclosure 2650 provides access to breaker toggles for a user, as well as access to a user interface of gateway 2604. To illustrate, conductors (e.g., two single phase lines 180 degrees out of phase and a neutral, three-phase lines and a neutral, or any other suitable configuration) from a service drop may be routed to the top of panel 2600 (e.g., an electric meter may be installed just above panel 2600), terminating at main breaker 2610. Each line, and optionally neutral, is then routed to main relay 2612, which controls provision of electrical power to/from inner load center 2618 (e.g., busbars thereof). Below main relay 2612, each line is coupled to a respective busbar (e.g., to which controllable circuit breakers 2614 may be affixed). In some embodiments, a bus bar may include or be equipped with current sensors such as shunt current sensors, current transformers, Rogowski coils, any other suitable current sensors, or any combination thereof. The neutral may be coupled to a terminal strip, busbar, or any other suitable distribution system (e.g., to provide a neutral to each controllable circuit breaker, branch circuit, current sensor, or a combination thereof). Sensor boards 2616 and 2617, as illustrated, each include a plurality of current sensors (e.g., each branch circuit may have a dedicated current sensor). Sensor boards 2616 and 2617 may output analog signals, conditioned analog signals (e.g., filtered, amplified), digital signals (e.g., including level shifting, digital filtering, of electrical or optical character), any other suitable output, or any combination thereof.

Figure 29:
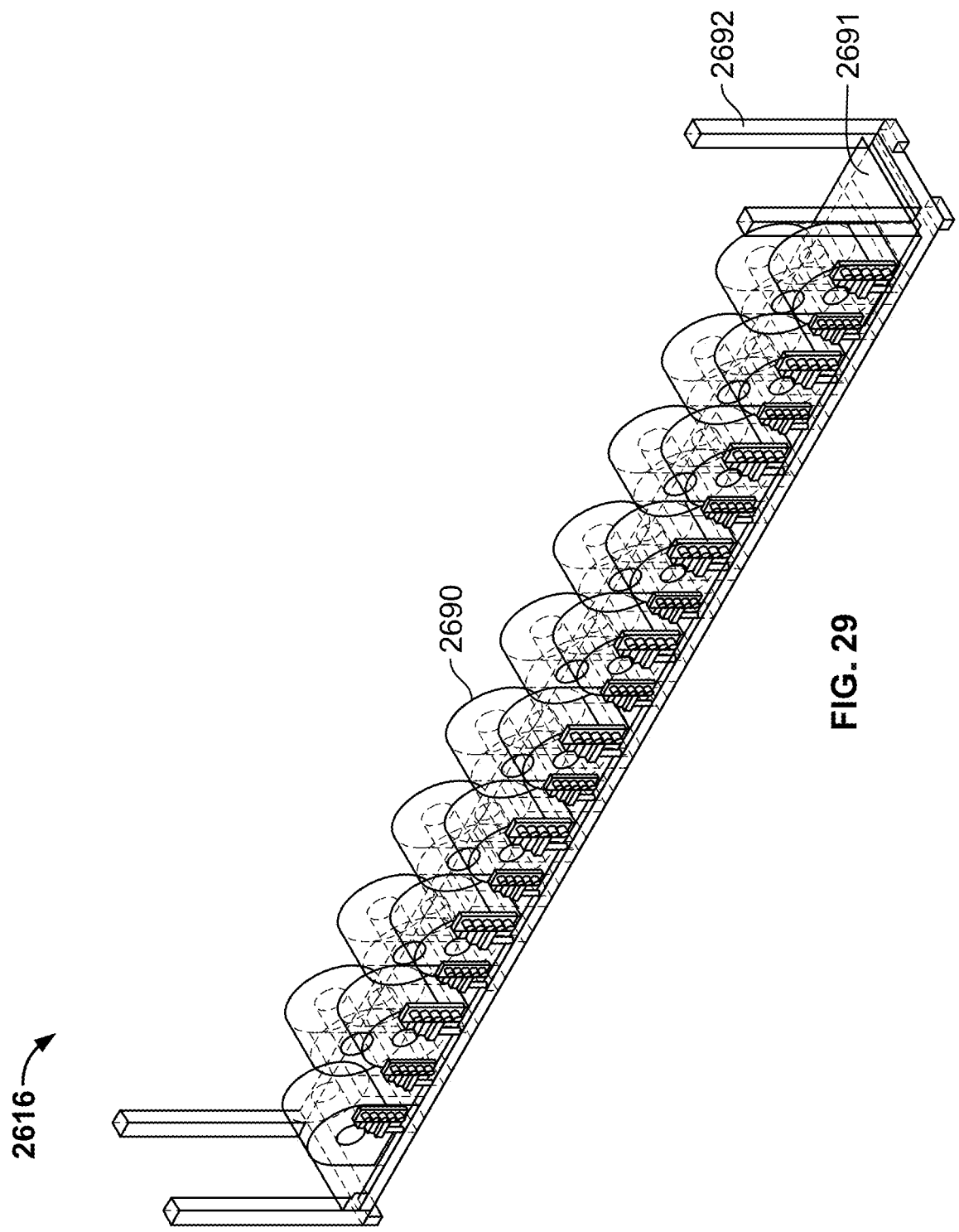
FIG. 29 shows a perspective view of a current transformer board, in accordance with some embodiments of the present disclosure.

FIGS. 28A-28D shows several views of sensor board 2616 (e.g., sensor board 2617 may be identical, similar, or dissimilar to sensor board 2616), in accordance with some embodiments of the present disclosure. FIG. 29 shows a perspective view of sensor board 2616, in accordance with some embodiments of the present disclosure. In reference to FIG. 28A shows a top view of sensor board 2616, FIG. 28B shows a side view of sensor board 2616, FIG. 28C shows an end view of sensor board 2616, and FIG. 28D shows a bottom view of sensor board 2616. As illustrated, sensor board 2616 includes PCB 2691, PCB support 2692 affixed to PCB 2691, current sensors 2690 affixed to PCB 2691, indicators 2696 (e.g., LED indicators), controller ports 2693, power and I/O port 2694, and power and I/O port 2695. Each current sensor of current sensors 2690 includes a pass-through to accommodate a line or neutral to sense current. For example, each current sensor of current sensor 2690 may correspond to a branch circuit. In some embodiments, power and I/O ports 2694 and 2695 are configured to be coupled to other sensor boards (e.g., sensor board 2617), a power supply (e.g., power module 2608), gateway 2604, any other suitable components, or any combination thereof. In some embodiments, controller port 2693 is configured to interface to control circuitry (e.g., of gateway 2604 or otherwise) to receive/transmit, or both, communications signals. In some embodiments, ports 2693, 2694, and 2695 are configured to communicate analog signals, electric power (e.g., DC power), digital signals, or any combination thereof.

Figure 30:
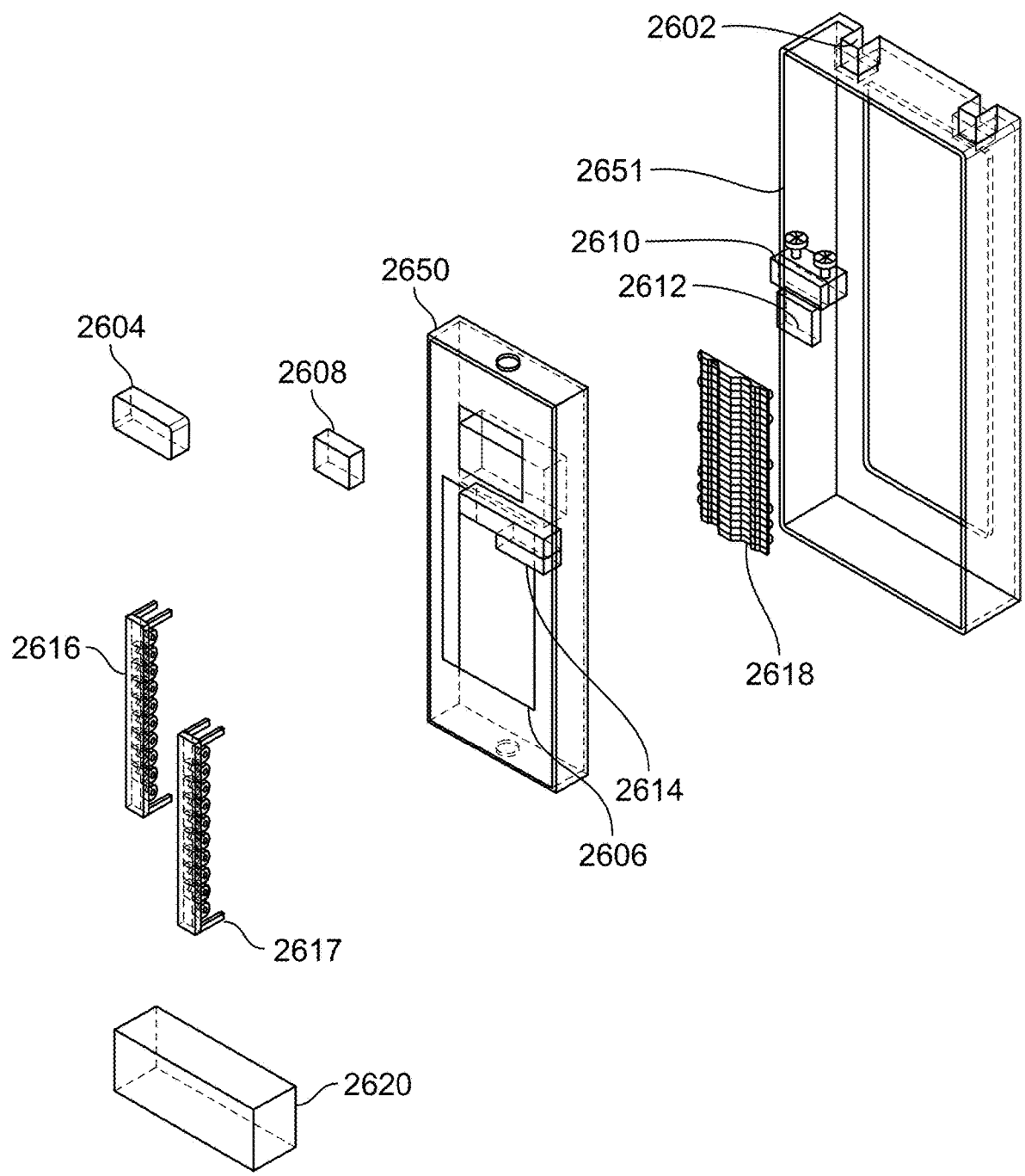
FIG. 30 shows an exploded perspective view of an illustrative panel, in accordance with some embodiments of the present disclosure.

FIG. 30 shows an exploded perspective view of illustrative panel 2600 (i.e., exploded panel 3000), in accordance with some embodiments of the present disclosure. Panel 3000 more clearly illustrates components of panel 2600.

Some illustrative aspects of the systems described herein are described below. For example, any of the illustrative systems, components, and configurations described in the context of FIGS. 1-22, 24, and 26-30 may be used to implement any of the techniques, processes, and use cases described herein.

In some embodiments, the system (e.g., system 100 of FIG. 1) is configured for grid health monitoring; managing energy reserves and power flow; and integrating ATS/disconnect functionality into a panel. A circuit breaker panelboard may be designed for connection to both a utility grid as well as a battery inverter or other distributed energy resource, and may include one or more switching devices on the circuit connecting the panelboard to the utility point of connection, one or more switching devices on the branch circuits serving loads, any other suitable components, or any combination thereof. In some embodiments, the system includes voltage measurement means connected to all phases of the utility grid side of the utility point of connection circuit switching device, which are in turn connected to logic circuitry capable of determining the status of the utility grid. In some embodiments, the system includes one or more logic devices (e.g., control circuitry of a gateway) capable of generating a signal to cause the switching device (e.g., main relay 2612 of FIG. 26) to disconnect the panelboard from the utility grid when the utility grid status is unsuitable for powering the loads connected to the panelboard, thereby forming a local electrical system island and either passively allows or causes the distributed energy resource to supply power to this island (e.g., using electrical signaling or actuation of circuit connected switching devices). In some embodiments, the system includes a preprogrammed selection of branch circuits, which are capable of being disabled when the local electrical system is operating as an island, in order to optimize energy consumption or maintain the islanded electrical system power consumption at a low enough level to be supplied by the distributed energy resource. In some embodiments, the system executes logic that generates and/or uses forecasts of branch circuit loads, appliance loads, measurements of branch circuit loads (e.g., based on signals from a sensor board), or a combination thereof to dynamically disconnect or reconnect branch circuits to the distributed energy resource, send electrical signals to appliances on branch circuits enabling or disabling them in order to optimize energy consumption, maintain the islanded electrical system power consumption at a low enough level to be supplied by the distributed energy resource, or a combination thereof. In some embodiments, the system includes an energy reservoir device such as, for example, one or more capacitors or batteries, capable of maintaining logic power and switching device actuation power in the period after the utility grid point of connection circuit switching device has disconnected the electrical system from the utility grid, and before the distributed energy resource begins to supply power to the islanded electrical system, in order to facilitate actuation of point of connection and branch circuit switching devices to effect the aforementioned functions.

In some embodiments, the system (e.g., system 100 of FIG. 1) is configured to provide hardware safety for phase imbalance or excessive phase voltage in a panelboard serving an islanded electrical system. In some embodiments, the system includes a circuit breaker panelboard (e.g., panel 2600 of FIG. 26) designed for connection to a battery inverter or other distributed energy resource. The panelboard may be configured to operate in islanded mode, with the served AC electrical system disconnected from any utility grid. In some embodiments, a distributed energy resource supplying power to the panelboard is connected using fewer power conductors (hereafter "conductors") than the electrical system served by the panelboard. The panelboard may include a transformer or autotransformer, or be designed for connection to a transformer or autotransformer provided with at least one set of windings with terminals equal in number to the number of conductors of the electrical system served by the panelboard. In some embodiments, the transformer is designed to receive power from a connection including the same number of power conductors as the connection to the distributed energy resource.

In some embodiments, a panelboard includes a plurality of electronic hardware safety features and a plurality of electrical switching devices (e.g., controllable relays and circuit breakers). For example, the safety features may be designed to monitor either the difference in voltage of all of the power conductors of the supplied electrical system, designed to monitor the difference in voltage of each of the conductors of the electrical system with respect to a shared return power conductor ("neutral"), or both. The system (e.g., control circuitry thereof) may monitor voltages, hereafter termed "phase voltages," or a suitable combination of monitoring of difference in voltages and phase voltages such that the power supply voltage to all devices served by the electrical system is thereby monitored.

In some embodiments, the system (e.g., system 100 of FIG. 1) includes safety features configured to maintain a safe state when subjected to a single point component or wiring fault. For example, the safety features may be configured to entirely break the connection between the distributed energy resource and the panelboard if conditions that could lead to excessive voltages being supplied to any load served by the panelboard are detected. In a further example, a panelboard connected to a 240V battery inverter having two terminals with corresponding conductors. In some embodiments, the panelboard includes an autotransformer having two windings and three terminals, and is configured to serve an islanded electrical system of the 120V/240V split phase type. This configuration, for example, includes three conductors that are used to supply two 120V circuits with respect to a shared neutral conductor, each of the 120V conductors being supplied with power 180 degrees out of phase with respect to the other. In some such embodiments, the panelboard includes one or more of the following:

(1) A single phase 240V battery inverter containing an overvoltage detection circuit, which disables output of the inverter when excessive voltages are detected.

(2) A central voltage imbalance detector circuit, which sends a signal when an imbalance in phase voltage is detected.

(3) Two separate actuation circuits associated with two separate switching devices, each switching device being in circuit with the battery inverter.

(4) Two voltage amplitude detector circuits, one associated with each switching device, and each monitoring one phase of the electrical system.

(5) Actuation circuits configured to disconnect the associated switching device if either the central voltage imbalance detector signal is transmitted, or an excessive voltage associated with the monitored electrical system phase is detected, or if the logic power supply to the actuation circuit is lost.

(6) Optionally, an energy reservoir associated with each actuation circuit, to enable each actuation circuit to take the action needed to disconnect the switching device after loss of logic power supply to the actuation circuit, especially if the switching device is bi-stable.

In some embodiments, the system (e.g., system 100 of FIG. 1) includes a plurality of metering circuits connected to control circuitry (e.g., a gateway) that monitor current transducers associated with one busbar (e.g., included in a sensor board). In some embodiments, an electrical panelboard includes at least one power distribution conductor (hereafter "bus bar" and referring to any rigid or flexible power distribution conductors) that distributes power to multiple branch circuits. For example, each branch circuit may include one or more current transducers such as current measurement shunts, non-isolated current transformers, non-isolated Rogowski coils, any other suitable current sensor, or any combination thereof (e.g., using sensor board 2616 of FIG. 26 or any other suitable sensor system). In some embodiments, all branch circuits associated with a given bus bar are monitored by a plurality of metering circuits that each measure current or power associated with a given branch circuit or set of branch circuits (e.g., using sensor board 2616 of FIG. 26 or any other suitable sensor system). The metering circuits may be connected together without need for galvanic isolation, and the metering circuits may include, for example, a system of common mode filters, differential amplifiers, or both. For example, metering circuits including one or more filters or filter systems may be able to produce accurate results from the signals generated by the current transducers even in the presence of transient or steady state voltage differences existing between the transducers of each branch circuit served by the bus bar. Such differences may result from voltage differences associated with current flow through the resistive or inductive impedance of the bus bar and branch circuit system, and may be coupled to the current transducers either by direct galvanic connection or capacitive coupling, parasitic or intentional.

In the present disclosure, "non-isolated" is understood to mean the condition which exists between two electrical conductors either when they are in direct electrical contact, or when any insulation or spacing between them is of insufficient strength or size to provide for the functional or safety design requirements which would be needed if one of the conductors were energized by an electric potential associated with a conductor in the electrical system served by the panelboard, and the other conductor were to be either left floating, or connected to a different potential served by the electrical system.

In some embodiments, metering circuits (e.g., which transmit sensor signals) share a common logic or low voltage power supply system. In some embodiments, metering circuits share a non-isolated communication medium. In some embodiments, metering circuits are collocated on a single printed circuit board (e.g., sensor board 2616 of FIG. 26), which is physically close to the bus bar and is sized similarly in length to the bus bar, and in which a printed low voltage power distribution conductor associated with the metering circuits is electrically connected to the bus bar at a single central point, near the middle of the length of the bus bar. In some embodiments, a power supply system is galvanically bonded to the bus bar at one or more points.

In some embodiments, a system (e.g., system 100 of FIG. 1) includes an electrical connection to the bus bar that is made using a pair of resistance elements (e.g., resistors) connected between the printed power distribution conductor and each of the leads associated with a single current measurement shunt type of current transducer (e.g., which each serve one of the branch circuits). For example, the transducer may be arranged near the middle of the length of the bus bar. Further, the resistance elements may be sized such that any current flow through them caused by the potential drop across the shunt transducer is negligible in comparison to the resistance of the shunt and the resistances of any connecting conductors that connect the shunt to the resistances, so as not to materially affect the signal voltage produced by the transducer when said current flows.

Figure 31:
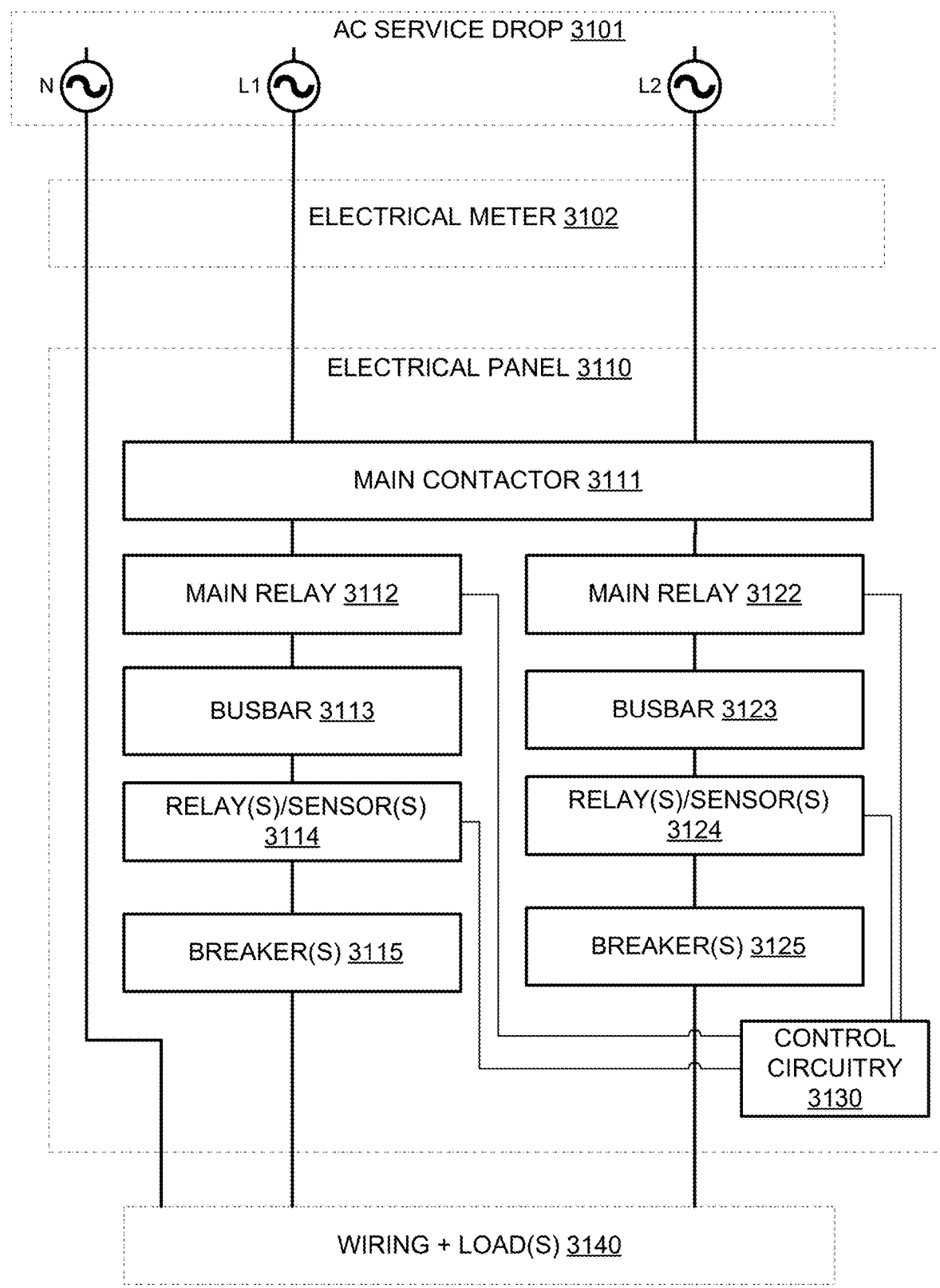
FIG. 31 shows a block diagram of a system including an illustrative electrical panel having relays, in accordance with some embodiments of the present disclosure.

In some embodiments, a pair of systems (e.g., two instances of system 100 of FIG. 1, which may be but need not be similarly configured) as have been previously described are included, with one system being associated with each line voltage bus bar of a split phase 120V/240V electrical panelboard. In some embodiments, each of the systems is connected to a central communication device or computing device (e.g., including control circuitry) by means of a galvanically isolated communications link, and in which each system is served by a separate, galvanically isolated power supply FIG. 31 shows a block diagram of a system including illustrative electrical panel 3110 having relays, in accordance with some embodiments of the present disclosure. An AC source, such as an AC service drop 3101 includes one or more electrical conductors configured to transmit AC power. As illustrated in FIG. 31, service drop 3101 includes a neutral (e.g., a grounded neutral), a first line (e.g., L1 that is 120 VAC), and a second line (e.g., L2 that is 120 VAC and 180 degrees out of phase with L1). The service drop lines are coupled to electrical meter 3102, which is configured to sense, record, or both electrical power usage and generation. For example, electrical meter 3102 may include current and voltage sensors that are used to determine usage. The L1 and L2 lines are coupled to main contactor 3111, which is used to disconnect components of electrical panel 3110 from AC service drop 3101 (e.g., for safety, service, or component installation). For example, as illustrated, main contactor 3111 may be a two pole, single throw contactor, configured to disconnect both L1 and L2 from the rest of electrical panel 3110. Main relays 3112 and 3122 are configured to couple respective L1 and L2 to respective busbars 3113 and 3123. In some embodiments, main relays 3112 and 3122 are communicatively coupled to control circuitry 3130, and accordingly may be actuated open or closed by control circuitry 3130. For example, main relays 3112 and 3122 may include control terminals configured to be coupled to control circuitry 3130, and current carrying terminals configured to conduct current from L1 and L2. Main relays 3112 and 3122 may include, for example, solenoid-based relays, solid state relays, any other suitable type of relay, or any combination thereof. Busbars 3113 and 3123 are each configured to interface to a coupled to a plurality of relays and sensors, which in turn are coupled to corresponding circuit breakers. In some embodiments, busbars 3113 and 3123 distribute lines L1 and L2 to a plurality of respective relays 3114 and 3124 having integrated current sensors. For example, busbar 3113 may be engaged with a plurality of relays 3114 having a measurement current shunt included. Voltage measurement leads may be coupled to the current shunt (e.g., having a known and precise resistance or impedance), and also coupled to control circuitry 3130 for voltage measurements (e.g., real-time voltage measurements across the respective shunts to determine real-time current flow). In an illustrative example, the current shunt may include a strip of metal having a precise geometry, or otherwise precisely known electrical resistance. In some embodiments, control circuitry 3130 is configured to open and close relays 3114 and 3124, as well as read voltage drops across current shunts. Breakers 3115 and 3125 may include circuit breakers configured to provide mechanical circuitry breaking, or manual circuit breaking. For example, breakers 3115 and 3125 are accessible by a user to reset, shut off, and observe (e.g., observe if tripped). Breakers 3115 engage with relays 3114 and breakers 3125 engage with relays 3124. The output of breakers 3115 and 3125 are lines L1 and L2, available to be coupled to the wiring and load of the site (e.g., load 3140), for example.

In an illustrative example, referencing FIG. 31, electrical panel 3110 may be a "main" panel for a residence. The electrical utility may provide, manage or specify requirements of service drop 3101 (or distribution lines coupled thereto), electrical meter 3102 (e.g., record usage from meter 3102 at some schedule), or both. Electrical panel may include main contractor 3111 near the top of the panel, with main relays 3112 and 3122 arranged behind (e.g., deeper into the wall, as viewed by a user) main contactor 3111.

In an illustrative example, referencing FIG. 31, electrical panel 3110 may be retrofitted into a residential electrical system, displacing a conventional panel. In some embodiments, main contactor 3111 (or main breaker in some embodiments), main relays 3112 and 3122, busbars 3113 and 3123, and branch relays 3114 and 3124, are installed on a backing plate. In some such embodiments, a dead-front panel is installed to cover the relay components and busbars, with only bus bar tabs exposed thus providing access for breakers to be engaged with the relay-switched busbars.

In some embodiments, one or more relays are included in a panel, and are controllable by control circuitry 3130. In some such embodiments, the system is configured for mechanical circuit breaking (e.g., from circuit breakers), controlled circuit breaking (e.g., from relays), circuit shut-off and reset (e.g., from circuit breakers, relays, or both), or a combination thereof. For example, a user may interact with electrical panel 3110 manually (e.g., by opening or closing breakers), via an integrated user interface (e.g., a touchscreen or touchpad), via a software application (e.g., installed on a smart phone or other user device), or any combination thereof.

Figure 32:
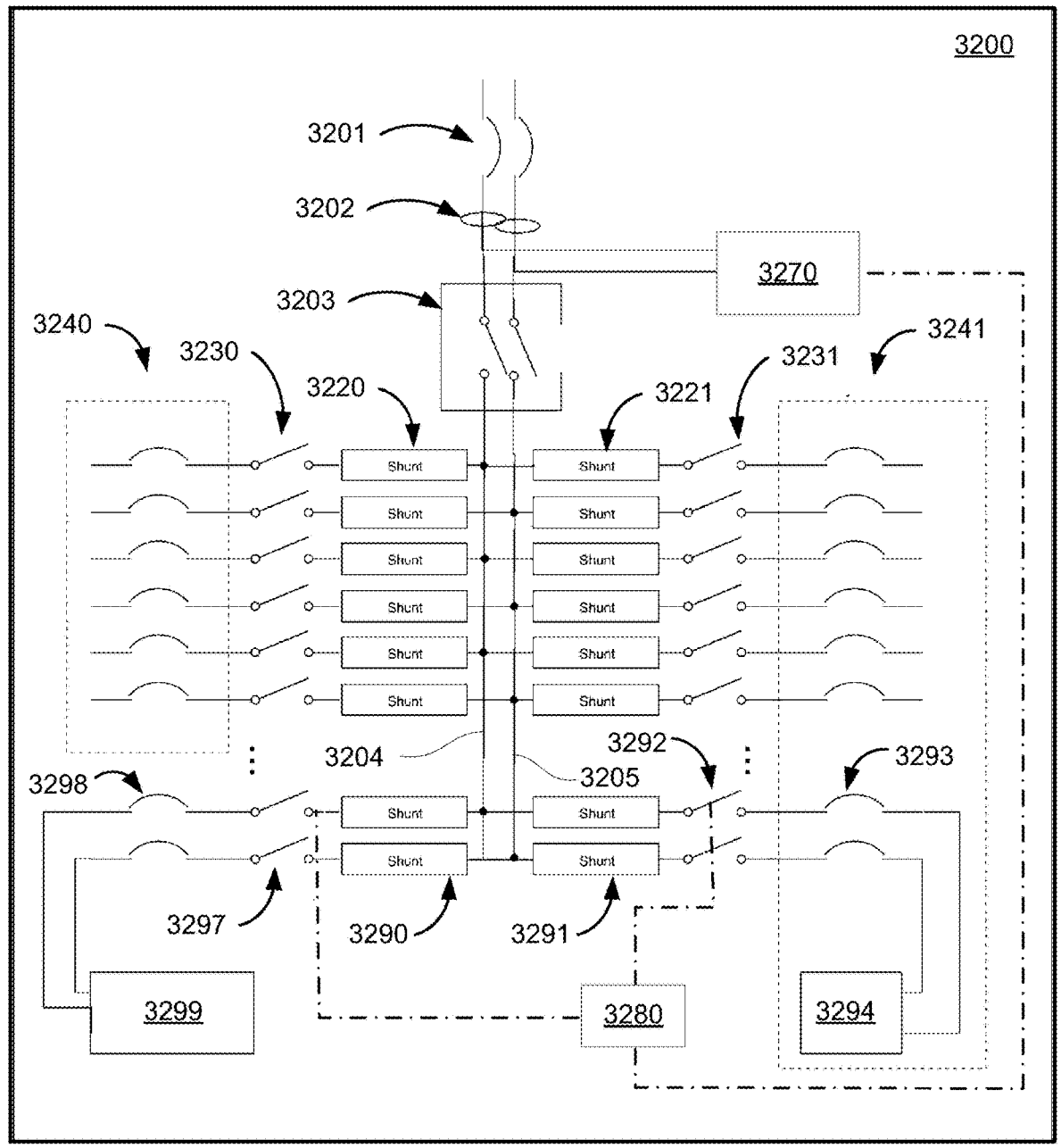
FIG. 32 shows a block diagram of a system including an illustrative electrical panel having relays and shunt current sensors, in accordance with some embodiments of the present disclosure.

FIG. 32 shows a block diagram of system 3200 including an illustrative electrical panel having relays 3230 and 3231 and shunt current sensors 3220 and 3221, in accordance with some embodiments of the present disclosure. As illustrated, system 3200 includes main breaker 3201, main current sensors 3202, main relay 3203, lines 3204 and 3205 (e.g., L1 and L2), shunts 3220 and 3221, relays 3230 and 3231, breakers 3240 and 3241, shunts 3290 and 3291, relays 3297 and 3292, breakers 3298 and 3293, autotransformer 3299, inverter 3294, relay drive override 3280, and phase imbalance monitor 3270.

A first branch includes line 3204 (e.g., L1), with shunt current sensors 3220, relays 3230, and breakers 3240 coupled in series for each branch circuit. Similarly, a second branch includes line 3205 (e.g., L2), with shunt current sensors 3221, relays 3231, and breakers 3241 coupled in series for each branch circuit. Also coupled to lines 3204 and 3205 are shunt current sensors 3290, relays 3297, breakers 3298, and autotransformer 3299, as well as shunt current sensors 3291, relays 3292, breakers 3293, and inverter 3294. Relay driver override 3280 is coupled to each of relays 3297, 3292, and phase imbalance monitor 3270.

FIGS. 33A-42 show illustrative examples of components and aspects of an electrical panel, in accordance with some embodiments of the present disclosure. For example, the illustrative components shown in FIGS. 33A-42 may be included in an electrical panel such as electrical panel 3110 of FIG. 31, electrical panel 3200 of FIG. 32, or any other suitable electrical panel.

Figure 33B:
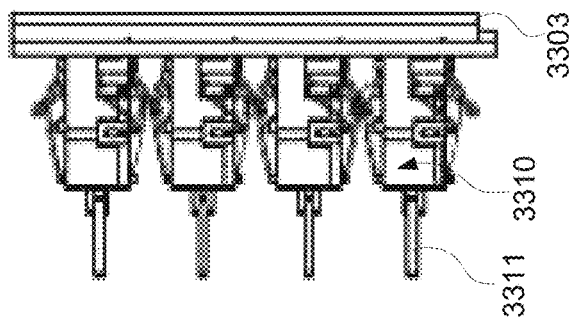
FIG. 33B shows a side view.
Figure 33A:
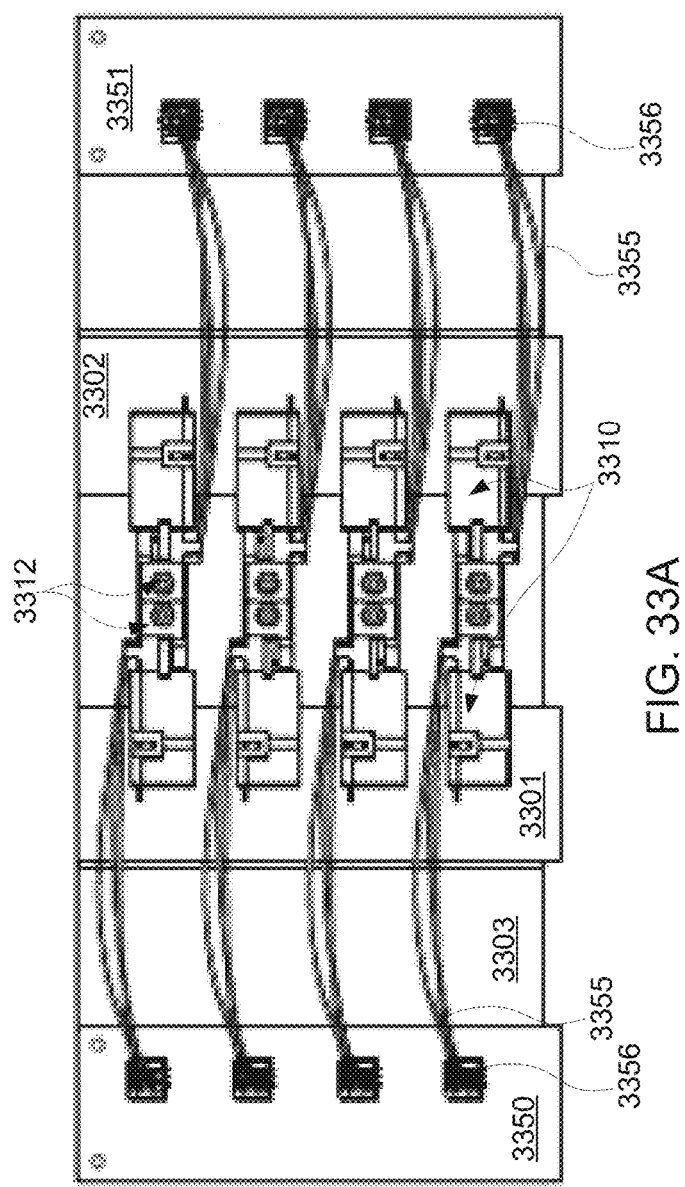
FIG. 33A shows a front view.
Figure 33C:
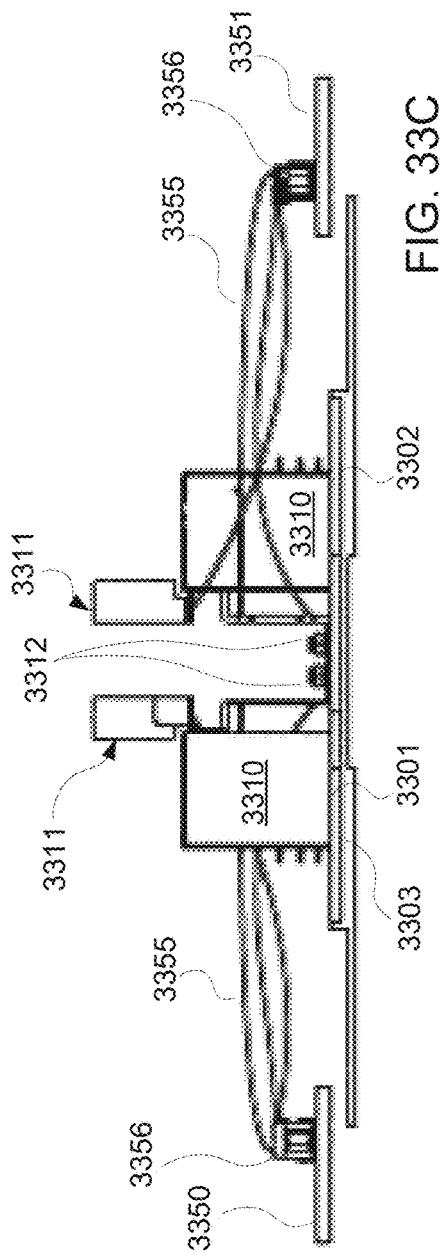
FIG. 33C shows a bottom view of an illustrative assembly including a backing plate with branch relays and control boards installed, in accordance with some embodiments of the present disclosure.
Figure 34:
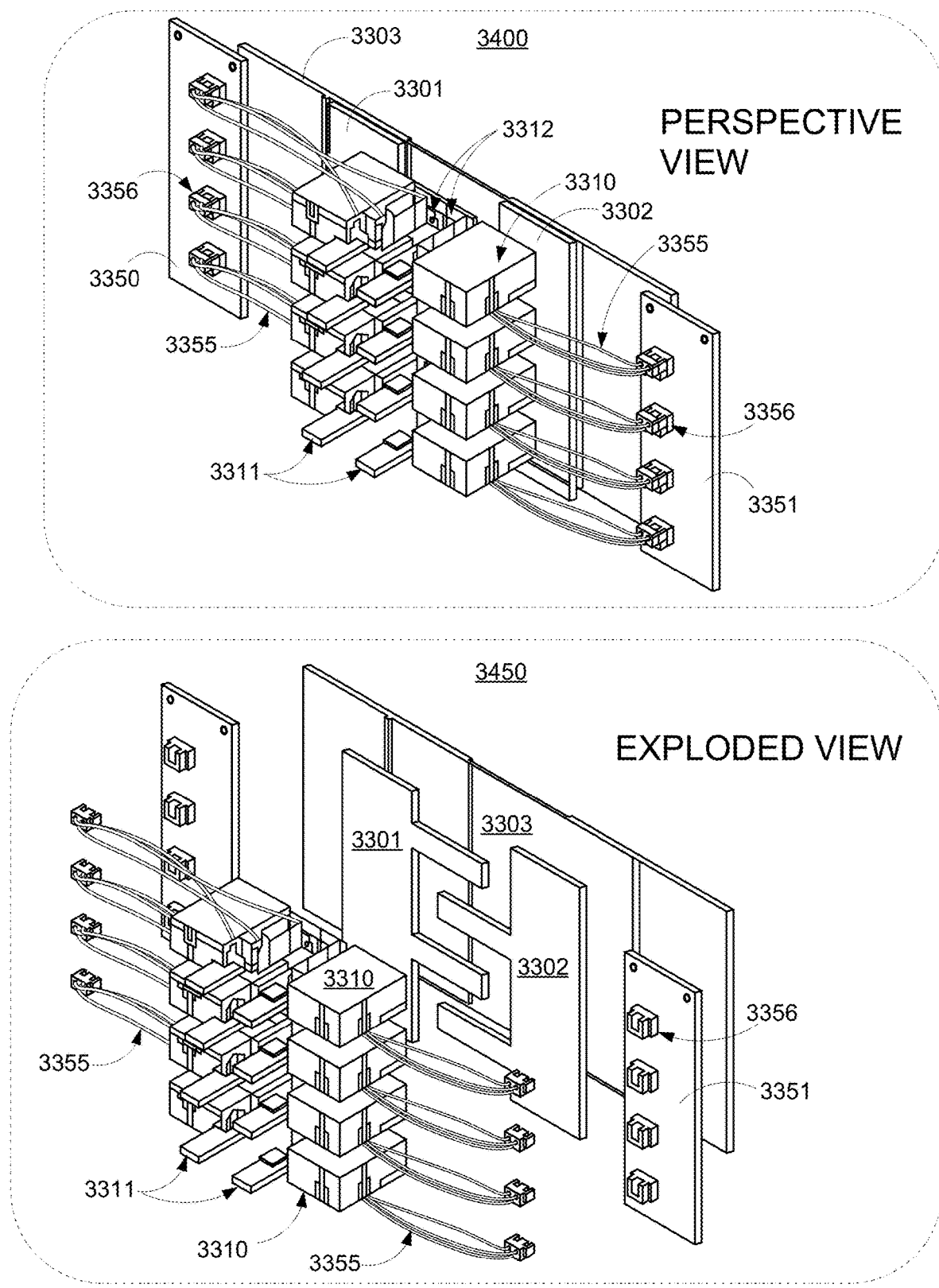
FIG. 34 shows a perspective view and exploded view of the illustrate assembly of FIGS. 33A-33C, with some components labeled, in accordance with some embodiments of the present disclosure.

FIG. 33A shows a front view, FIG. 33B shows a side view, and FIG. 33C shows a bottom view of an illustrative assembly including a backing plate with branch relays and control boards installed, in accordance with some embodiments of the present disclosure. FIG. 34 shows perspective view 3400 and exploded view 3450 of the illustrate assembly of FIGS. 33A-33C, with some components labeled, in accordance with some embodiments of the present disclosure. As illustrated, eight branch relays 3310 are installed on backing plate 3303 (e.g., in a 4×2 arrangement), with first terminal 3312 of each branch relay 3310 secured to a busbar (e.g., busbar 3301 or busbar 3302), and second terminal 3311 of each branch relay 3310 extending outwards (e.g., in the side view, towards a user to the left). For example, as illustrated first terminals 3312 are secured by threaded fasteners (e.g., nuts threaded onto studs such as pem studs). A plurality of wires 3355 connect branch relays 3310 to corresponding connectors 3356 of a corresponding control board (e.g., control board 3350 or control board 3351, although in some embodiments, a single board may be used). For example, wires 3355 may be configured to transmit control signals from control boards 3350 and 3351 to each relay 3310 to cause the relay to open or close a circuit. In a further example, wires 3355 may be configured to transmit sensor signals (e.g., voltage signals) from a current shunt integrated into each relay 3310 to control boards 3350 and 3351 (e.g., which may determine current based on the voltage drop across the shunt). In some embodiments, backing plate 3303 is configured to be mounted to an electrical enclosure, to a building structure, included in an electrical assembly, or a combination thereof. As illustrated, each of control boards 3350 and 3351 includes four connectors 3356, although any suitable number of control boards may be included (e.g., one, two, or more than two, and each control board may include any suitable number of connectors, electrical terminals, or electrical interfaces. As illustrated in FIG. 34, second terminals 3311 are also referred to herein as "branch breaker tabs,"

control boards 3350 and 3351 are also referred to herein as "Column PCBs" or control circuitry, and backing plate 3303 is also referred to herein as a "main bus housing." In some embodiments, each of control boards 3350 and 3351 may be electrically coupled to a central controller, which may include control circuitry, a user interface, a communications interface, memory, any other suitable components, or any combination thereof. For example, each of control boards 3350 and 3351 may be connected via a cable (e.g., having suitable terminating connectors), terminated wires, or both to the controller. As illustrated in FIG. 34, main busbars 3301 and 3302 are included, which may correspond to two different AC lines (e.g., L1 and L2 of a utility service drop). It will be understood that although shown as coupled to control boards 3350 and 3351, wires 3355 that are coupled to branch relays 3310 may be coupled to a central controller having control circuitry, and accordingly control boards 3350 and 3351 need not be included. Control boards 3350 and 3351 may include control circuitry, be installed intermediately between branch relays 3310 and a central controller, or may be omitted entirely. It will be understood that control boards 3350, 3351, or both may provide any suitable functionality and may include, for example, a current sensing board, a sensor board, and interface board, a PCB, any other suitable control circuitry, or any combination thereof. For example, a control board may be configured to receive sensor signals, provide control signals, execute a feedback control loop, condition signals (e.g., amplify, filter, or modulate), convert signals, generate signals, manage electric power, receive and transmit digital signals, any other suitable function, or any combination thereof. It will be understood that a control board may provide any suitable functionality and may include, for example, a current sensing board, a sensor board, and interface board, a PCB, any other suitable control circuitry, or any combination thereof. For example, a control board may be configured to receive sensor signals, provide control signals, execute a feedback control loop, condition signals (e.g., amplify, filter, or modulate), convert signals, generate signals, manage electric power, receive and transmit digital signals, any other suitable function, or any combination thereof.

Figure 35A:
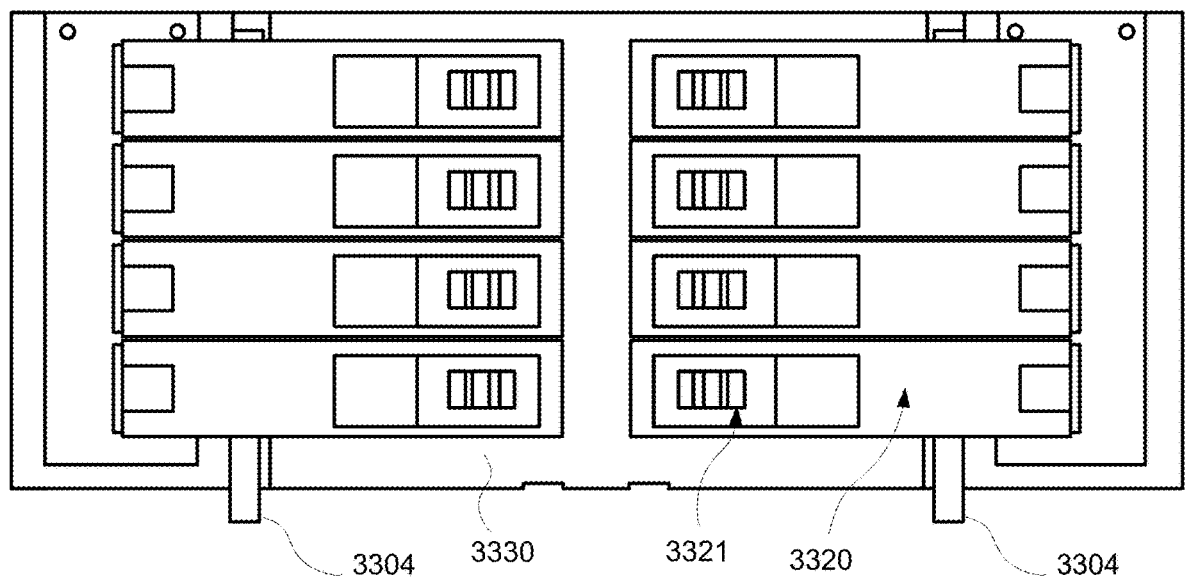
FIG. 35A shows a front view.
Figure 35B:
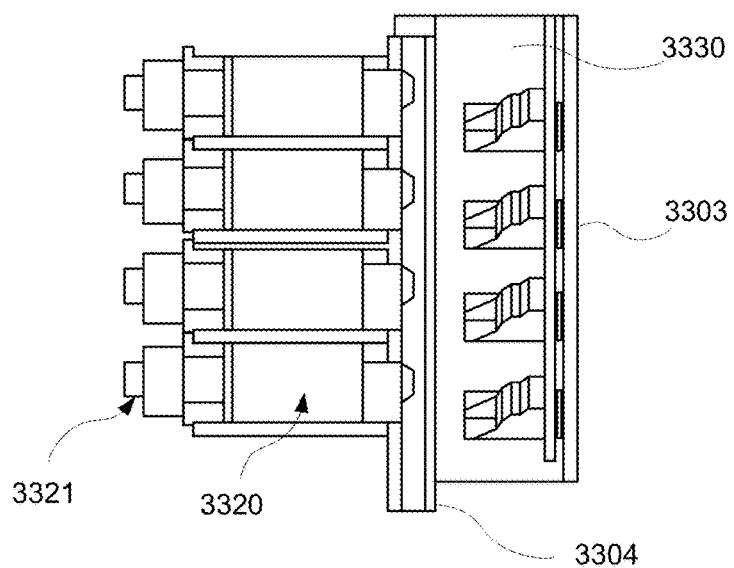
FIG. 35B shows a side view.
Figure 35C:
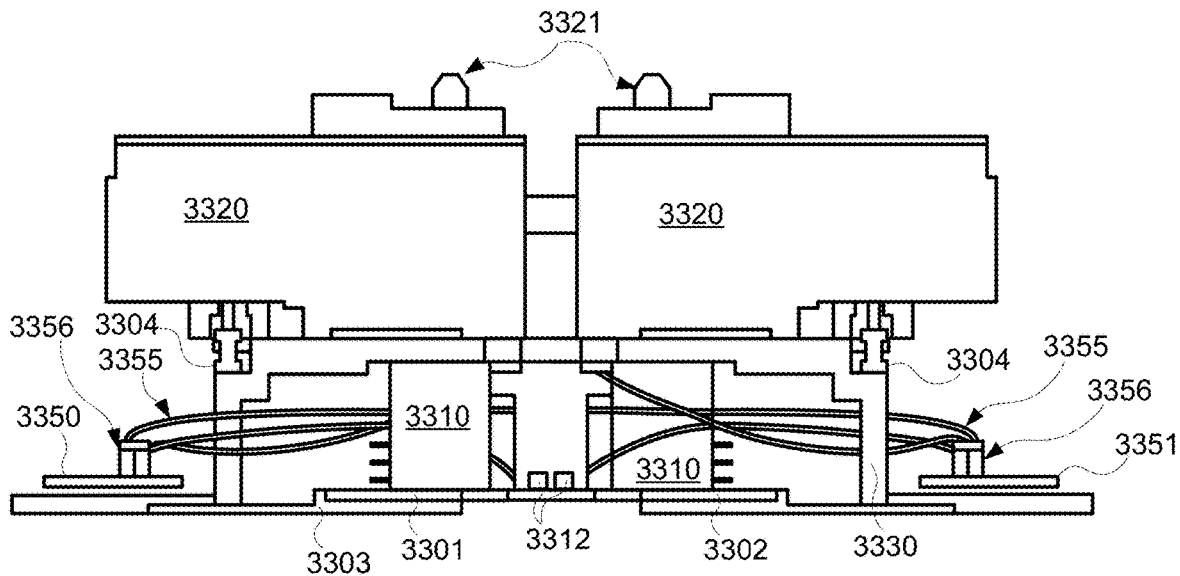
FIG. 35C shows a bottom view.
Figure 35D:
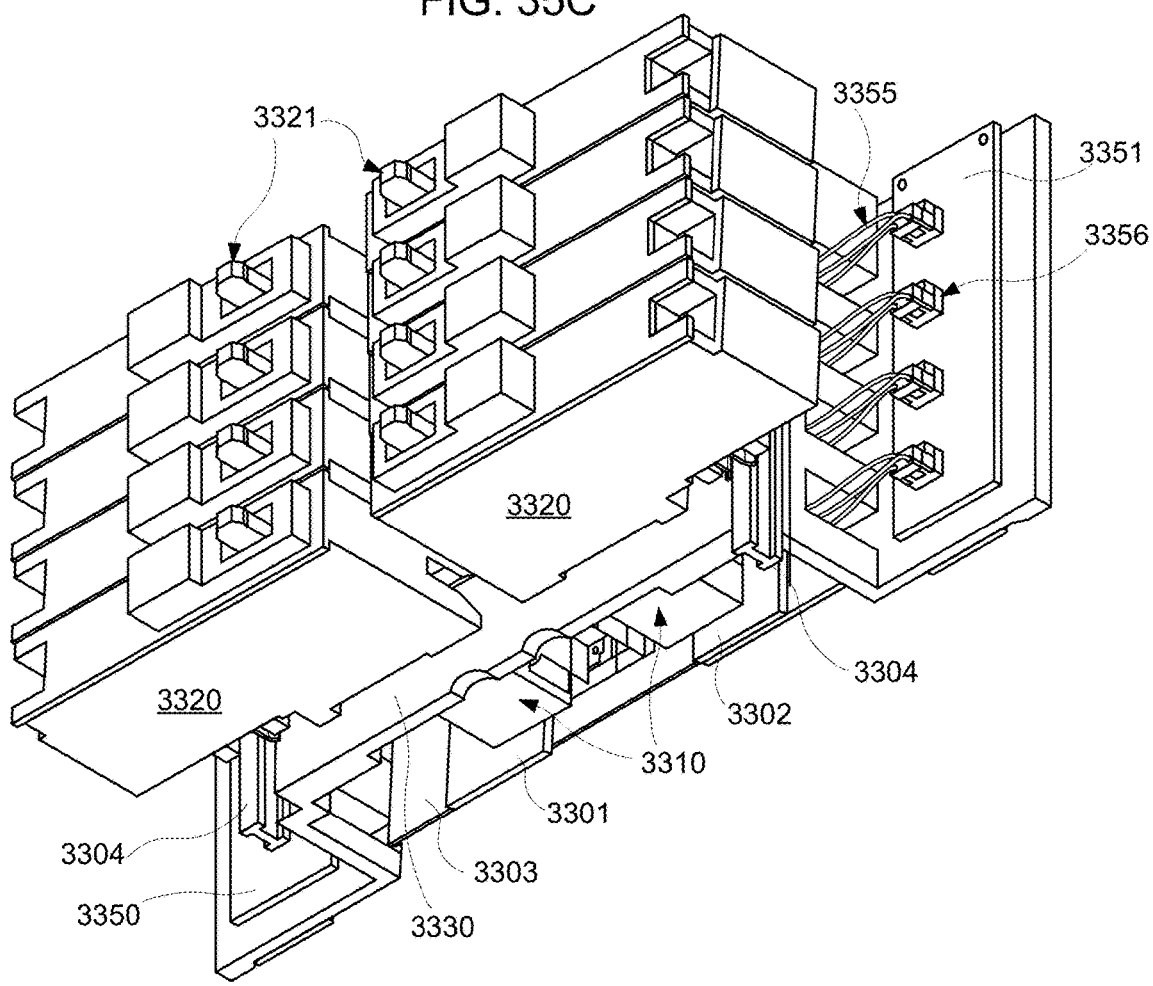
FIG. 35D shows a perspective view of an illustrative assembly including a backing plate with branch relays and control boards installed, a deadfront installed, and circuit breakers installed, in accordance with some embodiments of the present disclosure.

FIG. 35A shows a front view, FIG. 35B shows a side view, FIG. 35C shows a bottom view, and FIG. 35D shows a perspective view of an illustrative assembly including backing plate 3303 with branch relays 3310 and control boards 3350 an 3351 installed, deadfront 3330 installed, and circuit breakers 3320 installed, in accordance with some embodiments of the present disclosure. Circuit breakers 3320 engage with second terminals 3311 of branch relays 3310 to create a branch circuit.

Figure 36A:
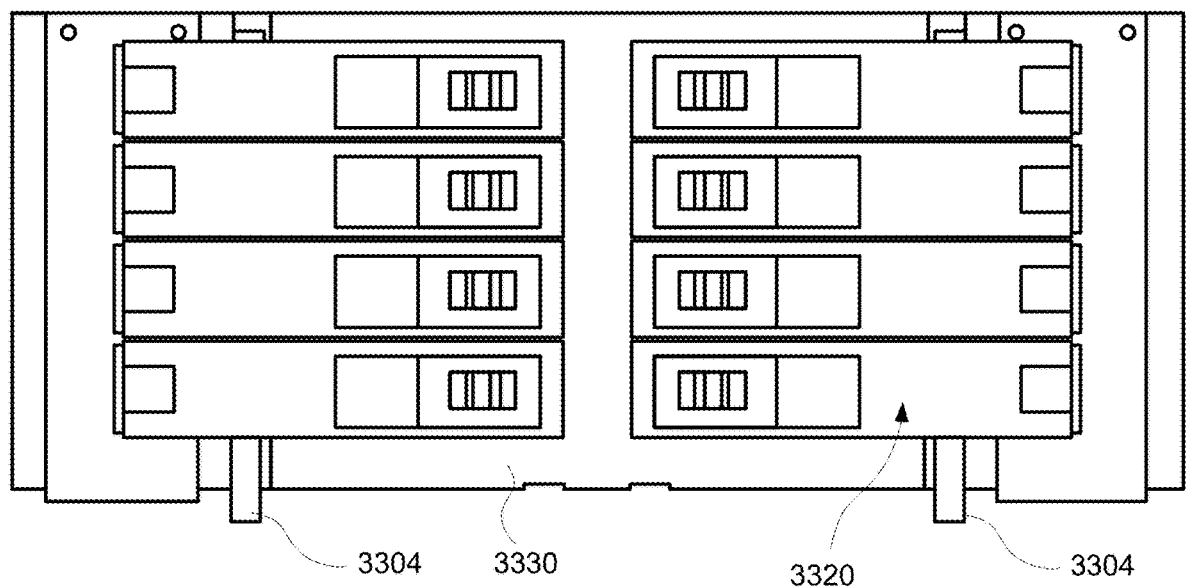
FIG. 36A shows a front view.
Figure 36B:
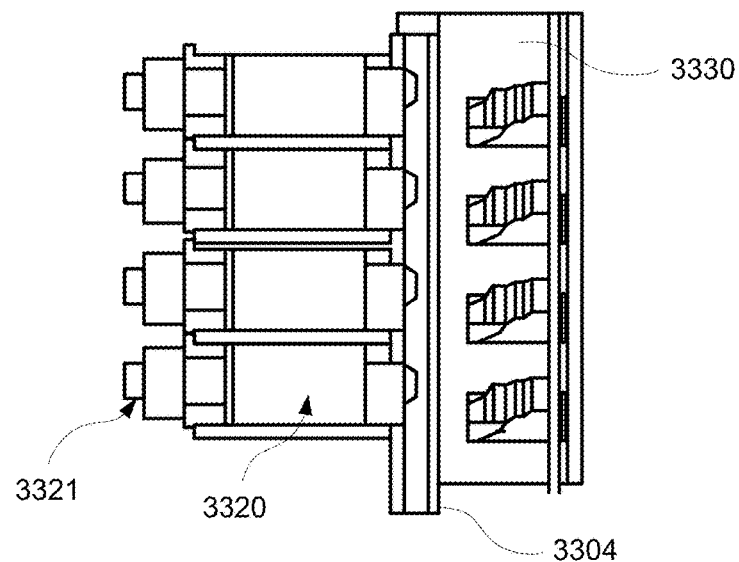
FIG. 36B shows a side view.
Figure 36C:
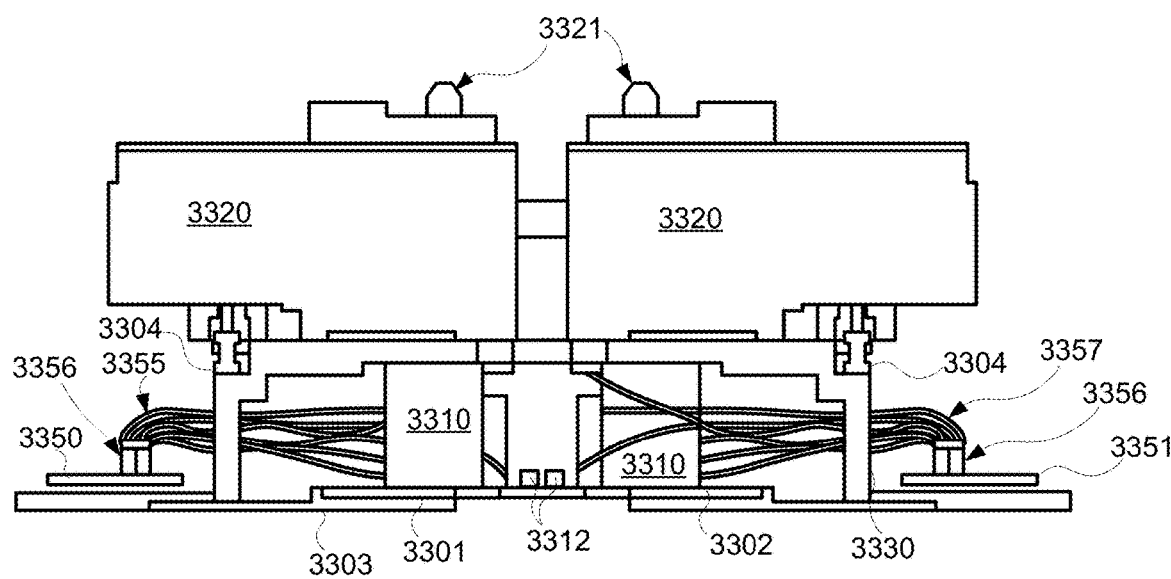
FIG. 36C shows a bottom view.
Figure 36D:
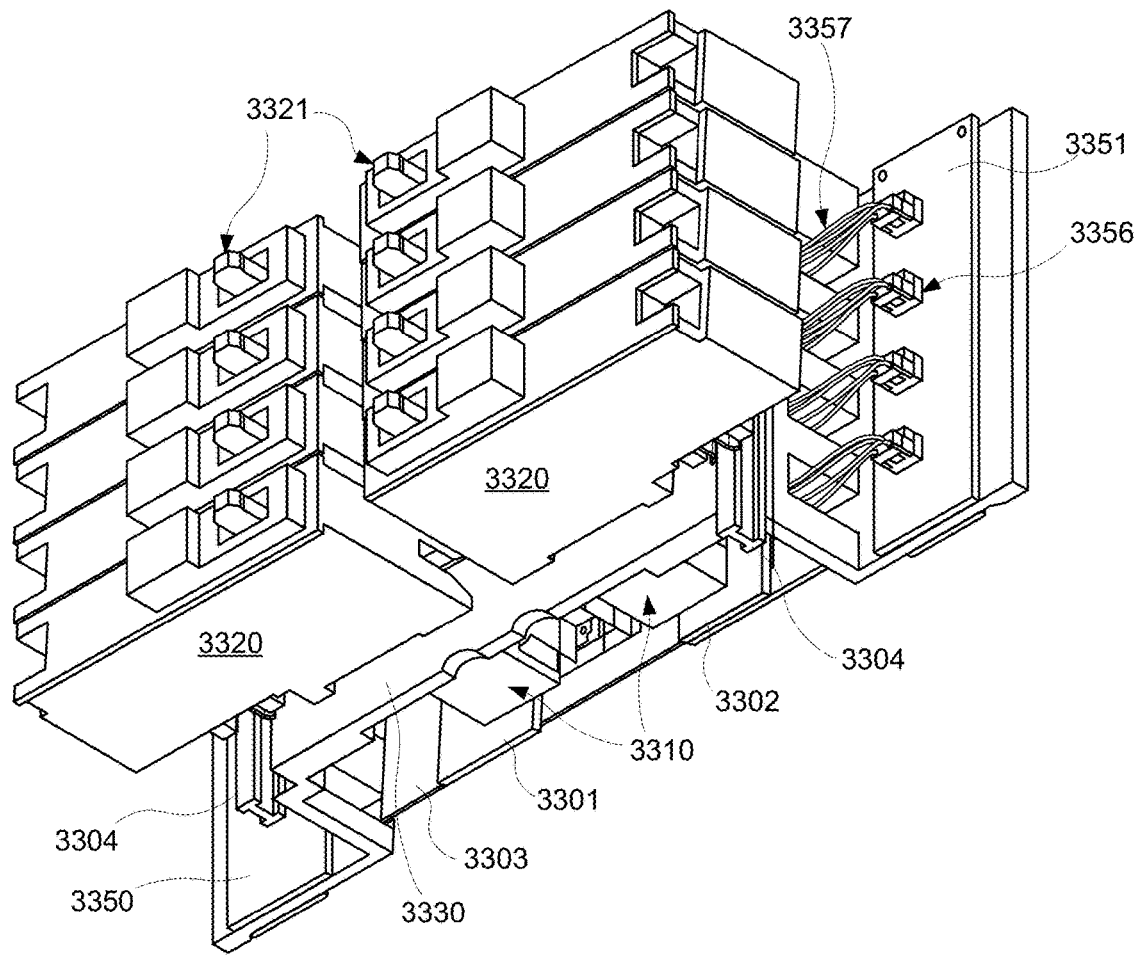
FIG. 36D shows a perspective view of an illustrative assembly including a backing plate with branch relays and control boards installed, a deadfront installed, and circuit breakers installed, wherein the branch relay control wires are illustrated, in accordance with some embodiment of the present disclosure.

FIG. 36A shows a front view, FIG. 36B shows a side view, FIG. 36C shows a bottom view, and FIG. 36D shows a perspective view of an illustrative assembly including backing plate 3303 with branch relays 3310 and control boards 3350 and 3351 installed, deadfront 3330 installed, and circuit breakers 3320 installed, wherein the branch relay sensor and control wires 3357 are illustrated, in accordance with some embodiment of the present disclosure. As illustrated, the assembly of FIGS. 36A-36D is the same as the assembly of FIGS. 35A-35D, with sensor and relay control wires 3357 added in FIGS. 36A-36D. For example, each branch relay 3310 may include three control terminals, configured to allow two-way actuation of the control coil (e.g., for solenoid actuated relays). In some embodiments, the sensing wires and relay control wires 3357 (e.g., from the current shunt and sense pins and actuator pins) may be, but need not be, terminated at a single connector. For example, as illustrated, a single connector 3356 is included for each branch relay 3310.

Figure 37A:
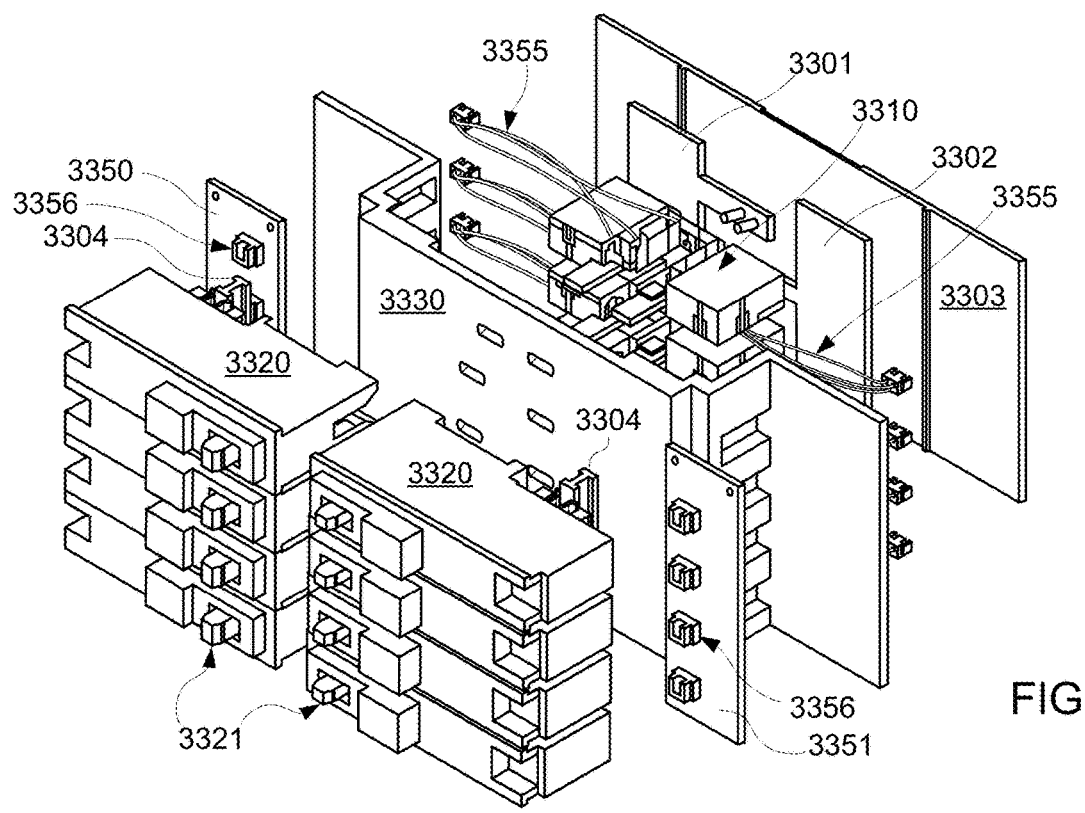
FIG. 37A shows an exploded perspective view of the illustrative assembly of FIGS. 36A-36D.
Figure 37B:
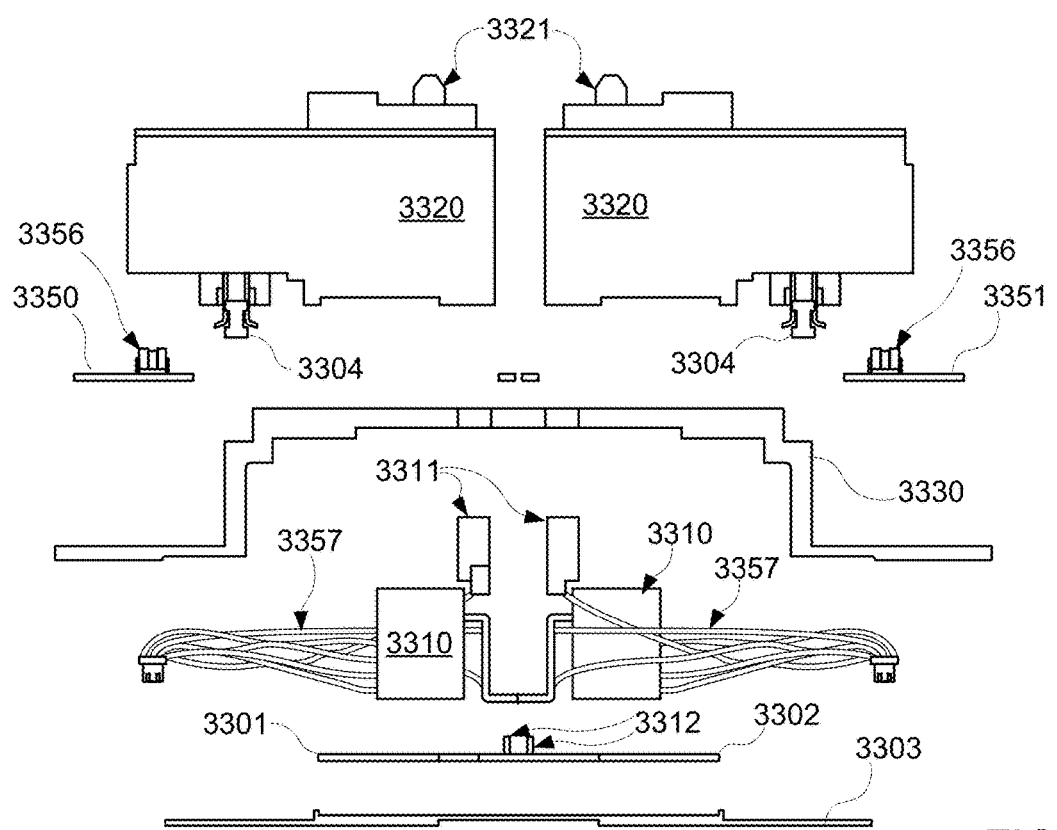
FIG. 37B shows an exploded side view of the illustrative assembly of FIGS. 36A-36D, with some components labeled, in accordance with some embodiments of the present disclosure.

FIG. 37A shows an exploded perspective view of the illustrative assembly of FIGS. 36A-36D, and FIG. 37B shows an exploded side view of the illustrative assembly of FIGS. 36A-36D, with some components labeled, in accordance with some embodiments of the present disclosure. In some embodiments, each of branch relays 3310 may include electrical terminals configured to engage with an electrical connector (e.g., of a wiring harness), to engage with individual terminating connectors of a wire bundle or cable, to be soldered to, any other suitable electrical interface, or any combination thereof. For example, installer deadfront 3330, neutral bar(s) 3304, and branch circuit breakers 3320 may be added to the assembly of FIGS. 33A-34 to create the assembly of FIGS. 36A-37B. In some embodiments, installer deadfront 3330 is installed to hide branch relays 3310 from a user, prevent access to branch relays 3310 by a user, or otherwise provide a simplified interface to a user. For example, a user can interact with, replace, install, and view branch circuit breakers 3320 without having access to branch relays 3310, which are controllable by control boards 3350 and 3351, as illustrated. In a further example, neutral bars 3304 (e.g., coupled to a Neutral of a utility service drop) may secured to installer deadfront 3330 and may include screw terminals for affixing neutral wires. Branch circuit breakers 3320 may be installed, and be electrically coupled to second terminals 3311 of each branch relay 3310 to provide protected AC power. For example, each branch circuit breaker 3320 includes a terminal to which a wire may be secured (e.g., to provide AC voltage). An outer deadfront (not shown) may be installed to cover branch circuit breakers 3320, providing access only to circuit breaker toggles 3321, which a user may interact with. As illustrated in FIGS. 36A-36D, each of branch circuit breakers 3320 may engage with a busbar (e.g., busbar 3301 or busbar 3302) and a neutral bar (e.g., either of neutral bars 3304), and may include corresponding terminals (e.g., line and neutral) to which branch circuit wiring may be terminated. In some embodiments, each of branch circuit breakers 3320 may engage busbar 3301 or 3302 and include a single output terminal, and the corresponding neutral wire may terminate at a neutral bus bar (e.g., neutral bar 3304) having a screw terminal, for example. Any suitable type of branch circuit breaker 3320 may be included (e.g., a manual breaker, a controllable breaker, a cheater breaker, a di-pole breaker), having any suitable capacity or operating characteristics, in accordance with some embodiments of the present disclosure. An assembly may include backing plate 3303, busbars 3301 and 3302, a relay layer (e.g., an array of branch relays 3310 affixed to busbars 3301 or 3302), a deadfront layer (e.g., deadfront 3330), a circuit breaker layer (e.g., an array of branch circuit breakers 3320 each affixed to busbars 3301 or 3302), and a customer deadfront layer (not shown), all arranged in an electrical enclosure.

Figure 38A:
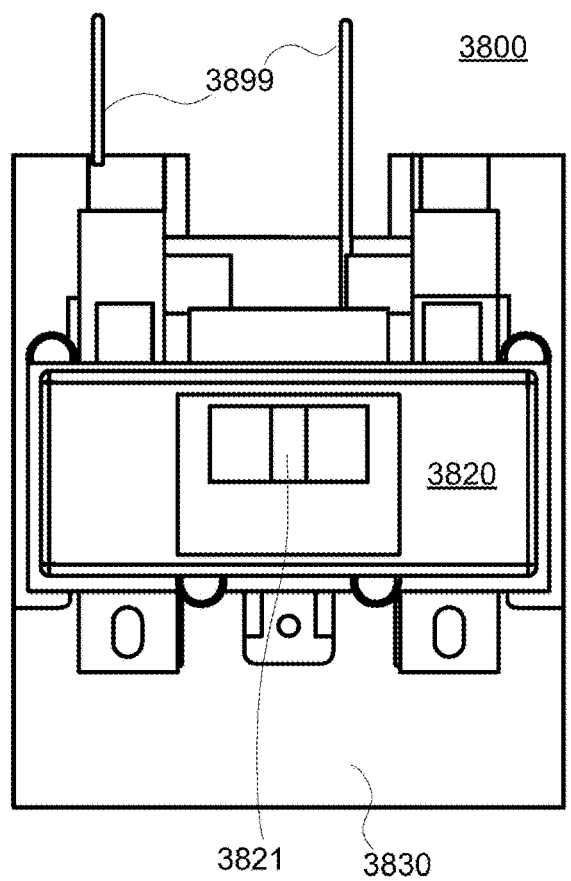
FIG. 38A shows a front view.
Figure 38B:
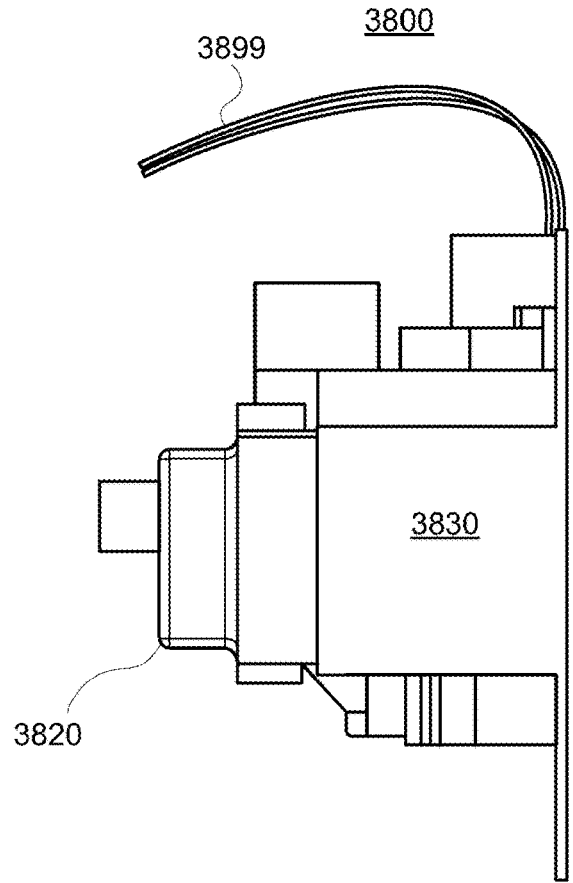
FIG. 38B shows a side view.
Figure 38C:
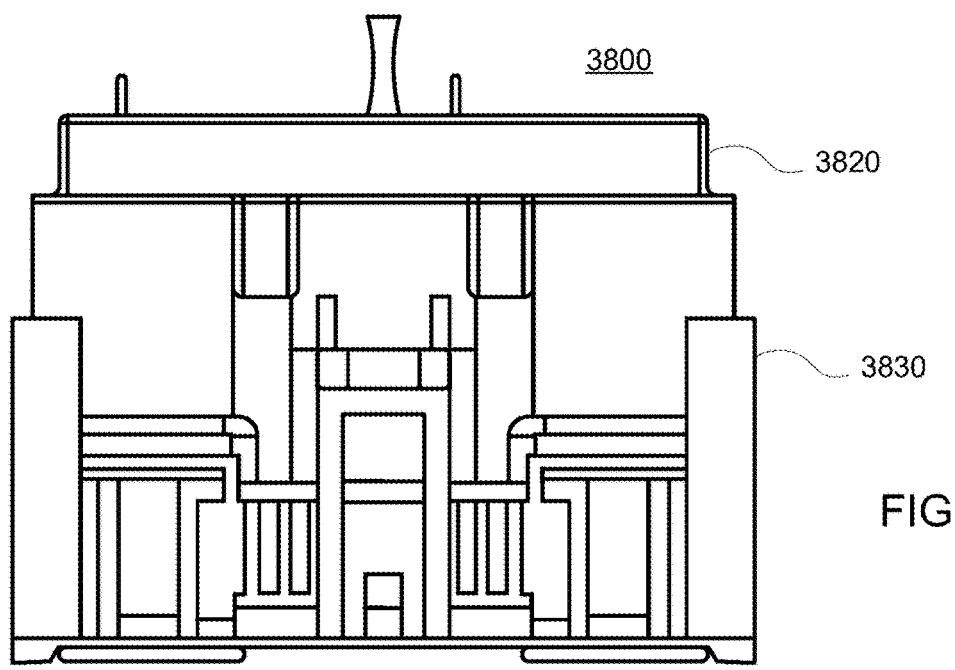
FIG. 38C shows a bottom view.
Figure 38D:
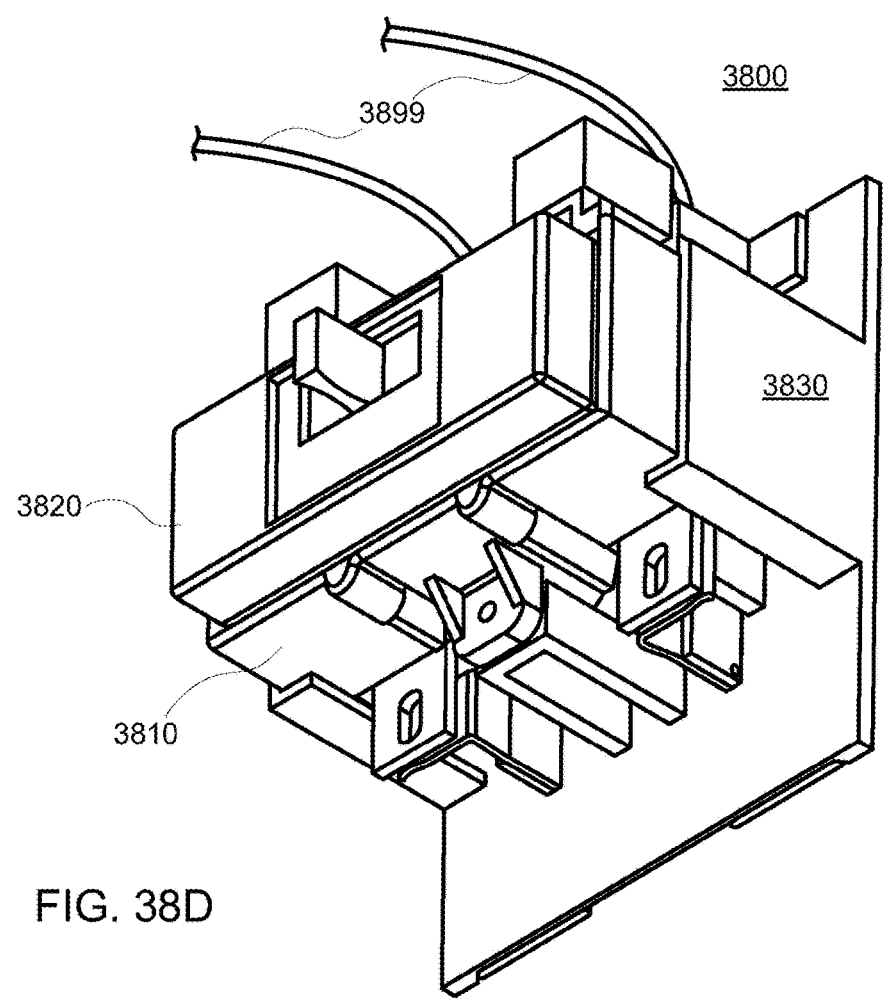
FIG. 38D shows a perspective view.
Figure 38F:
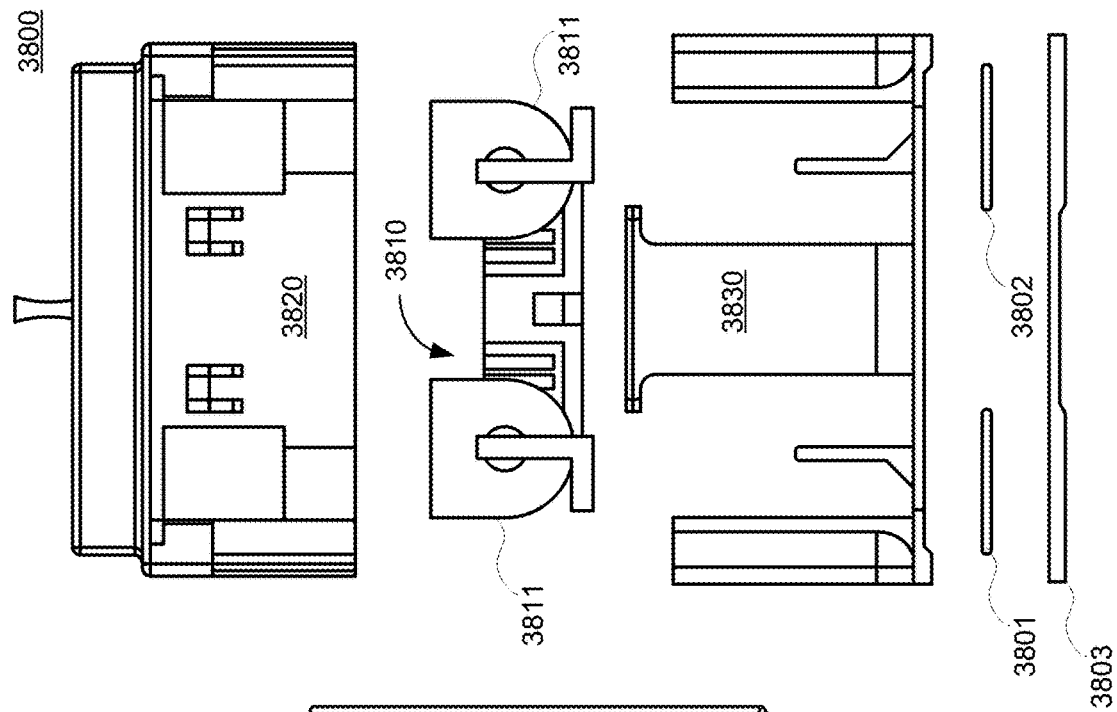
FIG. 38F shows a side exploded view of an illustrative assembly including a relay housing with a main relay installed, a main breaker installed, and busbars, in accordance with some embodiments of the present disclosure.
Figure 38E:
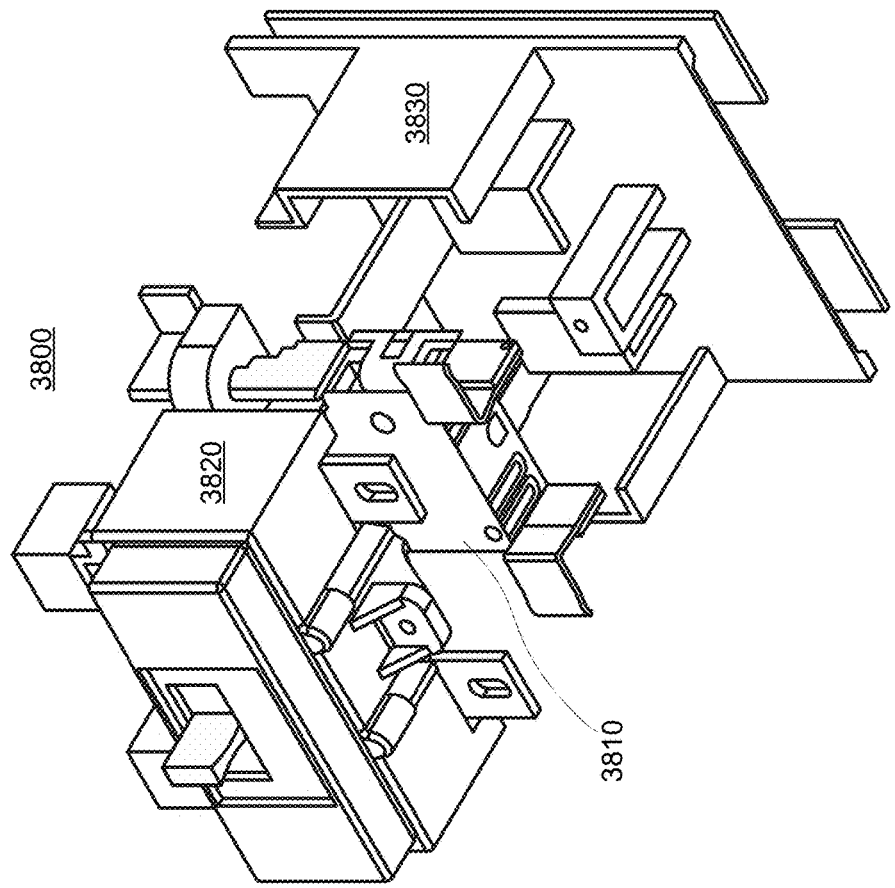
FIG. 38E shows a perspective exploded view.

FIG. 38A shows a front view, FIG. 38B shows a side view, FIG. 38C shows a bottom view, FIG. 38D shows a perspective view, FIG. 38E shows a perspective exploded view, and FIG. 38F shows a side exploded view of an illustrative assembly 3800 including relay housing 3830 with main relay 3810 installed, main breaker 3820 installed, and busbars 3801 and 3802, in accordance with some embodiments of the present disclosure. Main relay 3810 includes two first terminals coupled to two respective busbars 3801 and 3802 (e.g., L1 and L2). Main relay 3810 also includes two second terminals coupled to two respective terminals of main breaker 3820 (e.g., corresponding to L1 and L2 housed by main bus housing 3803). Main breaker 3820 is coupled to L1 and L2 from an electrical meter, for example. Main relay 3810 may also be referred to as an "islanding relay," because it is configured to disconnect the panel and panel circuits from the AC source (e.g., a utility service drop). As illustrated, current sensors 3811 (e.g., current transformers or any other suitable current sensor) are installed on each of L1 and L2 to sense currents in the AC lines. For example, the current sensors may be coupled to control circuitry via wires such that the control circuitry may determine the current in either or both of L1 and L2 (e.g., instantaneous, averaged or otherwise derived current). The two cable portions 3899 illustrated in FIGS. 38A-38D include sensor wires corresponding to the solid core current transformers.

Figure 39:
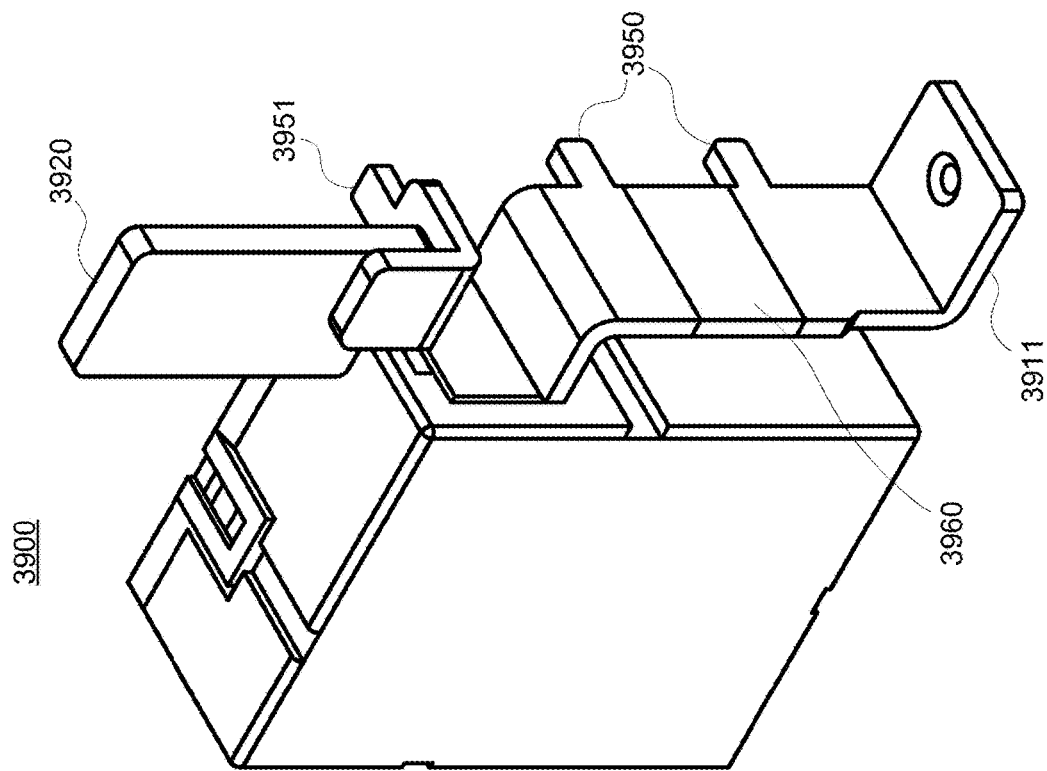
FIG. 39 shows a perspective view of an illustrative branch relay, in accordance with some embodiments of the present disclosure.

FIG. 39 shows a perspective view of illustrative branch relay 3900, in accordance with some embodiments of the present disclosure. Breaker tab 3920 is the secondary terminal (e.g., secondary terminal 3311 of FIGS. 33A-34, to which a branch circuit breaker (e.g., one of branch circuit breakers 3320 of FIGS. 35A-37B) is electrically coupled. Main bus tab 3911 is the first terminal (e.g., first terminal 3312 of FIGS. 33A-34), which is secured to a busbar. Shunt sense pins 3950 may provide electrical terminals to which wires may be affixed (e.g., crimped, soldered, clamped, or otherwise) for measuring a voltage difference across shunt 3960 (e.g., which includes a precise, or precisely known, resistive element). Sense pin 3951 may provide electrical terminals to which a wire may be affixed (e.g., crimped, soldered, clamped, or otherwise) for measuring a voltage at the output of branch relay 3900 (e.g., just before the corresponding branch circuit breaker). For example, sense pin 3951 and shunt sense pins 3950 may be coupled to control circuitry to determine a state of branch relay 3900, an operating condition of branch relay 3900, or any other suitable information about branch relay 3900. Main bus tab 3911 is configured to be secured to a stud of a busbar or a bolt affixed to a busbar. Shunt 3960 may include any suitable material (e.g., a metal or metal alloy such as manganin, a metallic wound wire, a thin dielectric, a carbon film), having any suitable electrical properties (e.g., resistance, impedance, and temperature dependence thereof) and any suitable geometry (e.g., flat, cylindrical, wound, a thin film with electrodes) for measuring an electrical current.

Figure 40:
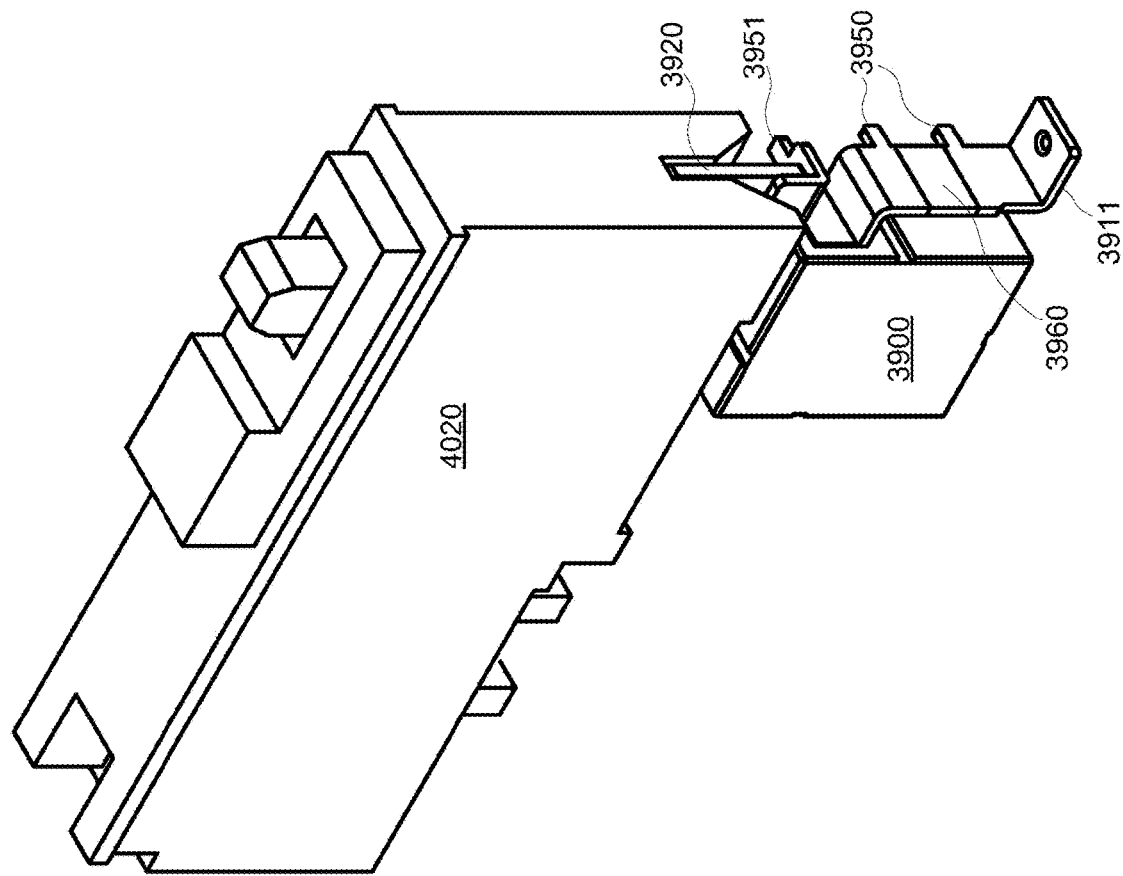
FIG. 40 shows a perspective view of an illustrative branch relay and circuit breaker, in accordance with some embodiments of the present disclosure.

FIG. 40 shows a perspective view of illustrative branch relay 3900 and circuit breaker 4020, in accordance with some embodiments of the present disclosure. Branch circuit breaker 4020 is secured to breaker tab 3920 (e.g., a second terminal). For example, branch circuit breaker 4020 may include a clamp mechanism that clamps breaker tab 3920, thus maintaining electrical contact between branch circuit breaker 4020 and branch relay 3900. In some embodiments, a deadfront (not shown) may physically separate branch circuit breaker 4020 from branch relay 3900, except for openings where breaker tab 3920 protrudes.

Figure 41:
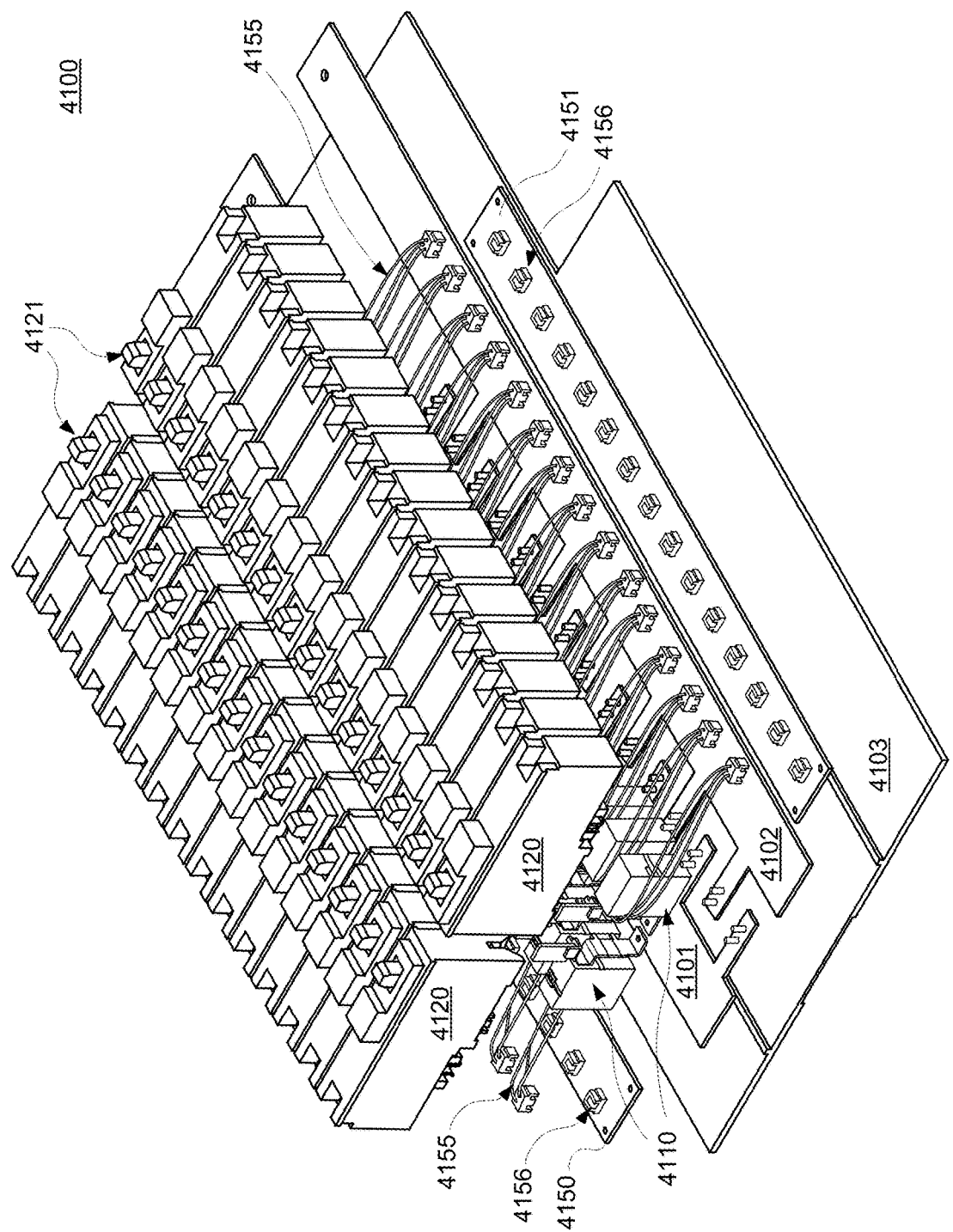
FIG. 41 shows an exploded perspective view of an illustrative panel having branch circuits, in accordance with some embodiments of the present disclosure.

FIG. 41 shows an exploded perspective view of illustrative panel 4100 having branch circuits, in accordance with some embodiments of the present disclosure. As illustrated, no installer deadfront is included in panel 4200, although a deadfront may optionally be included. For example, main busbars 4101 and 4102 may include respective current shunt in the branch extensions (e.g., the structures extending inward to which branch relays 4110 are secured). In a further example, main busbars 4101 and 4102 may include a comb-like structure as illustrated in FIG. 41, and each extension configured to secure one of branch relays 4110, which may include a current shunt with sense pins or terminals to determine a branch current based on voltage drop across the shunt. In some embodiments, each of branch relays 4110 may include electrical terminals configured to engage with an electrical connector (e.g., of a wiring harness), to engage with individual terminating connectors of a wire bundle or cable, to be soldered to, any other suitable electrical interface, or any combination thereof. Branch circuit breakers 4120 may be installed, and be electrically coupled to second terminals of each branch relay 4110 to provide protected AC power. For example, each branch circuit breaker 4120 includes a terminal to which a wire may be secured (e.g., to provide AC voltage). An outer deadfront (not shown) may be installed to cover branch circuit breakers 4120, providing access only to circuit breaker toggles 4121, which a user may interact with. In some embodiments, each of branch circuit breakers 4120 may engage busbar 4101 or 4102 and include a single output terminal, and the corresponding neutral wire may terminate at a neutral bus bar having a screw terminal, for example. Any suitable type of branch circuit breaker 4120 may be included (e.g., a manual breaker, a controllable breaker, a cheater breaker, a di-pole breaker), having any suitable capacity or operating characteristics, in accordance with some embodiments of the present disclosure. An assembly may include backing plate 4103, busbars 4101 and 4102, a relay layer (e.g., an array of branch relays 4110 affixed to busbars 4101 or 4102), a deadfront layer (e.g., not shown), a circuit breaker layer (e.g., an array of branch circuit breakers 4120 each affixed to busbars 4101 or 4102), and a customer deadfront layer (not shown), all arranged in an electrical enclosure. In some embodiments, as illustrated, wires 4155 may be configured to transmit sensor signals (e.g., voltage signals) from a current shunt integrated into each relay 4110 to connectors 4156 of control boards 4150 and 4151 (e.g., which may determine current based on the voltage drop across the shunt). In some embodiments, as illustrated, wires 4155 may be configured to transmit relay control signals from control boards 4150 and 4151 to suitable terminals of branch relays 4110.

Figure 42:
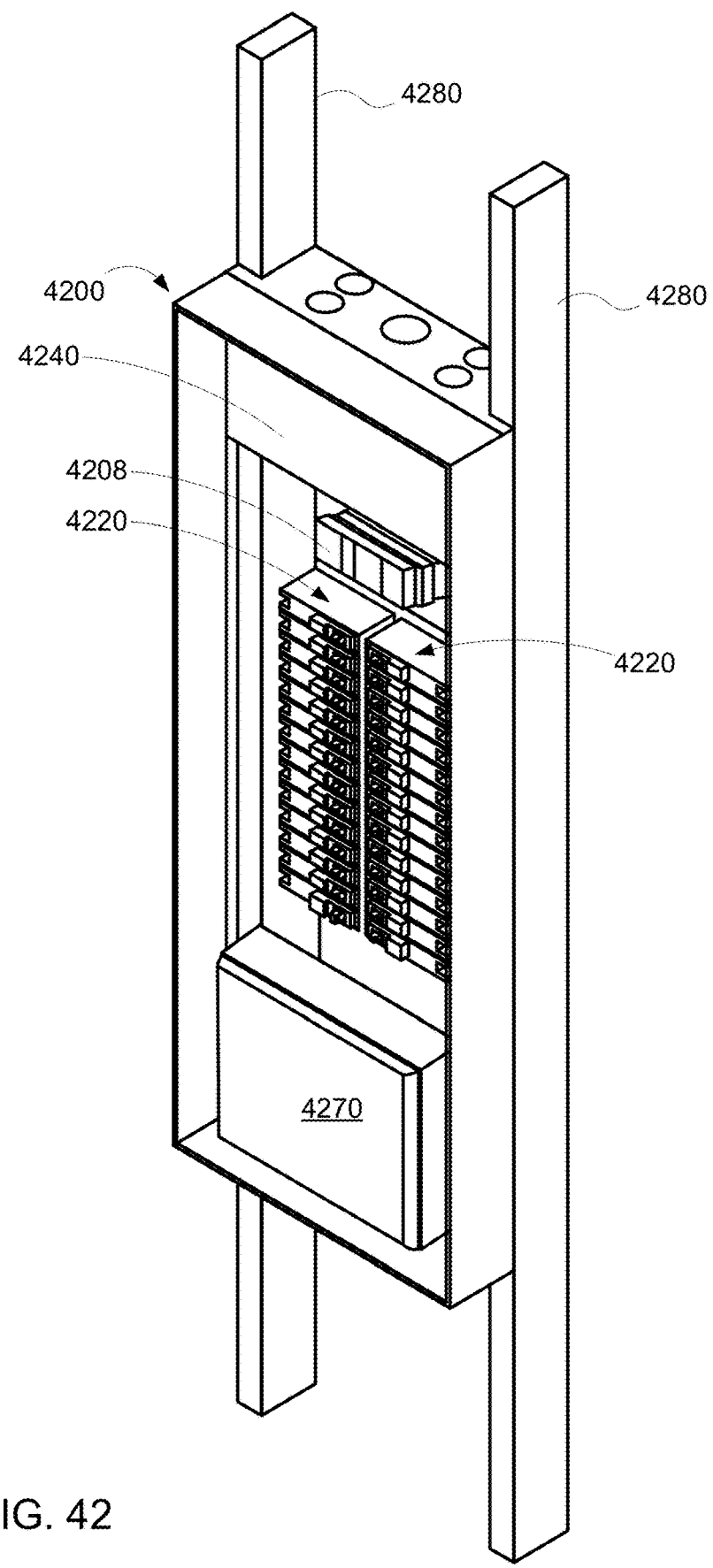
FIG. 42 shows a perspective view of an illustrative installed panel having branch circuits, a main breaker, and an autotransformer, in accordance with some embodiments of the present disclosure.

FIG. 42 shows a perspective view of illustrative installed panel 4200 having branch circuits 4220, a main breaker 4208, and autotransformer 4290, in accordance with some embodiments of the present disclosure. Several components are not shown in FIG. 42 for clarity including, for example, a customer deadfront, a panel front, incoming conduit and AC lines, and outgoing branch circuit conduits and corresponding wires. In some embodiments, electrical panel 4200 is configured to be installed in a residential structure (e.g., between sixteen-inch-spaced wall two-by-fours 4280). As illustrated, main lines L1 and L2, and the neutral line are introduced through the top of panel 4200 (e.g., in conduit coupled to a knockout in the panel top), from an electrical meter. The main lines are then routed to main breaker 4208, to the main relays (not shown), to the main busbars, to the branch relays having shunts, to the branch circuit breakers, and finally to the branch circuits (e.g., the residential wiring and outlets and ultimately electrical loads). As illustrated, autotransformer 4270 is included, and coupled to an external device (not shown). The external device may include an inverter (e.g., from a solar PV installation) or other non-grid AC source. In some embodiments, the autotransformer has a fixed winding ratio (e.g., a fixed voltage ratio). In some embodiments, autotransformer 4270 has a variable and controllable winding ratio (e.g., a variable voltage ratio). For example, autotransformer 4270 may be coupled to the main busbars and neural line via relays. When grid-connected, autotransformer 4270 may be disconnected from the busbars and neutral. When islanding, main relays and/or breaker 4208 may be opened, and autotransformer 4270 relays are closed, thus electrically coupling the branch circuit neutrals to an inverter neutral, and coupling the main busbars to lines of the inverter with suitable voltage conversion at the autotransformer.

Computer 4240 illustrated in FIG. 42 includes control circuitry configured to manage and control aspects of the electrical panel. For example, computer 4240 may be configured to control the throw position of one or more main relays (e.g., coupled to main breaker 4208), one or more branch relays, any other suitable relay or controllable switch, or any combination thereof (e.g., of branch circuits 4220). In a further example, computer 4240 may be configured to receive analog signals from a sense pin (e.g., to determine a state of a relay), shunt sense pin (e.g., to determine a current), a current sensor (e.g., to determine a current), a voltage sensor (e.g., to determine a voltage), a temperature sensor (e.g., to determine a surface, component, or environmental temperature), any other suitable signal, or any combination thereof. Computer 4240 may include a power supply, a power converter (e.g., a DC-DC, AC-AC, DC-AC, or AC-DC converter), a digital I/O interface (e.g., connectors, pins, headers, or cable pigtails), an analog-to-digital converter, a signal conditioner (e.g., an amplifier, a filter, a modulation), a network controller, a user interface (e.g., a display device, a touchscreen, a keypad), memory (e.g., solid state memory, a hard drive, or other memory), a processor configured to execute programmed computer instructions, any other suitable equipment, or any combination thereof. In some embodiments, panel 4200 of FIG. 42 includes one or more control boards coupled to branch relays, main relays, and the computer. In some embodiments, computer 4240 is coupled directly to branch relays, main relays, sensors, any other suitable components of the panel, or any combination thereof.

In an illustrative example, in the context of FIGS. 31-42, an electrical panel may allow branch circuit monitoring. In some embodiments, high-accuracy branch circuit monitoring may be achieved, because each circuit is populated with an integrated shunt (e.g., with a calibrated resistive element) configured to measure the current flowing through each circuit. Electrical power in each branch circuit may be determined based on the current and voltage. For each branch circuit, this functionality provides the ability to perform in-line measurement of real power, reactive power, energy, any other suitable parameters, or any combination thereof. In some embodiments, for the mains (e.g., L1 and L2) entering the panel, high-accuracy solid-core current sensors (e.g., current shunts) are assembled on each busbar to provide energy metering on each branch circuit (e.g., whole-home metering). In some embodiments, the control boards are designed to accommodate pre-assembled shunts, split-core CT inputs (e.g., to measure retrofitted PV circuits, sub-panel, or other similar devices connected to the panel), or both.

In an illustrative example, in the context of FIGS. 31-42, an electrical panel may allow branch circuit control. In some embodiments, each branch circuit is fitted with a controllable relay that is directly mounted on a main busbar thus allowing for individual circuit level controls. In some embodiments, the branch relay's inputs allow for easy installation within an electrical panel and the breaker tabs are designed to accommodate standard molded-case circuit breakers. In some embodiments, each relay is actuated independently and in real-time by control circuitry, thus allowing for software-defined load controls within the panel. In some embodiments, relays are designed such that the only exposed component of the panel to the installer is the breaker tab where the branch circuit breaker is mounted (e.g., the installer deadfront hides the remaining portion of the relay). In some embodiments, the branch relay breaker tab is provided with a sense pin configured to detect the throw position of the relay in real-time (e.g., on or off based on the voltage at the sense pin). A relay may have any suitable rating, capacity, or operating characteristics, in accordance with some embodiments of the present disclosure. In an illustrative example, a branch relay may be rated to 90A (e.g., higher than a typical residential circuit or circuit breaker), which allows for the branch circuit breaker to operate normally as the passive safety device.

In an illustrative example, in the context of FIGS. 31-42, an electrical panel may have an architecture that allows branch level sensing and actuation. In some embodiments, the branch level sensing and actuation is achieved using a control board. In some embodiments, the control board is configured to receive analog signals from a plurality of shunt resistors. In some embodiments, the control board may include relay drivers configured to receive control signals from control circuitry (e.g., low-voltage DC signals generated by a gateway computer). A control board may include an analog-to-digital converter, a digital I/O interface, a power supply or power conversion module, any other suitable components or functionality, or any combination thereof. In some embodiments, an electrical panel includes two control boards, arranged one on either side of the interior of the panel and each with the ability to manage a plurality of circuits (e.g., simultaneously). For example, a panel may include twenty circuit branches on each side of the panel. In some embodiments, a busbar configuration allows for inter-changing lines L1 and L2 connections, making it possible to connect a di-pole breaker (e.g., for a 240 VAC branch coupled to both L1 and L2). In some embodiments, one or more control boards and associated control logic allow for configuring current sensors and relay actuators in groups or clusters. For example, a relatively large load connected to a di-pole breaker could be configured to be treated as a single branch for the purposes of energy metering and load controls. In some embodiments, control boards are connected to a main board (e.g., a carrier board) that is capable of performing additional computations as well as supporting software applications.

In an illustrative example, in the context of FIGS. 31-42, an electrical panel may include one or more autotransformer (e.g., a single winding transformer). Many solar/hybrid inverters require an external autotransformer to provide a neutral reference for phase-balanced loads. In some embodiments, an electrical panel includes an autotransformer that is enabled/sourced (e.g., through a pair of relays) during off-grid operations (e.g., when islanding). In some embodiments, the control circuitry may include control logic that ensures that the autotransformer is only connected to one or more busbars during off-grid operations. In some embodiments, an electrical panel is designed to provide suitable cooling for an autotransformer. For example, cooling may be achieved by passive or active cooling elements such as fins, fans, heat exchangers, any other suitable components, or any combination thereof. An autotransformer may include a fixed primary-secondary voltage ratio, or may include a variable primary-secondary voltage ratio. In an illustrative example, a solar PV inverter may provide a first AC voltage, which may be reduced by the autotransformer to match the line-neutral voltage between a busbar and the neutral of the panel. Accordingly, the solar PV system need not output the same AC voltage as required by electrical loads.

In an illustrative example, in the context of FIGS. 31-42, an electrical panel may include one or more busbars. Each busbar may be designed to easily couple to a main breaker and a main relay, as well as a plurality of branch circuit breakers through a plurality of branch relays having corresponding shunt resistors. In some embodiments, a busbar may include or having installed with threaded studs (e.g., pem studs) to allow for easy alignment and assembly with each branch relay while ensuring that the L1, L2 configuration inside a panel is preserved (e.g., to meet industry standards). In some embodiments, a busbar is designed with terminals (e.g., spring terminals or screw terminals) to allow devices such as sub-panels to be powered from the panel without the need for branch circuit breakers.

In an illustrative example, in the context of FIGS. 31-42, an electrical panel may include one or more deadfronts. In some embodiments, the sensing and relay actuation mechanism and control boards are assembled underneath an installer deadfront to ensure that the installation process is simplified/modular. In some embodiments, a neutral bar is mounted on the installer deadfront to allow plug-on neutral breakers to both be aligned with and serve as a path of current return for each circuit. In some embodiments, the only exposed portions of the relays are the breaker tabs to which the branch circuit breakers are mounted to. In some embodiments, an electrical panel includes a customer deadfront that goes in front of the breakers and the load wiring which only exposes the breaker toggles to the customer (e.g., a panel may, but need not, include an installer deadfront and a customer deadfront). In some embodiments, a status light for each branch circuit is embedded on the customer deadfront for ease of debugging the system as well as providing visual feedback on the status of individual circuits. For example, a plurality of LEDs may be included on the deadfront, and the LEDs may be wired to control circuitry configured to turn the LEDs on and off. In a further example, LEDs may include LEDs of different colors, size, or shape configured to indicate various states of the panel or circuits coupled thereto.

The systems and methods of the present disclosure may be used to, for example, provide circuit level prediction for load forecasting, managed backup controls and energy optimization using main circuit, branch circuit and/or appliance controls, dynamic time-remaining estimates incorporating circuit-level load and forecasting (e.g., solar forecasting), software-configured backup with real-time feedback, hardware safety for phase imbalance or excessive phase voltage in a panelboard serving an islanded electrical system, a plurality of metering circuits connected to common circuitry, monitoring of current transducers associated with one busbar, firmware updates of an electrical panel, a connection to distributed energy resources, a connection to appliances, third-party application support for distributed energy and home automation, grid health monitoring, energy reserve, and power flow management, any other suitable functionality, or any combination thereof.

The consumption of a home is predicted using high-frequency, short-term load forecasting on a circuit level, an appliance level, or both. High frequency measurements on the circuit level may be disaggregated to identify individual appliances using, for example, a non-intrusive (e.g., appliance level) load monitoring algorithm. Information on circuit usage, appliance usage, consumption, or a combination thereof are extracted from the data and used to group the circuits and/or appliances into different categories using a clustering/classification algorithm to identify similar usage and consumption pattern. Depending on the category, a different forecast model is applied to account for specific consumption characteristics. The circuit/appliance level load predictions are aggregated to the household level.

In an illustrative example, measurements of current for each circuit branch and bus voltages may be used to determine electrical load at a given time, or over time, in a circuit. Information such as which appliances are connected to each branch, the temporal or spectral character of the current draw for those appliances, historical and/or current use information (e.g., time of day, frequency of use, duration of use), or any other suitable information may be used to disaggregate branch level measurements.

Figure 43:
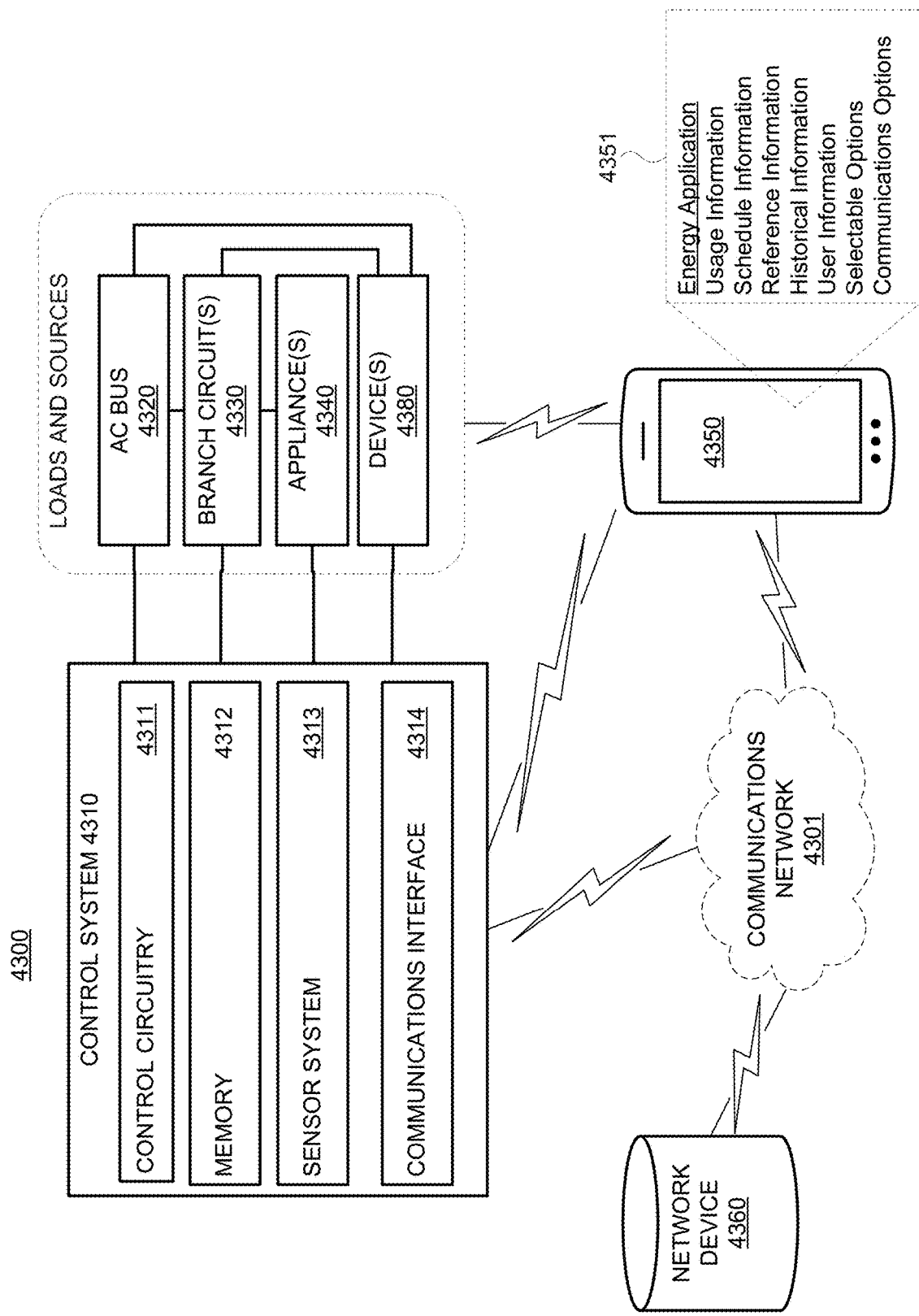
FIG. 43 shows an illustrative system for managing electrical loads, in accordance with some embodiments of the present disclosure.

FIG. 43 shows illustrative system 4300 for managing electrical loads, in accordance with some embodiments of the present disclosure. System 4300 includes control system 4310, AC bus 4320, one or more branch circuits 4330, one or more appliances 4340, one or more devices 4380, user device 4350, and network device 4360. Sensors may be coupled to control system 4310, AC bus 4320, one or more branch circuits 4330, one or more appliances 4340, one or more devices 4380, or a combination thereof, and provide sensor signals to sensor system 4313. Control system 4310, as illustrated, includes control circuitry 4311, memory 4312, sensors system 4313 (e.g., which may include any component described herein for measuring current, voltage, or other electrical signals, and any suitable sensor interface), communications interface 4314. Also, as illustrated, control system 4310 is coupled to AC bus 4320 (e.g., for voltage measurement, and main disconnect control), one or more branch circuits 4330 (e.g., for current measurement, breaker/relay control, or both), one or more appliances 4340 (e.g., to determine an appliance identifier (ID), directly control appliance operation, retrieve applicant information), or a combination thereof.

User device 4350, illustrated as smartphone, is coupled to communications network 4301 (e.g., connected to the Internet). User device 4350 may be communicatively coupled to communications network 4301 via USB cables, IEEE 1394 cables, a wireless interface (e.g., Bluetooth, infrared, WiFi), any other suitable coupling or any combination thereof. In some embodiments, user device 4350 is configured to communicate directly with control system 4310, one or more appliances 4340, network device 4360, any other suitable device, or any combination thereof using near field communication, Bluetooth, direct WiFi, a wired connection (e.g., USB cables, ethernet cables, multi-conductor cables having suitable connectors), any other suitable communications path not requiring communication network 4301, or any combination thereof. User device 4350 may implement energy application 4351, which may send and receive information from communication interface 4314 of control system 4310. Energy application 4351 may be configured to store information and data, display information and data, receive information and data, analyze information and data, provide a visualization of information and data, otherwise interact with information and data, or a combination thereof. For example, energy application 4351 may interact with usage information (e.g., electrical load over time, electrical load per branch circuit), schedule information (e.g., peak usage, time histories, duration histories, planned operation schedules, predetermined interruptions), reference information (e.g., a reference usage schedule, a desired usage schedule or limit, thresholds for comparing operation parameters such as current or duration), historical information (e.g., past usage information, past fault information, past settings or selections, information from a plurality of users, statistical information corresponding to one or more users), energy information (e.g., energy source identification, power supply characteristics), user information (e.g., user demographic information, user profile information, user preferences, user settings, user generated settings for responding to faults), any other suitable information, or any combination thereof. In some embodiments, energy application 4351 is implemented on user device 4350, network device 4360, or both. For example, energy application 4351 may be implemented as software or a set of executable instructions, which may be stored in memory storage of the user device 4350, network device 4360, or both and executed by control circuitry of the respective devices.

Network device 4360 may include a database (e.g., including usage information, schedule information, reference information, historical information, energy information, user information), one or more applications (e.g., as an application server, host server), or a combination thereof. In some embodiments, network device 4360, and any other suitable network-connected device, may provide information to control system 4310, receive information from control system 4310, provide information to user device 4350, receive information from user device 4350, provide information to one or more appliances 4340, receive information from appliances 4340, or any combination thereof.

Device(s) 4380 may include, for example, a battery system, an electric vehicle charging station, a solar panel system, a DC-DC converter, an AC-DC converter, and AC-AC converter, a transformer, any other suitable device coupled to an AC bus or DC bus, or any combination thereof. For example, device(s) 4380 may be configured to communicate directly with, or via communication network 4301 with, any of control system 4310, user device 4350, one or more appliances 4340, and network device 4360.

In an illustrative example, system 4300, or control system 4310 thereof, may be configured to implement any of the illustrative use cases of table 2300 of FIG. 23. In a further example, system 4300, or control system 4310 thereof, may be configured to implement IoT arrangement 2400 of FIG. 24. In a further example, system 4300, or control system 4310 thereof, may be configured to implement process 2500 of FIG. 25.

In an illustrative example, control system 4310 may use labels or identifiers provided by the installer, retrieved from a device, or otherwise received to provide backing context to a disaggregation algorithm (e.g., energy application 4351). Because the branch circuits are individually monitored and controlled, the load in each circuit may be classified, modeled, or otherwise characterized based on the intended use (e.g., kitchen appliances, lighting, heating), thus reducing the algorithmic complexity required for control system 4310 to associate measured electrical characteristics with reference load types. To illustrate, control system 4310 may receive at least one sensor signal from sensor system 4313 configured to measure one or more electrical parameters corresponding to one or more branch circuits 4330. Control system 4310 associates one or more of branch circuits 4330 with reference load information (e.g., stored in memory 4312), which can include expected load (e.g., peak load, maximum load, power factor, startup transients, duration or other temporal characteristics), capacity information, any other suitable information, or any combination thereof. Based on the sensor signal received at, or generated by, sensor system 4313, control system 4310 (e.g., control circuitry 4311 thereof) determines a respective electrical load in the one or more branch circuits based on the sensor signal. Control system 4310 (e.g., control circuitry 4311 thereof) disaggregates more than one load on a branch circuit based at least in part on the reference load information and based at least in part on the respective electrical load in the one or more branch circuits. Control system 4310 (e.g., control circuitry 4311 thereof) controls a respective controllable element (e.g., a controllable breaker or relay) to manage the respective electrical load in each respective branch circuit. To illustrate, control system 4310 (e.g., control circuitry 4311 thereof) identifies which components are loading a particular branch circuit (e.g., based on an expected power or current profile). To illustrate further, control system 4310 (e.g., control circuitry 4311 thereof) forecasts power or current behavior of a particular branch circuit based on the loads coupled to the branch circuitry (e.g., for which reference load information if available). In some embodiments, control system 4310 (e.g., control circuitry 4311 thereof) identifies an event associated with a power grid coupled to one or more branch circuits 4330 (e.g., via AC bus 4320), determines operating criteria based on the event, and disconnects or connects branch circuits of one or more branch circuits 4330 based on the operating criteria. As an illustrative example, control system 4310 may use disaggregated load identifications to anticipate inverter overload before an overload occurs by projecting out power demand for each active appliance in a household based on those appliances' cyclic power characteristics, historical usage information of the appliances, and disconnect circuits in order to prevent said overload.

In some embodiments, a first step includes control circuitry 4311 causing user-defined circuits (e.g., one or more of branch circuits 4330) to be automatically disconnected in different stages to reduce power consumption. In some embodiments, a first set of loads (e.g., less critical loads, or highly draining loads) are disconnected as soon as the system goes off-grid (e.g., AC bus 4320 is disconnected from a power grid). Accordingly, the other stages are then connected or disconnected as soon as pre-defined battery state of charge levels are reached (e.g., by a battery system of devices 4380 coupled to AC bus 4320 via an AC-DC converter of devices 4380). The state of each branch or main circuit can optionally be changed by a user (e.g., by interacting with communications interface 4314) or control system 4310 in real-time. In some embodiments, control system 4310 monitors and/or manages phase imbalance (e.g., among two phases loaded equally exceeding an inverter's output capability, or on a single phase) to extend uptime (e.g., during backup an energy optimization is used in the second step), avoid inverter overload, preserve power to systems deemed critical, or a combination thereof. In some embodiments, optimal or otherwise determined load shifting and/or curtailment measures for one or more appliances 4340 are identified based on, for example, load forecast, solar power prediction, user preferences, appliance information, or a combination thereof. In some embodiments, control system 4310 communicates (directly or indirectly) with individual devices (e.g., one or more appliances 4340, devices 4380) to adjust the power level and operating time (e.g., in the event of a grid blackout or other power disruption).

Figure 44:
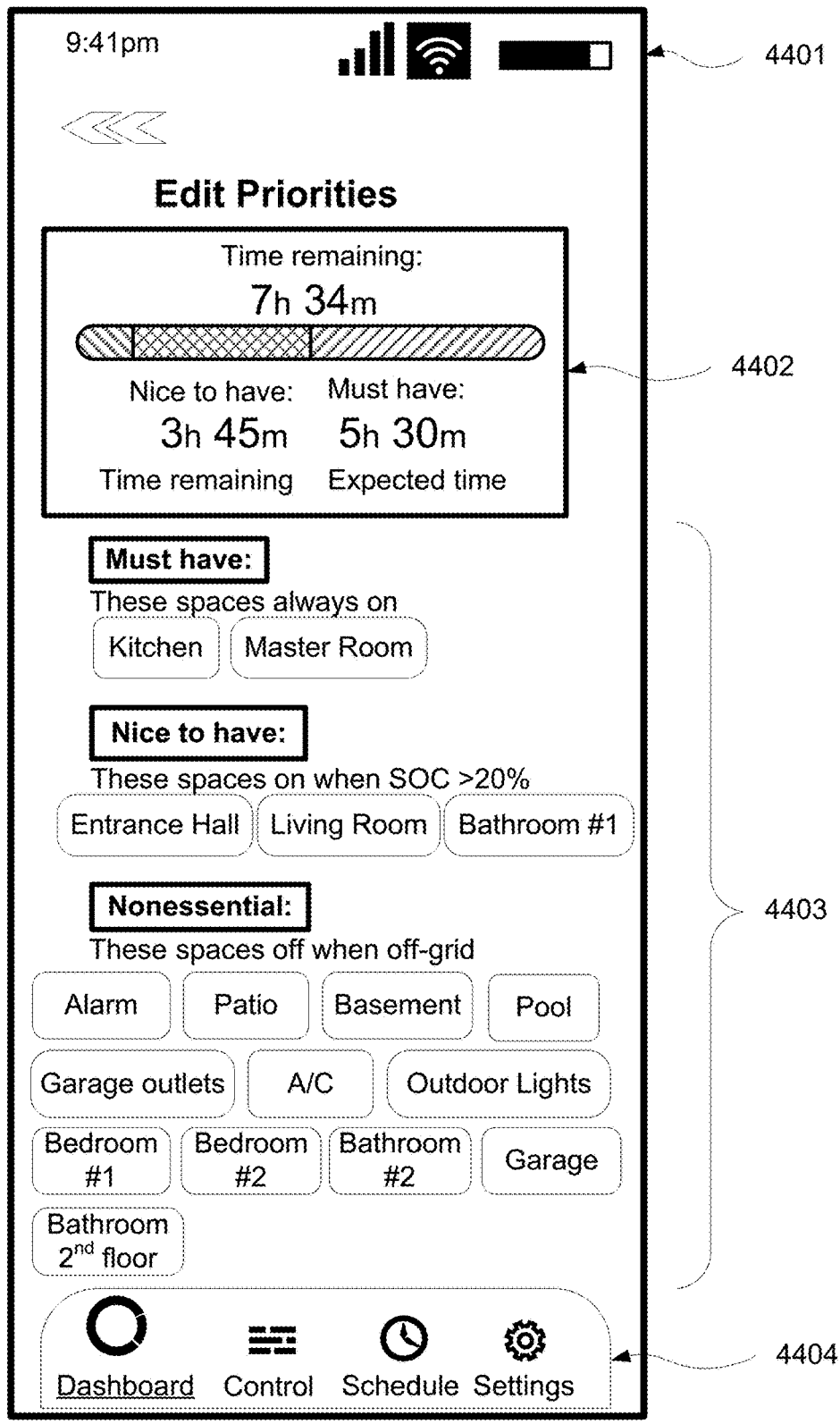
FIG. 44 shows an illustrative graphical user interface (GUI), including an indication of system characteristics, in accordance with some embodiments of the present disclosure.

FIG. 44 shows illustrative graphical user interface (GUI) 4400, including an indication of system characteristics, in accordance with some embodiments of the present disclosure. In an illustrative example, GUI 4400 may be generated by a user device (e.g., user device 4350 of FIG. 43), implementing an application (e.g., energy application 4351 of FIG. 43), on a screen of the user device (e.g., or another suitable device). To illustrate, GUI 4400 may be displayed on a touch screen of a smartphone, a screen included in an interface of control system 4310, any other suitable device, or any combination thereof. As illustrated, GUI 4400 includes user device status information 4401, which may include, for example, time, date, communications signal strength, network communications strength, user device battery life, user device notifications, warnings, any other status information, or any combination thereof. As illustrated, GUI 4400 includes time estimates 4402, which may include, for example, an estimated time duration of power supply, an estimated operating life of a load or source, an estimated remaining time, a graphic illustrating power allocation, a graphic illustrating operating life for classes of loads (e.g., "must have," "nice to have," and "nonessential"), an amount of energy allotted or remaining for a load, any other information indicative of use of a finite power source (e.g., a battery pack during a grid disconnect), or any combination thereof. As illustrated, GUI 4400 includes circuit classifier 4403, which may include, for example, an already classification of loads or branch circuits, selectable options for classifying loads or branch circuits, descriptions of each classification (e.g., "must have," "nice to have," and "nonessential" as illustrated), any other information indicative of classification or options related to classification, or any combination thereof. For example, a user may drag the icons for each circuit (e.g., "pool" or "basement", etc.) to any classification to modify the electric power allotment and scheduling. As illustrated, GUI 4400 includes options 4404, which may include, for example, dashboard (e.g., the screen illustrated in FIG. 44), control options (e.g., for adjusting energy scheduling, user profile information, device information, communication information, time durations, instructions for managing energy loads, or a combination thereof), scheduling options (e.g., for scheduling disconnection and connection of branch circuits, maintenance, disconnection from grid, updating of software, storage of data), any other options for interacting with GUI 4400, or any combination thereof.

In some embodiments, control system 4310 (e.g., control circuitry 4311 thereof) executes an algorithm that generates real-time estimates of remaining time in backup for residences having a backup battery system, a illustrated via GUI 4400 of FIG. 44 (e.g., generated by an interface of control system 4310 or a user's mobile device). In some embodiment, the algorithm takes into account instantaneous power draw from individual circuits in the house (e.g., each branch circuit), load forecasting based on historical data from those same circuits (e.g., or from other users based on statistical analysis), solar forecasting based on historical data, weather forecasts (e.g., provided by third parties), any other suitable information or forecast based on information, or any combination thereof. For example, as user behavior patterns change or loads are switched on/off by control system 4310, the estimates and settings illustrated in GUI 4400 of FIG. 44 may change in real time.

In some embodiments, control system 4310 includes real-time switching and metering capability for each circuit in a house, as well as the ability to island the house from the grid during grid outages. For example, control system 4310 provides the ability to configure which circuits will be powered while off-grid through a user interface (e.g., energy application 4351 of FIG. 43, GUI 4400 of FIG. 44). The system allows this configuration to be achieved in real-time. While the user is configuring which loads will be powered while off-grid, the system utilizes historical measurements from those circuits to provide real-time feedback to the user, including but not limited to: warning of potential overload when too many circuits are configured to be powered; warning of potential phase imbalance; and providing feedback as to the estimated time that the system will be able to power the selected loads. In some embodiments, control system 4310 (control circuitry 4311 thereof) automatically sheds load(s) to prevent overload, ensure continuity of power overnight or through cloudy days, or both. In some embodiments, the operating criteria may include partition of loads indicating which can be shed or in what order loads are shed (e.g., "nice to haves" are shed before "must haves").

In addition, in some embodiments, control system 4310 uses clustering and/or categorization algorithms to identify those loads which are operated in distinct cycles consuming regular amounts of energy, such as dishwashers or electric dryers. In some embodiments, control system 4310 determines average energy usage for each cycle and detects the start of cycles. When a cycle begins while the house is off-grid, for example, control system 4310 notifies the homeowner of the expected change in battery energy level. In some embodiments, control system 4310 notifies the homeowner (e.g., at the user interface) when the battery energy level falls below the amount necessary to run a complete cycle of any of the loads in the house. If In some embodiments, control system 4310 detects the start of a cycle in this condition, it issues a warning to the homeowner that the cycle may not complete.

In some embodiments, system 4300 or other integrated system includes a circuit breaker panelboard designed for connection to both a utility grid as well as a battery inverter (e.g., of devices 4380) or other distributed energy resource, and containing one or more switching devices on the circuit connecting the panelboard to the utility point of connection, as well as switching devices on branch circuits 4330 serving loads. In some embodiments, system 4300 includes voltage measurement means (e.g., voltage sensors coupled to sensor system 4313) connected to all phases of the utility grid side of the utility point of connection circuit switching device, which are connected to logic circuitry (e.g., control circuitry 4311 of control system 4310) capable of determining the status of the utility grid. Furthermore, In some embodiments, control system 4310 may include logic devices capable of generating a signal to cause the switching device to disconnect the panelboard from the utility grid when the utility grid status is unsuitable for powering the loads connected to the panelboard, thereby forming a local electrical system island and either passively allowing or causing (through electrical signaling or actuation of circuit connected switching devices) the distributed energy resource to supply power to this island. In some embodiments, In some embodiments, control system 4310 determines a preprogrammed selection of branch circuits which are to be disabled when operating the local electrical system as an island, in order to optimize energy consumption or maintain the islanded electrical system power consumption at a low enough level to be supplied by the distributed energy resource. In some embodiments, In some embodiments, control system 4310 includes logic that uses forecasts of branch circuit loads, or of appliance loads, or measurements of branch circuit loads, to dynamically disconnect or reconnect branch circuits to the distributed energy resource, or send electrical signals to appliances on branch circuits enabling or disabling them, in order to optimize energy consumption, or maintain the islanded electrical system power consumption at a low enough level to be supplied by the distributed energy resource. In some embodiments, In some embodiments, control system 4310 includes an energy reservoir device, such as one or more capacitors, capable of maintaining logic power and switching device actuation power in the period after the utility grid point of connection circuit switching device has disconnected the electrical system from the utility grid, and before the distributed energy resource begins to supply power to the islanded electrical system, in order to facilitate actuation of point of connection and branch circuit switching devices to effect the aforementioned functions.

In some embodiments, system 4300 or other integrated system includes a circuit breaker panelboard designed for connection to a battery inverter or other distributed energy resource and operating in islanded mode, with the served AC electrical system (e.g., via AC bus 4320) disconnected from any utility grid; the distributed energy resource supplying power to the panelboard being connected to it via a connection incorporating fewer power conductors (hereafter "conductors") than the electrical system served by the panelboard, and said panelboard incorporating or designed for connection to a transformer or autotransformer provided with at least one set of windings with terminals equal in number to the number of conductors of the electrical system served by the panelboard, with said transformer being designed to receive power from a connection incorporating the same number of power conductors as the connection to the distributed energy resource.

In some embodiments, the panelboard incorporates a plurality of electronic hardware safety features and additionally a plurality of electrical switching devices, with said safety features designed to monitor either the difference in voltage of all of the power conductors of the supplied electrical system, or designed to monitor the difference in voltage of each of the conductors of the electrical system with respect to a shared return power conductor ("neutral"), said voltages hereafter termed "phase voltages", or a suitable combination of monitoring of difference in voltages and phase voltages such that the power supply voltage to all devices served by the electrical system is thereby monitored.

In some embodiments, the plurality of safety features are designed to retain safe behavior when subject to a single point component or wiring fault, and intended to entirely disconnect the connection between the distributed energy resource and the panelboard if conditions that could lead to excessive voltages being supplied to any load served by the panelboard are detected.

For example, a panelboard connected to a 240V battery inverter that is provided with two terminals by two conductors, said panelboard incorporating an autotransformer provided with two windings and three terminals, and said panelboard serving an islanded electrical system of the 120V/240V split phase type, where three conductors are used to supply two 120V circuits with respect to a shared neutral return conductor, each of said 120V conductors being supplied with power 180 degrees out of phase with respect to the other, and with said panelboard containing a complement of said safety features, wherein the safety features consist of:

1. A single phase 240V battery inverter containing an overvoltage detection circuit, which disables output of the inverter when excessive voltages are detected.
2. A central voltage imbalance detector circuit, which sends a signal when an imbalance in phase voltage is detected.
3. Two separate actuation circuits associated with two separate switching devices, each switching device being in circuit with the battery inverter.
4. Two voltage amplitude detector circuits, one associated with each switching device, and each monitoring one phase of the electrical system.
5. Said actuation circuits being designed to disconnect the associated switching device if either the central voltage imbalance detector signal is transmitted, or an excessive voltage associated with the monitored electrical system phase is detected, or if the logic power supply to the actuation circuit is lost.
6. Optionally, an energy reservoir associated with each actuation circuit, to enable each actuation circuit to take the action needed to disconnect the switching device after loss of logic power supply to the actuation circuit, especially if the switching device is bi-stable.

In some embodiments, system 4300 uses an energy reservoir and dual-redundant circuitry to cause latching relays to fail-safe open, thus reducing energy consumption (e.g., and heat generation) in components of system 4300 while maintaining single-fault tolerance.

In some embodiments, system 4300 or another integrated system includes an electrical panelboard containing at least one power distribution conductor ("busbar", the term being a placeholder and here incorporating all manner of rigid or flexible power distribution conductors) that distributes power to multiple branch circuits, each branch circuit incorporating current transducers such as current measurement shunts, or non-isolated current transformers, or non-isolated Rogowski coils. Wherein all branch circuits (e.g., one or more branch circuitrs 4330) associated with a given bus bar (e.g., of AC bus 4320) are monitored by a plurality of metering circuits that each measure current or power associated with a given branch circuit or set of branch circuits, said metering circuits being connected together without need for galvanic isolation, and said metering circuits being provided with or incorporating a system of common mode filters, or differential amplifiers, or both, such that the metering circuits are able to produce accurate results from the signals generated by the current transducers even in the presence of transient or steady state voltage differences existing between the transducers of each branch circuit served by the bus bar, which result from voltage differences associated with current flow through the resistive or inductive impedance of the bus bar and branch circuit system, and are coupled to the current transducers either by direct galvanic connection or capacitive coupling, parasitic or intentional.

As described herein, non-isolated is understood to mean the condition which exists between two electrical conductors either when they are in direct electrical contact, or when any insulation or spacing between them is of insufficient strength or size to provide for the functional or safety design requirements which would be needed if one of the conductors were energized by a potential associated with a conductor in the electrical system served by the panelboard, and the other conductor were to be either left floating, or connected to a different potential served by the electrical system.

In some embodiments, system 4300 includes metering circuits that share a common logic or low voltage power supply system.

In some embodiments, system 4300 includes a power supply system that is galvanically bonded to the busbar (e.g., of AC bus 4320) at one or more points.

In some embodiments, system 4300 includes metering circuits sharing a non-isolated communication medium.

In some embodiments, system 4300 includes metering circuits that are collocated on a single printed circuit board, which is physically close to the busbar (e.g., of AC bus 4320) and is sized similarly in length to the bus bar, and in which a printed low voltage power distribution conductor associated with the metering circuits is electrically connected to the bus bar at a single central point, near the middle of the length of the busbar.

In some embodiments, electrical connection to the busbar (e.g., of AC bus 4320) is made by means of a pair of resistances connected between the printed power distribution conductor and each of the leads associated with a single current measurement shunt type of current transducer, which serves one of the branch circuits, said transducer being located close to the middle of the length of the busbar, and with said resistances being sized such that any current flow caused through them by the potential drop across the shunt transducer is negligible in comparison to the resistance of the shunt and the resistances of any connecting conductors that connect the shunt to the resistances, so as not to materially affect the signal voltage produced by the transducer when said current flows.

In some embodiments, a pair of systems are used (e.g., two control systems 4310 and two sets of loads and sources), one associated with each line voltage bus bar of a split phase 120V/240V electrical panelboard. For example, each of the systems is connected to a central communication device or computing device by means of a galvanically isolated communications link, and in which each system is served by a separate, galvanically isolated power supply.

In some embodiments, an Internet-connected gateway computer serves as a home energy controller and also distributes over-the-air firmware updates to connected devices throughout the house. The computer is capable of receiving over-the-air firmware updates through wired and wireless Internet connections. A genericized firmware update process allows firmware packages for connected distributed-energy resources, including but not limited to solar inverters, hybrid inverters, and batteries, as well as home appliances to be included in the firmware update package for the gateway, such that the gateway can then update those devices and appliances. To illustrate, control system 4310 may distribute over-the-air communications (OTAs) through powerline communication, wireless communication, Ethernet networks, serial buses, any other suitable communications link, or any combination thereof.

In some embodiments, an Internet-connected gateway computer, serving as an energy management system (EMS) for a residence, runs programs ("apps") compiled for the computer by third parties intended to contribute to the management of the distributed energy resources in the residence, and provides those programs with measurements and control capabilities over those distributed energy resources. Information is exchanged between programs through a secure internal API.

The foregoing is merely illustrative of the principles of this disclosure and various modifications may be made by those skilled in the art without departing from the scope of this disclosure. The above described embodiments are presented for purposes of illustration and not of limitation. The present disclosure also can take many forms other than those explicitly described herein. Accordingly, it is emphasized that this disclosure is not limited to the explicitly disclosed methods, systems, and apparatuses, but is intended to include variations to and modifications thereof, which are within the spirit of the following claims.

What is claimed is:

1. A system for managing electrical loads, the system comprising:

a plurality of branch circuits, each branch circuit comprising a respective controllable relay secured to at least one busbar by a respective bus tab, wherein each of the respective controllable relay is configured to engage with a respective branch circuit breaker such that the respective controllable relay is arranged electrically between the at least one busbar and the respective circuit breaker, wherein each bus tab comprises a current shunt and two shunt sense terminals configured to sense one or more electrical parameters corresponding to the current shunt; and control circuitry coupled to each of the respective controllable relay, the control circuitry configured to:
determine respective electrical load information in each branch circuit of the plurality of branch circuits based on the one or more electrical parameters; and
control an electrical load in each branch circuit using the respective controllable relay based on the respective electrical load information.

2. The system of claim 1, wherein the sensor system comprises:
a voltage sensor coupled to the at least one busbar.

3. The system of claim 1, wherein the control circuitry is further configured to forecast an electrical load behavior and switch one or more respective controllable relays of the plurality of branch circuits to manage the electrical load over time.

4. The system of claim 3, where the control circuitry is further configured to forecast an electrical load behavior based on historical electrical load behavior.

5. The system of claim 1, further comprising an energy storage device coupled to the plurality of branch circuits, wherein the control circuitry is configured to manage the electrical load in each branch circuit in response to a power disruption to manage electrical energy stored in the energy storage device.

6. The system of claim 1, wherein the at least one busbar is electrically coupled to the plurality of branch circuits.

7. The system of claim 1, further comprising a main disconnect configured to couple the plurality of branch circuits to a power grid, wherein the control circuitry is configured to control operation of the main disconnect.

8. The system of claim 1, wherein the control circuitry further comprises communications equipment configured to communicate with a network or a mobile device, and wherein the communications equipment is configured to transmit energy information.

9. The system of claim 1, wherein the control circuitry is configured to:
associate each branch circuit with reference load information, wherein the reference load information comprises at least one expected load; and
disaggregate more than one load on at least one branch circuit based at least in part on the reference load information and based at least in part on the electrical load in the at least one branch circuit.

10. The system of claim 1, wherein the control circuitry is further configured to generate a graphical user interface on a display for displaying information indicative of the respective electrical load in each respective branch circuit.

11. The system of claim 10, further comprising a touchscreen coupled to the control circuitry, wherein the touchscreen comprises the display and is configured to receive haptic input.

12. The system of claim 1, wherein the control circuitry is further configured to determine energy information about the electric load in each branch circuit.

13. The system of claim 1, wherein the sensor system comprises one or more main current sensors for sensing current in the at least one busbar coupled to the plurality of branch circuits, wherein the control circuitry is further configured to determine the total current flow between the at least one busbar and a power grid based on a signal from the one or more main current sensors.

14. The system of claim 1, further comprising:
one or more main current sensors for sensing current in the at least one busbar coupled to the plurality of branch circuits wherein:
the at least one busbar is coupled to a power generation source; and
the control circuitry is further configured to transmit information based on a signal from the one or more main current sensors to the power generation source for the purpose of modifying at least one of a quantity of power generated, a quantity of power consumed, or a quality of power generated, so that the system achieves a target current flow between the at least one bus bar and the power generation source.

15. A method for managing electrical loads within an integrated electrical panel comprising a sensor system, one or more branch circuits each comprising a respective controllable relay secured to at least one busbar by a respective bus tab, wherein each of the respective controllable relay is configured to engage with a respective circuit breaker such that the respective controllable relay is arranged electrically between the at least one busbar and the respective circuit breaker, and wherein each bus tab comprises a current shunt and two shunt sense terminals configured to sense one or more electrical parameters corresponding to the current shunt, the method comprising:
receiving, at control circuitry, at least one sensor signal corresponding to one or more current shunts of one or more branch circuits;
associating the one or more branch circuits with reference load information, wherein the reference load information comprises at least one expected load;
determining, at the control circuitry, a respective electrical load in the one or more branch circuits based on the sensor signal;
disaggregating more than one load on at least one branch circuit based at least in part on the reference load information and based at least in part on the respective electrical load in the one or more branch circuits; and
controlling the respective controllable relay to manage the respective electrical load in each respective branch circuit.

16. The method of claim 15, further comprising:
identifying an event associated with a power grid coupled to the one or more branch circuits;
determining operating criteria based on the event; and
disconnecting or connecting the one or more branch circuits based on the operating criteria.

17. The method of claim 15, wherein the reference load information comprises load information corresponding to at least one of an appliance, a user device, an energy storage device, or an energy source.

18. The method of claim 15, wherein controlling the respective controllable relay to manage the respective electrical load in each respective branch circuit comprises:
determining operating criteria based on the reference load information; and
managing activation and de-activation of the respective controllable relay based on the operating criteria.

19. The method of claim 15, further comprising storing energy information based on the respective electrical load in the one or more branch circuits.

20. A non-transitory computer-readable medium having instructions encoded thereon that when executed by control circuitry in an integrated electrical panel comprising one or more branch circuits each comprising a respective controllable relay secured to at least one busbar by a respective bus tab, wherein each of the respective controllable relay is configured to engage with a respective circuit breaker such that the respective controllable relay is arranged electrically between the at least one busbar and the respective circuit breaker, wherein each bus tab comprises a current shunt and two shunt sense terminals configured to sense one or more electrical parameters corresponding to the current shunt, cause the control circuitry to:
receive at least one sensor signal from each current shunt;
associate the one or more branch circuits with reference load information, wherein the reference load information comprises at least one expected load;
determine a respective electrical load in the one or more branch circuits based on the at least one sensor signal;
disaggregate more than one load on at least one branch circuit based at least in part on the reference load information and based at least in part on the respective electrical load in the one or more branch circuits; and
control the respective controllable relay to manage the respective electrical load in each branch circuit.

21. The non-transitory computer-readable medium of claim 20, further comprising instructions encoded thereon that when executed by control circuitry cause the control circuitry to:
identify an event associated with a power grid coupled to the one or more branch circuits;
determine operating criteria based on the event; and
disconnect or connect the one or more branch circuits with the power grid based on the operating criteria.

22. The non-transitory computer-readable medium of claim 20, wherein the reference load information comprises load information corresponding to at least one of an appliance, a user device, an energy storage device, or an energy source.

23. The non-transitory computer-readable medium of claim 20, further comprising instructions encoded thereon that when executed by control circuitry cause the control circuitry to control the respective controllable relay to manage the respective electrical load in each respective branch circuit by:
determining operating criteria based on the reference load information; and
managing activation and de-activation of the respective controllable relay based on the operating criteria.

24. The non-transitory computer-readable medium of claim 20, further comprising instructions encoded thereon that when executed by control circuitry cause the control circuitry to store energy information based on the respective electrical load in the one or more branch circuits.

* * * * *